United States Patent
Shimizu et al.

(10) Patent No.: US 7,656,924 B2
(45) Date of Patent: Feb. 2, 2010

(54) SURFACE EMITTING LASER, AND TRANSCEIVER, OPTICAL TRANSCEIVER, AND OPTICAL COMMUNICATION SYSTEM EMPLOYING THE SURFACE EMITTING LASER

(75) Inventors: Hitoshi Shimizu, Tokyo (JP); Setiagung Casimirus, Tokyo (JP); Yasukazu Shiina, Tokyo (JP); Takeshi Hama, Tokyo (JP); Norihiro Iwai, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 142 days.

(21) Appl. No.: 10/958,125

(22) Filed: Oct. 5, 2004

(65) Prior Publication Data
US 2005/0123014 A1 Jun. 9, 2005

Related U.S. Application Data

(63) Continuation of application No. PCT/JP03/04413, filed on Apr. 7, 2003.

(30) Foreign Application Priority Data

| Apr. 5, 2002 | (JP) | ............................. 2002-104392 |
| Apr. 5, 2002 | (JP) | ............................. 2002-104393 |
| Jun. 11, 2002 | (JP) | ............................. 2002-170574 |
| Jul. 22, 2002 | (JP) | ............................. 2002-212830 |

(51) Int. Cl.
*H01S 5/00* (2006.01)

(52) U.S. Cl. ............................. 372/50.124; 372/46.01

(58) Field of Classification Search ............ 372/50.124, 372/46.01
See application file for complete search history.

(56) References Cited

U.S. PATENT DOCUMENTS

| 5,408,105 A | 4/1995 | Adachi et al. |
| 6,366,597 B1 * | 4/2002 | Yuen et al. ..................... 372/96 |
| 6,411,638 B1 * | 6/2002 | Johnson et al. .......... 372/46.01 |
| 2003/0185267 A1 * | 10/2003 | Hwang et al. ................. 372/96 |

FOREIGN PATENT DOCUMENTS

| JP | 2000-12974 | 1/2000 |
| JP | 2001-244563 | 9/2001 |
| JP | 2002-118329 | 4/2002 |

OTHER PUBLICATIONS

Transverse mode control and improvement of temperature characteristics in 850nm oxide confined VCSELs, Natsumi Ueda et al, with English Abstract, LQE 2001-135-144, The Institute of Electronics, Information and Communication Engineers, Technical Report of IEICE, ISSN 0913-5885, vol. 101, No. 657, Feb. 22, 2002, pp. 11-16.

(Continued)

*Primary Examiner*—Minsun Harvey
*Assistant Examiner*—Tod T Van Roy
(74) *Attorney, Agent, or Firm*—Oblon, Spivak, McClelland, Maier & Neustadt, L.L.P.

(57) ABSTRACT

A surface emitting laser includes a lower semiconductor multilayer mirror formed of a plurality of pairs of a high-refractive-index area and a low-refractive-index area; an active layer vertically sandwiched by cladding layers; a current confinement layer of $Al_zGa_{1-z}As$ having an oxide area in a peripheral portion of the current confinement layer, where $0.95 \leq z \leq 1$; and an upper semiconductor multilayer mirror formed of a plurality of pairs of a high-refractive-index area and a low-refractive-index area. The low-refractive-index area of at least one of the lower semiconductor multilayer mirror and the upper semiconductor multilayer mirror includes an $Al_{z1}Ga_{1-z1}As$ layer with a thickness thinner than that of the current confinement layer, where $z \leq z1$.

14 Claims, 36 Drawing Sheets

OTHER PUBLICATIONS

Thermal conductivity of $Ga_{1-x}Al_xAs$ alloys, Martin A. Afromowitz, Bell Laboratories, Murray Hill, New Jersey 07974, J.Appl. Phys. vol. 44, No. 3, Mar. 1973, pp. 1292-1294.

Advances in Selective Wet Oxidation of AlGaAs Alloys, Kent D. Choquette et al, IEEE Journal of Selected Topics in Quantum Electronics, vol. 3, No. 3, Jun. 1997, pp. 916-926.

Cavity Structures for Low Loss Oxide-Confined VCSELs, Kent D. Choquette et al, SPIE vol. 3003, pp. 194-200.

U.S. Appl. No. 11/347,225, filed Feb. 6, 2006, Casimirus et al.

U.S. Appl. No. 12/108,931, filed Apr. 24, 2008, Iwai, et al.

R. L. Naone, et al., "Oxidation of AlGaAs layers for tapered apertures in vertical-cavity lasers", Electronics Letters, vol. 33, No. 4, Feb. 13, 1997, pp. 300-301.

* cited by examiner

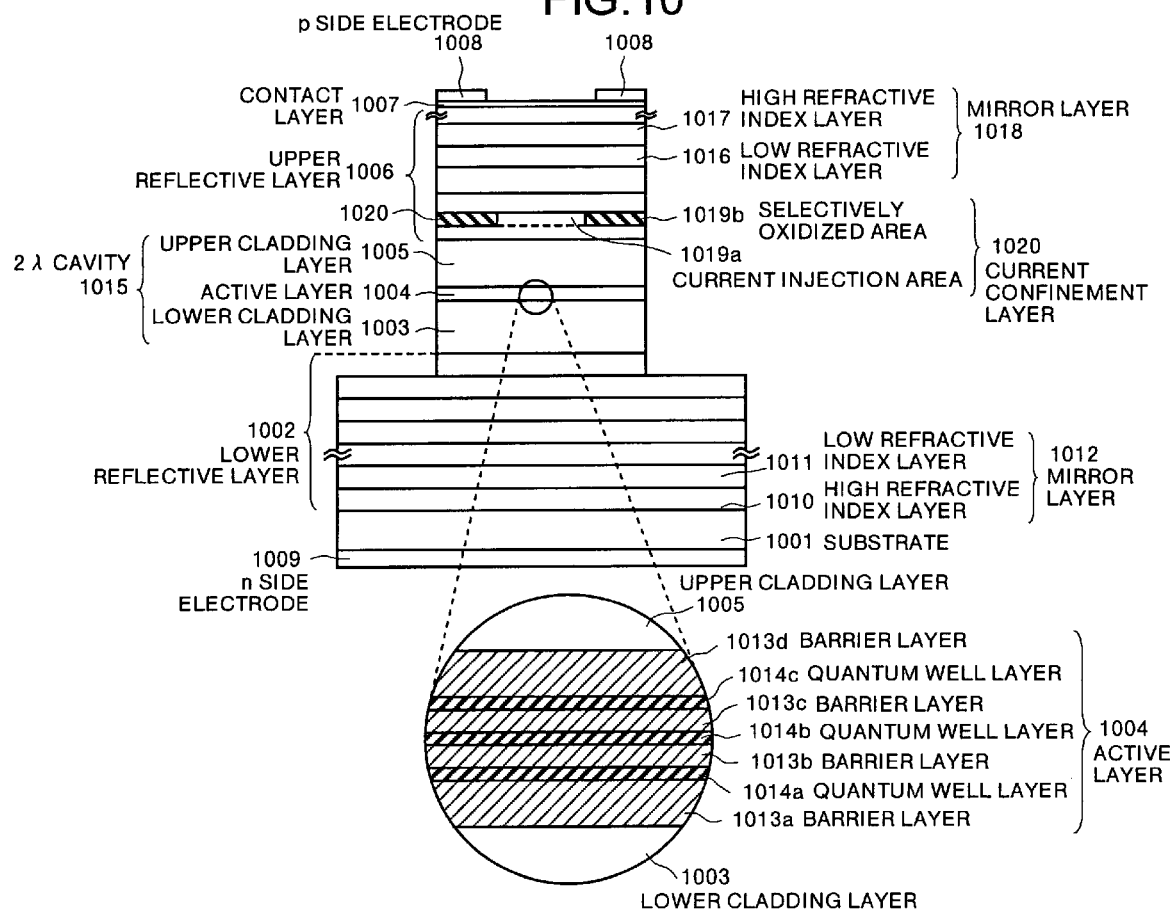

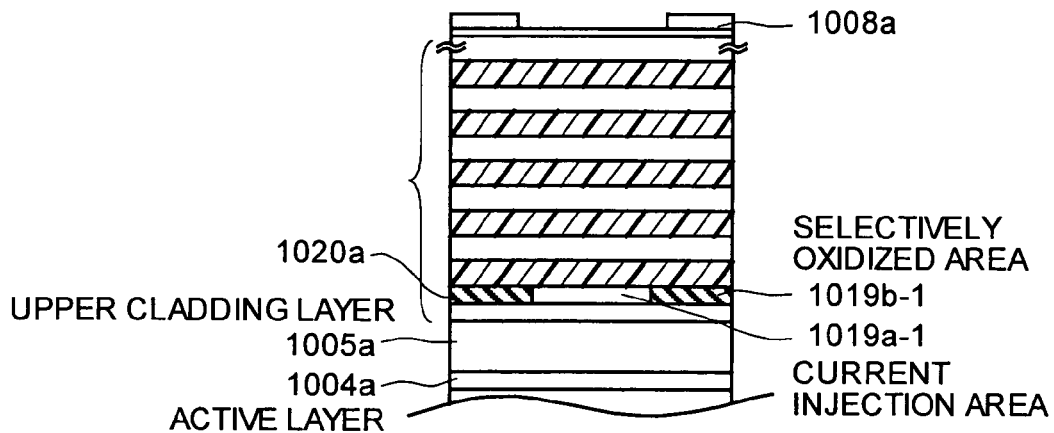
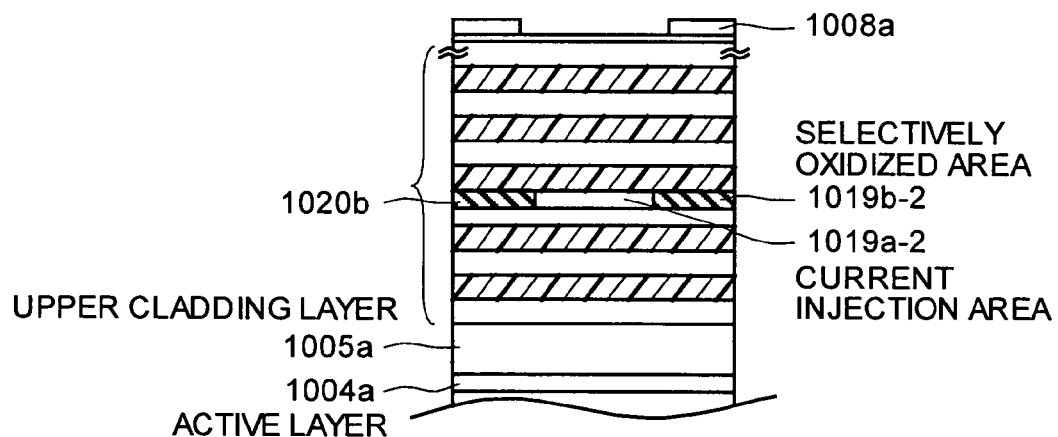
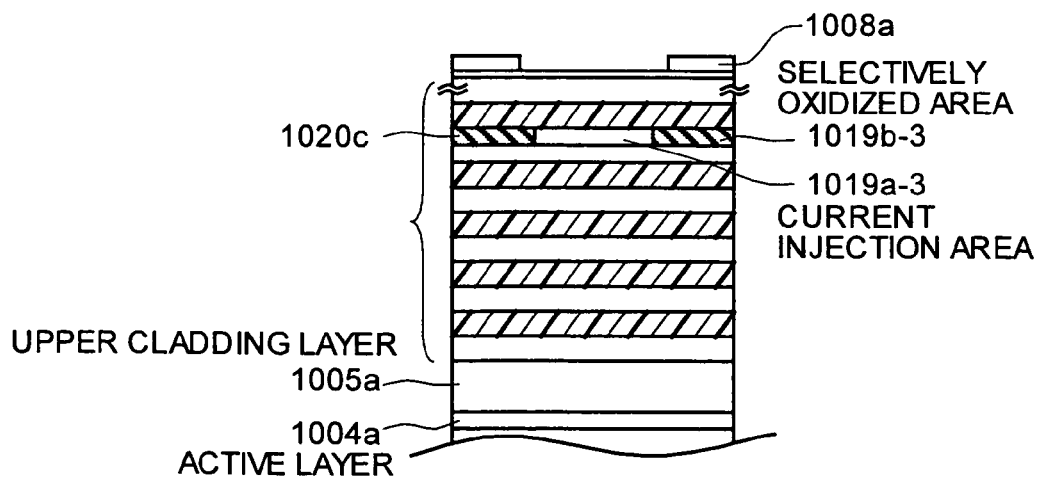

1023 SECOND AREA   1022 SECOND AREA

1021 FIRST AREA

FIG.23A

| NUMBER OF STACKED LAYERS | MAXIMUM REFLECTIVITY |
|---|---|
| 20 | 98.734 |
| 21 | 99.036 |
| 22 | 99.266 |
| 23 | 99.441 |
| 24 | 99.575 |
| 25 | 99.676 |
| 26 | 99.754 |
| 27 | 99.813 |
| 28 | 99.858 |
| 29 | 99.892 |
| 30 | 99.918 |
| 31 | 99.937 |
| 32 | 99.952 |
| 33 | 99.964 |
| 34 | 99.972 |
| 35 | 99.979 |
| 36 | 99.984 |
| 37 | 99.988 |
| 38 | 99.991 |
| 39 | 99.993 |
| 40 | 99.995 |

FIG.23B

| NUMBER OF STACKED LAYERS | MAXIMUM REFLECTIVITY |
|---|---|
| 15 | 98.109 |
| 16 | 98.559 |
| 17 | 98.902 |
| 18 | 99.164 |
| 19 | 99.363 |
| 20 | 99.516 |
| 21 | 99.631 |
| 22 | 99.72 |
| 23 | 99.787 |
| 24 | 99.838 |
| 25 | 99.877 |
| 26 | 99.906 |
| 27 | 99.929 |
| 28 | 99.946 |
| 29 | 99.959 |
| 30 | 99.969 |
| 31 | 99.976 |
| 32 | 99.982 |
| 33 | 99.986 |
| 34 | 99.989 |
| 35 | 99.992 |
| 36 | 99.994 |
| 37 | 99.995 |
| 38 | 99.995 |
| 39 | 99.997 |
| 40 | 99.998 |

FIG.30

| LASER STRUCTURE | NUMBER OF WELLS ($N_w$) | LIGHT CONFINEMENT CO-EFFICIENT ($\Gamma$)(%) | $J_{tr}/\eta$ (A/cm$^2$) | $G_0$ (cm$^{-1}$) | $\eta_i$ (cm$^{-1}$) |
|---|---|---|---|---|---|
| 3QW(Lb=16nm) | 3 | 2.0 | 80 | 800 | 1 |

FIG.32

| | P CONCENTRATION :1×10$^{17}$cm$^{-3}$ | P CONCENTRATION :2×10$^{17}$cm$^{-3}$ | P CONCENTRATION :1×10$^{18}$cm$^{-3}$ |
|---|---|---|---|
| Al$_{0.9}$Ga$_{0.1}$As | ΔR=27 Ω | ΔR=53 Ω | ΔR=125 Ω |
| GaAs | ΔR=2.5 Ω | ΔR=6.4 Ω | ΔR=19 Ω |

ESTIMATION OF INCREASE IN RESISTANCE COMPARED WITH 850 nm VCSEL AT THE TIME WHEN CONCENTRATION IN PARTS OTHER THAN VICINITY OF INTERFACE IS CHANGED FOR FIVE PAIRS FROM ACTIVE LAYER OF p-DBR

US 7,656,924 B2

SURFACE EMITTING LASER, AND TRANSCEIVER, OPTICAL TRANSCEIVER, AND OPTICAL COMMUNICATION SYSTEM EMPLOYING THE SURFACE EMITTING LASER

TECHNICAL FIELD

The present invention relates to a surface emitting laser of a vertical cavity type, and a transceiver, an optical transceiver, and an optical communication system using the surface emitting laser.

BACKGROUND ART

In recent years, a vertical cavity surface emitting laser (VCSEL, hereinafter simply referred to as "surface emitting laser"), in which light resonates in a vertical direction with respect to a substrate surface as indicated by the name, has been attracting attentions as a light source for communication like optical interconnection.

Compared with a conventional edge emitting laser, the surface emitting laser has advantages that: a two-dimensional array of the lasers can be easily formed; it is unnecessary to cleave the element to form a mirror unlike the edge emitting laser; laser oscillation is possible with an extremely low threshold value because a volume of an active layer is considerably small; and power consumption is low.

Since the surface emitting laser has an extremely short cavity length of about one wavelength due to the inherent structure, the surface emitting laser has a characteristic that a basic mode oscillation is naturally obtained for an oscillation spectrum. Therefore, the surface emitting diode maintains a single longitudinal mode easier than the edge emitting laser, such as a distributed feedback (DFB) laser. In addition, the surface emitting laser attracts attentions as a laser essentially more suitable for optical communication than the DFB laser or the like because, for example, it is possible to obtain a narrow far field pattern (FFP) and a relatively low intensity noise.

With such advantages, the surface emitting laser attracts attentions as a signal light source in an optical communication network and optical interconnection that transmits information by optically connecting computers and as a device for other various applications.

FIG. 7 is a perspective sectional view of a conventional surface emitting laser. FIG. 8 is an explanatory diagram for explaining structures of a lower semiconductor multilayer mirror and an upper semiconductor multilayer mirror. Note that, portions common to FIG. 7 and FIG. 8 are denoted by identical reference numerals. To manufacture a surface emitting laser 100 shown in FIG. 7, first, a lower semiconductor multilayer mirror (lower distributed bragg reflector (DBR) mirror) 112 is formed on an n-type GaAs substrate 11 by a metal organic chemical vapor deposition (MOCVD) method. As shown in FIG. 8, in the lower semiconductor multilayer mirror 112, a stacked structure of an n-type high-refractive-index area 141 and an n-type low-refractive-index area 142 having respective thicknesses of $\lambda/4n$ ($\lambda$ is an oscillation wavelength and n is a refractive index) forms one pair, and for example, thirty-five pairs are stacked. The n-type high-refractive-index area 141 is formed of, for example, n-type $Al_{0.2}Ga_{0.8}As$, and the n-type low-refractive-index area 142 is formed of, for example, n-type $Al_{0.9}Ga_{0.1}As$.

Then, a quantum well (QW) active layer 32 vertically sandwiched by cladding layers 31 and 33 is formed on the lower semiconductor multilayer mirror 112. Further, an $Al_zGa_{1-z}As$ ($0.95 \leq z \leq 1$) layer 15 for forming a current confinement layer in a later process is formed. Usually, AlAs is used as the current confinement layer. Moreover, an upper semiconductor multilayer mirror 116 (upper DBR mirror) is formed on the $Al_zGa_{1-z}As$ ($0.95 \leq z \leq 1$) layer 15. Here, as shown in FIG. 8, in the upper semiconductor multilayer mirror 116, assuming that a stacked structure of a p-type high-refractive-index area 145 and a p-type low-refractive-index area 146 having respective thicknesses of $\lambda/4n$ ($\lambda$ is an oscillation wavelength and n is a refractive index) forms one pair, for example, twenty-five pairs are stacked. The p-type high-refractive-index area 145 is formed of, for example, p-type $Al_{0.2}Ga_{0.8}As$, and the p-type low-refractive-index area 146 is formed of, for example, p-type $Al_{0.9}Ga_{0.1}As$. In addition, a p-type GaAs contact layer 17 is formed on the upper semiconductor multilayer mirror 116.

Next, an outer edge part of a stacked structure, which consists of the upper semiconductor multilayer mirror 116, the AlAs layer 15, the cladding layer 33, the QW active layer 32, the cladding layer 31, and a part of the lower semiconductor multilayer mirror 112 is removed by a photolithography process and an etching process (dry etching or wet etching). Consequently, for example, a columnar mesa-post with a diameter of 30 micrometers is formed.

Next, oxidation treatment is performed at temperature of about 400° C. in a moisture vapor atmosphere to selectively oxidize the $Al_zGa_{1-z}As$ ($0.95 \leq z \leq 1$) layer 15 from a sidewall of the mesa-post and form an Al oxide layer 14. For example, when a diameter of the mesa-post is 30 micrometers and the Al oxide layer 14 is formed in a ring shape with a band width of 10 micrometers, an area of the $Al_zGa_{1-z}As$ ($0.95 \leq z \leq 1$) layer 15 in the center, that is, an area of an aperture to which a current is injected is about 80 $\mu m^2$ (with a diameter of 10 micrometers).

Then, a silicon nitride film 19 functioning as a protective layer is formed on an upper surface and a side surface of the mesa-post and an exposed upper surface of the lower semiconductor multilayer mirror 112. Subsequently, periphery of the mesa-post, on which the silicon nitride film 19 is formed, is filled with polyimide 22. The silicon nitride film 19 formed on the upper surface of the mesa-post is removed in a circular shape with a diameter of 30 micrometers to further form a p-type electrode 18 of a ring shape with an inner diameter of 20 micrometers and an outer diameter of 30 micrometers on the p-type GaAs contact layer 17 exposed by the removal. After grinding the substrate to have a thickness of, for example, 200 micrometers, an n-type electrode 21 is formed on the back of the n-type GaAs substrate 11. An electrode pad 20, on which a wire is bonded, is formed on the polyimide 22 to come into contact with the p-type electrode 18.

The characteristic in the structure explained above is that the $Al_zGa_{1-z}As$ ($0.95 \leq z \leq 1$) layer 15 with a resistance lower than that of the surrounding Al oxide layer 14 is arranged on a central part of the QW active layer 32. This $Al_zGa_{1-z}As$ ($0.95 \leq z \leq 1$) layer 15 makes it possible to flow a current intensively only in a narrow part of the active layer 13. Such a structure is called an oxidation confinement type surface emitting laser. Laser characteristics like a laser oscillation threshold value are improved significantly.

In the surface emitting laser, the current confinement structure is important. In addition, from the viewpoint of selection of an oscillation wavelength, improvement of a thermal conductivity, and the like, structures of the lower semiconductor multilayer mirror 112 and the upper semiconductor multilayer mirror 116 vertically sandwiching the active layer 13 are also very important. It is known that, in the lower semiconductor multilayer mirror 112 and the upper semiconductor multilayer mirror 116, a refractive index difference increases as a difference of Al composition between a high-refractive-index area and a low-refractive-index area increases, and a satisfactory reflectivity is obtained. In addition, it is also known that the thermal conductivity increases as the Al composition difference increases (Afromowitz M A et al, Journal of Applied Physics 44, pp 1292, 1973). If the reflectivity is large, the number of pairs of semiconductor multilayer mirrors can be reduced. In addition, if the thermal conductivity is large, a surface emitting laser, which has satisfactory thermal saturation characteristics of optical output power and operates stably at high power even in a high-temperature operation environment, can be manufactured.

However, to obtain a large refractive index difference and a high thermal conductivity, if a composition y of an $Al_yGa_{1-y}As$ layer (x<y<1), which is a low-refractive-index area of any one of a lower semiconductor multilayer mirror and an upper semiconductor multilayer mirror or both, is set close to 1, a state in which the low-refractive-index area is easily oxidized is created. In particular, when the composition y is set too large in the upper semiconductor multilayer mirror 116, if oxidation treatment is performed in a moisture vapor atmosphere to obtain the Al oxide layer 14, the $Al_yGa_{1-y}As$ layer (x<y<1), which is the low-refractive-index area of the upper semiconductor multilayer mirror 116, may be oxidized together with the $Al_zGa_{1-z}As$ ($0.95 \leq z \leq 1$) layer 15. When a volume of an oxide film increases in the lower semiconductor multilayer mirror 112 or the upper semiconductor multilayer mirror 116, characteristics deteriorate, for example, an oscillation threshold value increases and dislocation occurs often.

As a background art of the invention, "Optoelectronics semiconductor device with mesa" disclosed in U.S. Pat. No. 5,408,105 is characterized in that an entire lower semiconductor multilayer mirror is used as an AlAs mirror layer, and a lower semiconductor multilayer film is not etched.

Incidentally, when a surface emitting laser is used as a signal light source, a surface emitting laser, which has an emission wavelength of 0.8 micrometer to 1.65 micrometers including a low-loss waveband of an optical fiber serving as a transmission medium, is required. In surface emitting lasers in this wavelength band, for a long time, it has been impossible to realize a surface emitting laser, which oscillates a laser beam having a long wavelength, for example, a wavelength of 1.2 micrometers or more, due to difficulty in crystal growth. However, recently, a surface emitting laser, which oscillates a laser beam having a wavelength of 1.2 micrometers to 1.3 micrometers, has been realized by the inventors (Japanese Patent Application Laid-Open No. 2001-124300).

FIG. 19 shows a structure of the surface emitting laser described in Japanese Patent Application Laid-Open No. 2001-124300. This surface emitting laser has a structure in which a buffer layer 1102, a lower reflective layer 1103, a lower cladding layer 1104, an active layer including a QW layer 1105, and an upper cladding layer 1106 are sequentially stacked on a substrate 1101. Further, the surface emitting laser has a stacked structure of a current confinement layer 1108 processed in a mesa shape, an upper reflective layer 1109, and a contact layer 1110 on the upper cladding layer 1106. The current confinement layer 1108 is formed of a current injection area 1107*a* consisting of an AlAs layer in a central part and a selectively oxidized area 1107*b* formed by selectively oxidizing an end of the AlAs layer. In addition, an n side electrode 1114 is arranged on a lower surface of the substrate 1101. Then, in the active layer including the QW layer 1105, by adding a small amount of Sb in GaInNAs forming the QW layer, a crystallographic quality of the active layer including the QW layer 1105 is improved. In this way, recently, laser oscillation of a surface emitting laser in a 1.3-micrometer-band has been performed utilizing the improvement in a structure of a QW layer and a selective oxidation technique of an AlAs layer.

To use a surface emitting laser as a signal light source in an optical communication network, it is necessary to realize a surface emitting laser that emits a laser beam having a wavelength with a low loss when the laser beam is transmitted through an optical fiber for transmission and having a fixed intensity. Therefore, a surface emitting laser having an emission wavelength of 1.2 micrometers or more has been developed, and an example of realizing laser oscillation using a GaInNAs material for an active layer has been reported according to the progress of a crystal growth technique in recent years.

For example, in the Post Deadline Paper (PD1.2) of the LEOS-2001 Annual Meeting, the group of Agilent Technologies Laboratories reported about a surface emitting laser of an oxidation confinement type. According to this report, there is a surface emitting laser that has a lower semiconductor multilayer mirror in which forty layers of n type DBR mirror are stacked sequentially, an active layer including a triple QW layer formed of GaInNAs, and an upper semiconductor multilayer mirror in which twenty-eight layers of a p type DBR mirror and includes an opening portion with a diameter of 11 micrometers by arranging a current confinement layer in a part of the p-type upper semiconductor multilayer mirror. With such a structure, continuous oscillation at a room temperature is realized, and a surface emitting laser with a threshold current of about 6 milliamperes and maximum optical output power of about 0.7 milliwatt is realized.

FIG. 35 is a perspective sectional view of the conventional surface emitting laser. FIG. 36 is an explanatory diagram for explaining structures of a lower semiconductor multilayer mirror and an upper semiconductor multilayer mirror. Note that, portions common to FIG. 35 and FIG. 36 are denoted by identical reference numerals. To manufacture a surface emitting laser 3100 shown in FIG. 35, first, a lower semiconductor multilayer mirror (lower DBR mirror) 3112 is formed on an n-type GaAs substrate 3111 by an MOCVD method. Here, as shown in FIG. 36, in the lower semiconductor multilayer mirror 3112, assuming that a stacked structure of an n-type high-refractive-index area 3141 and an n-type low-refractive-index area 3142 having respective thicknesses of $\lambda/4n$ ($\lambda$ is an oscillation wavelength and n is a refractive index) forms one pair, for example, thirty-five pairs are stacked. The n-type high-refractive-index area 3141 is formed of, for example, n-type GaAs, and the n-type low-refractive-index area 3142 is formed of, for example, n-type $Al_{0.9}Ga_{0.1}As$.

However, "Optoelectronics semiconductor device with mesa" disclosed in U.S. Pat. No. 5,408,105 also has a problem in that etching accuracy has to be extremely strict.

In addition, there are problems that should be solved in using a surface emitting laser for an application like a signal light source. First, it is necessary to unify lateral modes of an oscillating laser beam. When a mode higher in a lateral direction is present in the lateral modes, this causes marked deterioration in a signal waveform in proportion to a transmission distance at the time of optical transmission, in particular, at the time of high-speed modulation. Therefore, it is necessary to realize single lateral mode oscillation to realize long distance transmission.

In a surface emitting laser, it is naturally difficult to stabilize lateral modes due to a structure thereof. Therefore, in a surface emitting laser including selectively oxidized areas, single lateral mode oscillation is realized by adjusting a diameter of a current injection area sandwiched by the selectively oxidized areas. However, conventionally, it is difficult from the viewpoint of controllability to realize the single lateral mode oscillation by adjusting only the diameter of the current injection area in a surface emitting laser in a 1300-nanometer-band (in a range of about 1260 nanometers to 1360 nanometers).

In addition, even if the single lateral mode oscillation can be realized, when a value of a threshold current increases, a problem like an increase in power consumption is caused. Therefore, it is necessary to realize the single lateral mode oscillation while controlling the increase in a value of a threshold current. For this purpose, for example, it is necessary to set a diameter of a current injection layer to, for example, φ5 micrometers, which is disadvantageous from the viewpoint of a working voltage and optical output power. Moreover, reliability of the surface emitting laser has to be secured. This is because the surface emitting laser is required to have sufficient reliability to use the surface emitting leaser element for a signal light source or the like.

Moreover, when the surface emitting laser is used for a signal light source or the like, it is necessary that direct modulation is possible at a level of 10 Gbit/s. This is a numerical value necessary for actually using the surface emitting laser as a signal light source according to an increase in a channel capacity in recent years.

When the surface emitting laser reported by the group of Agilent Technologies Laboratories is actually used as a signal light source, a new problem occurs. Since a signal beam is transmitted in a long distance in an optical communication system, in general, a laser beam outputted from a signal light source is required to have a light intensity of about 1 milliwatt at the minimum. Since a maximum light intensity of the surface emitting laser is only about 0.7 milliwatt, it is inappropriate to use the surface emitting laser as a signal light source at the present point.

To directly modulate a laser beam at 2.4 GBit/s or more, for example, 10 GBit/s, in general, it is necessary to drive the surface emitting laser with an injection current five times as large as a threshold current. In the case of the surface emitting laser, since the threshold current is 6 milliamperes, the injection current at the time of driving is 30 milliampere or more. Thus, it is unrealistic to use the surface emitting laser in terms of power consumption and taking into account the fact that thermal saturation occurs actually. To use the surface emitting laser as a signal light source, it is desirable that the threshold current is about 1 milliampere and the injection current at the time of driving is about 5 milliamperes to 6 milliamperes. To realize the light intensity of 1 milliwatt when the injection current is 5 milliamperes, it is necessary to set slope efficiency to 0.25 mW/mA, and when the injection current is 6 milliampere, it is necessary to set slope efficiency to 0.2 mW/mA. Thus, it is inappropriate to use the surface emitting laser as a signal light source from the viewpoint of a slope efficiency as well.

Moreover, in the surface emitting laser in the 1300-nanometer-band (1260 nanometers to 1360 nanometers) oscillation under the present situation, since crystal growth is difficult for any of the above-mentioned active layers, a low oscillation threshold value and a high slope efficiency cannot be realized. In particular, in the surface emitting laser, oscillation by direct modulation is stable in a high frequency band. The surface laser element is advantageous in this respect compared with the edge-emitting laser like a distributed DFB laser. However, a new problem occurs if it is attempted to realize oscillation with a wavelength longer than VCSEL in a 0.85 micrometer to 0.98-micrometer-band like 1.2 micrometers to 1.3 micrometers in the surface emitting laser. More specifically, laser oscillation is made unstable due to inter-valence-band absorption or free carrier absorption in a semiconductor multilayer mirror. In the present situation, satisfactory characteristics are not realized even in serial transmission in 10 kilometers to 20 kilometers with direct modulation at about 10 Gbps.

The invention has been devised in view of the drawbacks of the conventional technique, and it is an object of the invention to provide a surface emitting laser with an improved reflectivity and temperature characteristics by causing an AlAs layer to be present inside a semiconductor multilayer mirror, which is not oxidized easily, according to film thickness control of the AlAs layer rather than controlling oxidation speed according to a difference of composition of Al as in the conventional technique.

The invention has been devised in view of the drawbacks of the conventional technique, and it is another object of the invention to provide a surface emitting laser that has a lower threshold current and is highly reliable and with which single lateral mode oscillation is possible and direct modulation is possible, and a transceiver, an optical transceiver, and an optical communication system using the surface emitting element.

The invention has been devised in view of the drawbacks of the conventional technique, and it is still another object of the invention to provide a surface emitting laser with which a threshold current is controlled to be about 1 milliampere and slope efficiency is 0.2 mW/mA or more, and an optical transceiver, an optical communication device, and an optical communication system using the surface emitting laser.

The invention has been devised in view of the drawbacks of the conventional technique, and it is still another object of the invention to provide a surface emitting laser of a structure having a long wavelength band of 1.2 micrometers or more as an oscillating wavelength, which can realize a low oscillation threshold value, high slope efficiency, and high frequency direct modulation by reducing an absorption loss due to a p-type semiconductor reflector, and a transceiver, an optical transceiver, and an optical communication system using the surface emitting laser.

DISCLOSURE OF THE INVENTION

It is an object of the present invention to solve at least the above problems in the conventional technology.

A surface emitting laser according to one aspect of the present invention includes a lower semiconductor multilayer mirror formed of a plurality of pairs of a high-refractive-index area and a low-refractive-index area on a semiconductor substrate; an active layer arranged above the lower semiconductor multilayer mirror and vertically sandwiched by cladding layers; a current confinement layer of $Al_zGa_{1-z}As$ having an oxide area in a peripheral portion of the current confinement layer, where $0.95 \leq z \leq 1$; and an upper semiconductor multilayer mirror formed of a plurality of pairs of a high-refractive-index area and a low-refractive-index area. The low-refractive-index area of at least one of the lower semiconductor multilayer mirror and the upper semiconductor multilayer mirror includes an $Al_{z1}Ga_{1-z1}As$ layer having a thickness thinner than that of the current confinement layer, where $z \leq z1$.

A transceiver according to another aspect of the present invention includes an optical transmitting unit that includes a surface emitting laser, and a control circuit that controls a current injected into the surface emitting laser based on an electric signal input; and an optical receiving unit that includes a photoelectric conversion element that receives an optical signal input from outside, and converts the optical signal into an electric signal. The surface emitting laser includes a lower semiconductor multilayer mirror formed of a plurality of pairs of a high-refractive-index area and a low-refractive-index area on a semiconductor substrate; an active layer arranged above the lower semiconductor multilayer mirror and vertically sandwiched by cladding layers; a current confinement layer of $Al_zGa_{1-z}As$ having an oxide area in a peripheral portion of the current confinement layer, where $0.95 \leq z \leq 1$; and an upper semiconductor multilayer mirror formed of a plurality of pairs of a high-refractive-index area and a low-refractive-index area. The low-refractive-index area of at least one of the lower semiconductor multilayer mirror and the upper semiconductor multilayer mirror includes an $Al_zGa_{1-z}As$ layer having a thickness thinner than that of the current confinement layer, where $z \leq z1$.

An optical transceiver according to still another aspect of the present invention includes a surface emitting laser; a signal multiplexing circuit that multiplexes a plurality of electric signals; a control circuit that controls the surface emitting laser based on an electric signal output from the signal multiplexing circuit; a photoelectric conversion element that receives an optical signal input from outside, and converts the optical signal into an electric signal; and a signal demultiplexing circuit that demultiplexes the electric signal output from the photoelectric conversion element into a plurality of electric signals. The surface emitting laser includes a lower semiconductor multilayer mirror formed of a plurality of pairs of a high-refractive-index area and a low-refractive-index area on a semiconductor substrate; an active layer arranged above the lower semiconductor multilayer mirror and vertically sandwiched by cladding layers; a current confinement layer of $Al_zGa_{1-z}As$ having an oxide area in a peripheral portion of the current confinement layer, where $0.95 \leq z \leq 1$; and an upper semiconductor multilayer mirror formed of a plurality of pairs of a high-refractive-index area and a low-refractive-index area. The low-refractive-index area of at least one of the lower semiconductor multilayer mirror and the upper semiconductor multilayer mirror includes an $Al_{z1}Ga_{1-z1}As$ layer having a thickness thinner than that of the current confinement layer, where $z \leq z1$.

An optical communication system according to still another aspect of the present invention includes a surface emitting laser; a control circuit that controls the surface emitting laser; an optical fiber that transmits an optical signal emitted from the surface emitting laser; and a photoelectric conversion element that receives the optical signal from the optical fiber, and converts the optical signal into an electric signal. The surface emitting laser includes a lower semiconductor multilayer mirror formed of a plurality of pairs of a high-refractive-index area and a low-refractive-index area on a semiconductor substrate; an active layer arranged above the lower semiconductor multilayer mirror and vertically sandwiched by cladding layers; a current confinement layer of $Al_zGa_{1-z}As$ having an oxide area in a peripheral portion of the current confinement layer, where $0.95 \leq z \leq 1$; and an upper semiconductor multilayer mirror formed of a plurality of pairs of a high-refractive-index area and a low-refractive-index area. The low-refractive-index area of at least one of the lower semiconductor multilayer mirror and the upper semiconductor multilayer mirror includes an $Al_zGa_{1-z1}As$ layer having a thickness thinner than that of the current confinement layer, where $z \leq z1$.

A surface emitting laser according to still another aspect of the present invention includes a lower reflective layer, a lower cladding layer, an active layer, an upper cladding layer, and an upper reflective layer sequentially stacked on a substrate; a selectively oxidized area that is arranged in an area distant from a center of the active layer in a stacking direction by equal to or more than 370 nanometers and equal to or less than 780 nanometers inside of either of the lower reflective layer and the upper reflective layer; and a current injection area that sandwiched by the selectively oxidized area. A difference between a first effective refractive index of a first area in the stacking direction including the current injection area and a second effective refractive index of a second area in the stacking direction including the selectively oxidized area is equal to or less than 0.038.

A transceiver according to still another aspect of the present invention includes an optical transmitting unit that includes a surface emitting laser, and a control circuit that controls a current injected into the surface emitting laser based on an electric signal input; and an optical receiving unit that includes a photoelectric conversion element that receives an optical signal input from outside, and converts the optical signal into an electric signal. The surface emitting laser includes a lower reflective layer, a lower cladding layer, an active layer, an upper cladding layer, and an upper reflective layer sequentially stacked on a substrate; a selectively oxidized area that is arranged in an area distant from a center of the active layer in a stacking direction by equal to or more than 370 nanometers and equal to or less than 780 nanometers inside of either of the lower reflective layer and the upper reflective layer; and a current injection area that sandwiched by the selectively oxidized area. A difference between a first effective refractive index of a first area in the stacking direction including the current injection area and a second effective refractive index of a second area in the stacking direction including the selectively oxidized area is equal to or less than 0.038.

An optical transceiver according to still another aspect of the present invention includes a surface emitting laser; a signal multiplexing circuit that multiplexes a plurality of electric signals; a control circuit that controls the surface emitting laser based on an electric signal output from the signal multiplexing circuit; a photoelectric conversion element that receives an optical signal input from outside, and converts the optical signal into an electric signal; and a signal demultiplexing circuit that demultiplexes the electric signal output from the photoelectric conversion element into a plurality of electric signals. The surface emitting laser includes a lower reflective layer, a lower cladding layer, an active layer, an upper cladding layer, and an upper reflective layer sequentially stacked on a substrate; a selectively oxidized area that is arranged in an area distant from a center of the active layer in a stacking direction by equal to or more than 370 nanometers and equal to or less than 780 nanometers inside of either of the lower reflective layer and the upper reflective layer; and a current injection area that sandwiched by the selectively oxidized area. A difference between a first effective refractive index of a first area in the stacking direction including the current injection area and a second effective refractive index of a second area in the stacking direction including the selectively oxidized area is equal to or less than 0.038.

An optical communication system according to still another aspect of the present invention includes a surface emitting laser; a control circuit that controls the surface emitting laser; an optical fiber that transmits an optical signal emitted from the surface emitting laser; and a photoelectric conversion element that receives the optical signal from the optical fiber, and converts the optical signal into an electric signal. The surface emitting laser includes a lower reflective layer, a lower cladding layer, an active layer, an upper cladding layer, and an upper reflective layer sequentially stacked on a substrate; a selectively oxidized area that is arranged in an area distant from a center of the active layer in a stacking direction by equal to or more than 370 nanometers and equal to or less than 780 nanometers inside of either of the lower reflective layer and the upper reflective layer; and a current injection area that sandwiched by the selectively oxidized area. A difference between a first effective refractive index of a first area in the stacking direction including the current injection area and a second effective refractive index of a second area in the stacking direction including the selectively oxidized area is equal to or less than 0.038.

A surface emitting laser according to still another aspect of the present invention includes an active layer stacked on a semiconductor substrate; a reflection-side semiconductor-multilayer-mirror having a reflectivity of equal to or more than 99.9 percent with respect to the laser beam; and an emission-side semiconductor-multilayer-mirror having a reflectivity of equal to or more than 99.4 percent and equal to or less than 99.8 percent with respect to the laser beam.

A transceiver according to still another aspect of the present invention includes an optical transmitting unit that includes a surface emitting laser that emits a laser beam in a wavelength range between 1.2 micrometers and 1.6 micrometers in a vertical direction with respect to a semiconductor substrate, and a control circuit that controls a current injected into the surface emitting laser based on an electric signal input; and an optical receiving unit that includes a photoelectric conversion element that receives an optical signal input from outside, and converts the optical signal into an electric signal. The surface emitting laser includes an active layer stacked on the semiconductor substrate; a reflection-side semiconductor-multilayer-mirror having a reflectivity of equal to or more than 99.9 percent with respect to the laser beam; and an emission-side semiconductor-multilayer-mirror having a reflectivity of equal to or more than 99.4 percent and equal to or less than 99.8 percent with respect to the laser beam.

An optical transceiver according to still another aspect of the present invention includes a surface emitting laser that emits a laser beam in a wavelength range between 1.2 micrometers and 1.6 micrometers in a vertical direction with respect to a semiconductor substrate; a signal multiplexing circuit that multiplexes a plurality of electric signals; a control circuit that controls the surface emitting laser based on an electric signal output from the signal multiplexing circuit; a photoelectric conversion element that receives an optical signal input from outside, and converts the optical signal into an electric signal; and a signal demultiplexing circuit that demultiplexes the electric signal output from the photoelectric conversion element into a plurality of electric signals. The surface emitting laser includes an active layer stacked on the semiconductor substrate; a reflection-side semiconductor-multilayer-mirror having a reflectivity of equal to or more than 99.9 percent with respect to the laser beam; and an emission-side semiconductor-multilayer-mirror having a reflectivity of equal to or more than 99.4 percent and equal to or less than 99.8 percent with respect to the laser beam.

An optical communication system according to still another aspect of the present invention includes a surface emitting laser that emits a laser beam in a wavelength range between 1.2 micrometers and 1.6 micrometers in a vertical direction with respect to a semiconductor substrate; a control circuit that controls the surface emitting laser; an optical fiber that transmits an optical signal emitted from the surface emitting laser; and a photoelectric conversion element that receives the optical signal from the optical fiber, and converts the optical signal into an electric signal. The surface emitting laser includes an active layer stacked on the semiconductor substrate; a reflection-side semiconductor-multilayer-mirror having a reflectivity of equal to or more than 99.9 percent with respect to the laser beam; and an emission-side semiconductor-multilayer-mirror having a reflectivity of equal to or more than 99.4 percent and equal to or less than 99.8 percent with respect to the laser beam.

A surface emitting laser according to still another aspect of the present invention includes an n-type semiconductor multilayer mirror formed of a plurality of pairs of a high-refractive-index area and a low-refractive-index area; an active layer that is vertically sandwiched by cladding layers, and has an oscillation wavelength of equal to or more than 980 nanometers; and a p-type semiconductor multilayer mirror formed of a plural pairs of a high-refractive-index area and a low-refractive-index area on a substrate. The high-refractive-index layer of the p-type semiconductor multilayer mirror within a predetermined number of pairs from the active layer in the p-type semiconductor multilayer mirror includes a first high-refractive-index area that is adjacent to an interface with the low-refractive-index layer, and p-type-doped with a first impurity concentration; and a second high-refractive-index area that is provided outside the first high-refractive-index area, and is p-type-doped with a second impurity concentration lower than the first impurity concentration. The low-refractive-index layer of the p-type semiconductor multilayer mirror within a predetermined number of pairs from the active layer in the p-type semiconductor multilayer mirror includes a first low-refractive-index area that is adjacent to an interface with the high-refractive-index layer, and p-type-doped with a third impurity concentration; and a second low-refractive-index area that is provided outside the first low-refractive-index area, and is p-type-doped with a fourth impurity concentration lower than the third impurity concentration.

A transceiver according to still another aspect of the present invention includes an optical transmitting unit that includes a surface emitting laser, and a control circuit that controls a current injected into the surface emitting laser based on an electric signal input; and an optical receiving unit that includes a photoelectric conversion element that receives an optical signal input from outside, and converts the optical signal into an electric signal. The surface emitting laser includes an n-type semiconductor multilayer mirror formed of a plurality of pairs of a high-refractive-index area and a low-refractive-index area; an active layer that is vertically sandwiched by cladding layers, and has an oscillation wavelength of equal to or more than 980 nanometers; and a p-type semiconductor multilayer mirror formed of a plural pairs of a high-refractive-index area and a low-refractive-index area on a substrate. The high-refractive-index layer of the p-type semiconductor multilayer mirror within a predetermined number of pairs from the active layer in the p-type semiconductor multilayer mirror includes a first high-refractive-index area that is adjacent to an interface with the low-refractive-index layer, and p-type-doped with a first impurity concentration; and a second high-refractive-index area that is provided outside the first high-refractive-index area, and is p-type-doped with a second impurity concentration lower than the first impurity concentration. The low-refractive-index layer of the p-type semiconductor multilayer mirror within a predetermined number of pairs from the active layer in the p-type semiconductor multilayer mirror includes a first low-refractive-index area that is adjacent to an interface with the high-refractive-index layer, and p-type-doped with a third impurity concentration; and a second low-refractive-index area that is provided outside the first low-refractive-index area, and is p-type-doped with a fourth impurity concentration lower than the third impurity concentration.

An optical transceiver according to still another aspect of the present invention includes a surface emitting laser; a signal multiplexing circuit that multiplexes a plurality of electric signals; a control circuit that controls the surface emitting laser based on an electric signal output from the signal multiplexing circuit; a photoelectric conversion element that receives an optical signal input from outside, and converts the optical signal into an electric signal; and a signal demultiplexing circuit that demultiplexes the electric signal output from the photoelectric conversion element into a plurality of electric signals. The surface emitting laser includes an n-type semiconductor multilayer mirror formed of a plurality of pairs of a high-refractive-index area and a low-refractive-index area; an active layer that is vertically sandwiched by cladding layers, and has an oscillation wavelength of equal to or more than 980 nanometers; and a p-type semiconductor multilayer mirror formed of a plural pairs of a high-refractive-index area and a low-refractive-index area on a substrate. The high-refractive-index layer of the p-type semiconductor multilayer mirror within a predetermined number of pairs from the active layer in the p-type semiconductor multilayer mirror includes a first high-refractive-index area that is adjacent to an interface with the low-refractive-index layer, and p-type-doped with a first impurity concentration; and a second high-refractive-index area that is provided outside the first high-refractive-index area, and is p-type-doped with a second impurity concentration lower than the first impurity concentration. The low-refractive-index layer of the p-type semiconductor multilayer mirror within a predetermined number of pairs from the active layer in the p-type semiconductor multilayer mirror includes a first low-refractive-index area that is adjacent to an interface with the high-refractive-index layer, and p-type-doped with a third impurity concentration; and a second low-refractive-index area that is provided outside the first low-refractive-index area, and is p-type-doped with a fourth impurity concentration lower than the third impurity concentration.

An optical communication system according to still another aspect of the present invention includes a surface emitting laser; a control circuit that controls the surface emitting laser; an optical fiber that transmits an optical signal emitted from the surface emitting laser; and a photoelectric conversion element that receives the optical signal from the optical fiber, and converts the optical signal into an electric signal. The surface emitting laser includes an n-type semiconductor multilayer mirror formed of a plurality of pairs of a high-refractive-index area and a low-refractive-index area; an active layer that is vertically sandwiched by cladding layers, and has an oscillation wavelength of equal to or more than 980 nanometers; and a p-type semiconductor multilayer mirror formed of a plural pairs of a high-refractive-index area and a low-refractive-index area on a substrate. The high-refractive-index layer of the p-type semiconductor multilayer mirror within a predetermined number of pairs from the active layer in the p-type semiconductor multilayer mirror includes a first high-refractive-index area that is adjacent to an interface with the low-refractive-index layer, and p-type-doped with a first impurity concentration; and a second high-refractive-index area that is provided outside the first high-refractive-index area, and is p-type-doped with a second impurity concentration lower than the first impurity concentration. The low-refractive-index layer of the p-type semiconductor multilayer mirror within a predetermined number of pairs from the active layer in the p-type semiconductor multilayer mirror includes a first low-refractive-index area that is adjacent to an interface with the high-refractive-index layer, and p-type-doped with a third impurity concentration; and a second low-refractive-index area that is provided outside the first low-refractive-index area, and is p-type-doped with a fourth impurity concentration lower than the third impurity concentration.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 10 is a sectional view showing a structure of a surface emitting laser according to a third embodiment of the invention;

FIGS. 11A, 11B, and 11C are sectional views of a structure of an 850 nm band surface emitting laser used in measurement;

FIG. 23A is a table showing a relation between the number of stacked layers of n-type DBR mirrors and a reflectivity;

FIG. 23B is a table showing a relation between the number of stacked layers of p-type DBR mirrors and a reflectivity;

FIG. 30 is a table showing laser parameters used for calculating the graph in FIG. 29;

FIG. 32 is a table showing an increase in resistance with respect to an oxidation confinement type surface emitting laser in a 850-nanometer-band at the time when an impurity concentration of areas other than interface areas of low-refractive-index layers and high-refractive-index layers is changed for five pairs from a GaAs cladding layer in an upper part of a p-type upper semiconductor multilayer mirror;

BEST MODE FOR CARRYING OUT THE INVENTION

Figure 1:
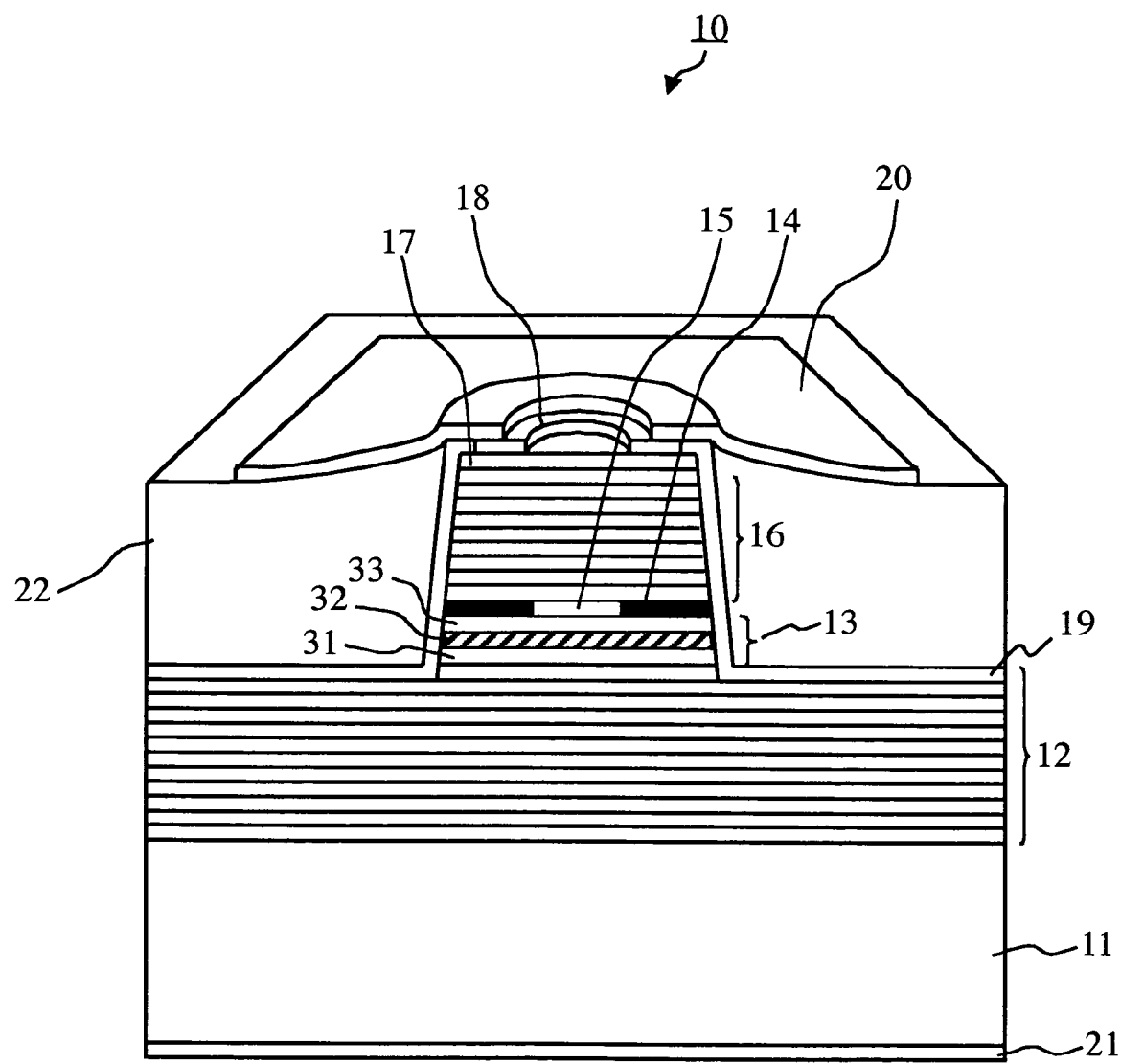
FIG. 1 is a perspective sectional view of a surface emitting laser according to a first embodiment of the invention.

Exemplary embodiments of a surface emitting laser, and a transceiver, an optical transceiver, and an optical communication system employing the surface emitting laser according to the present invention will be explained in detail with reference to the accompanying drawings. Note that the invention is not limited by the embodiments. In the description of the drawings, identical or similar portions are denoted by identical or similar reference numerals and signs. It should be noted that the drawings are schematic, and a relation among thicknesses and widths of respective layers and a ratio of the respective layers are different from actual ones. It is needless to mention that a relation of dimensions and a ratio of the dimensions are different in some portions among the drawings.

First, a surface emitting laser according to a first embodiment will be explained. The surface emitting laser according to the first embodiment is characterized in that a reflectivity and temperature characteristics are improved compared with the conventional technique by including thin AlAs layers, which are not oxidized easily, in an upper semiconductor multilayer mirror and a lower semiconductor multilayer mirror.

Figure 8:
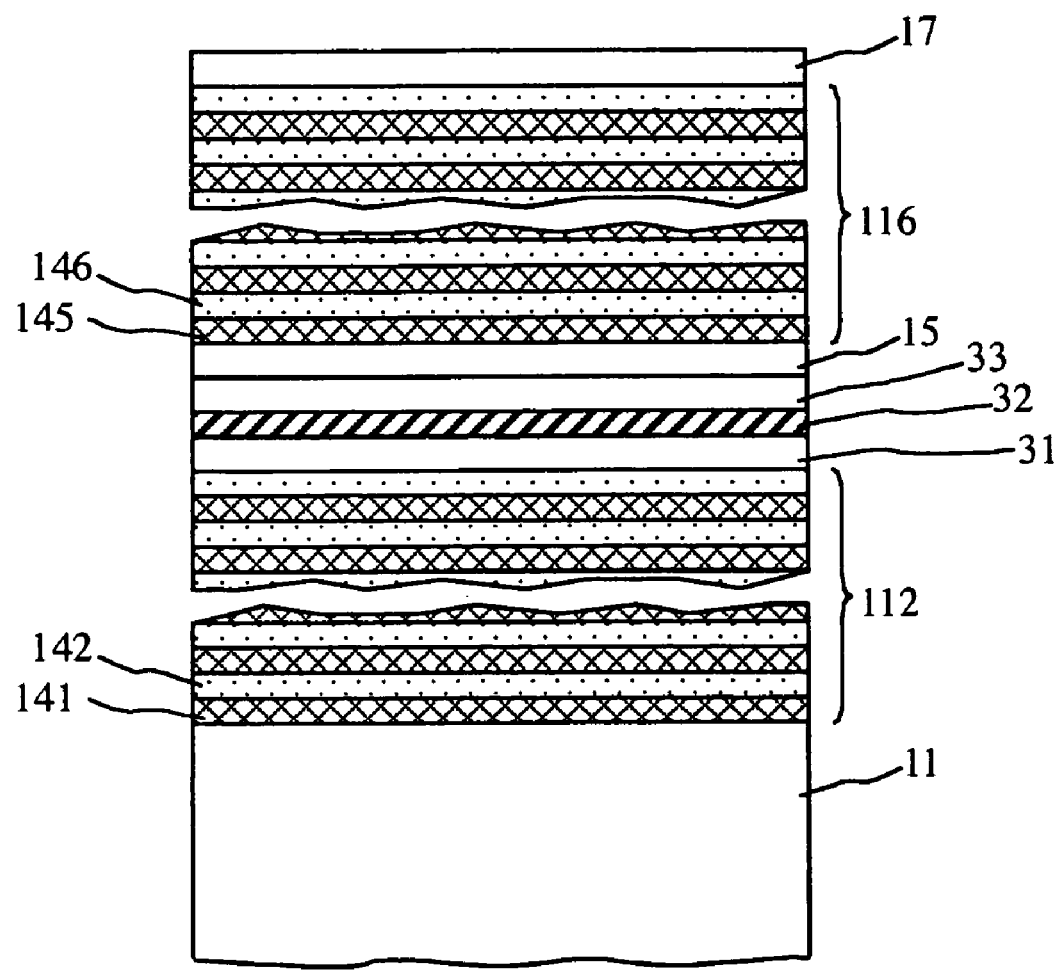
FIG. 8 is an explanatory diagram for explaining a lower semiconductor multilayer mirror and an upper semiconductor multilayer mirror of the conventional surface emitting laser.
Figure 9:
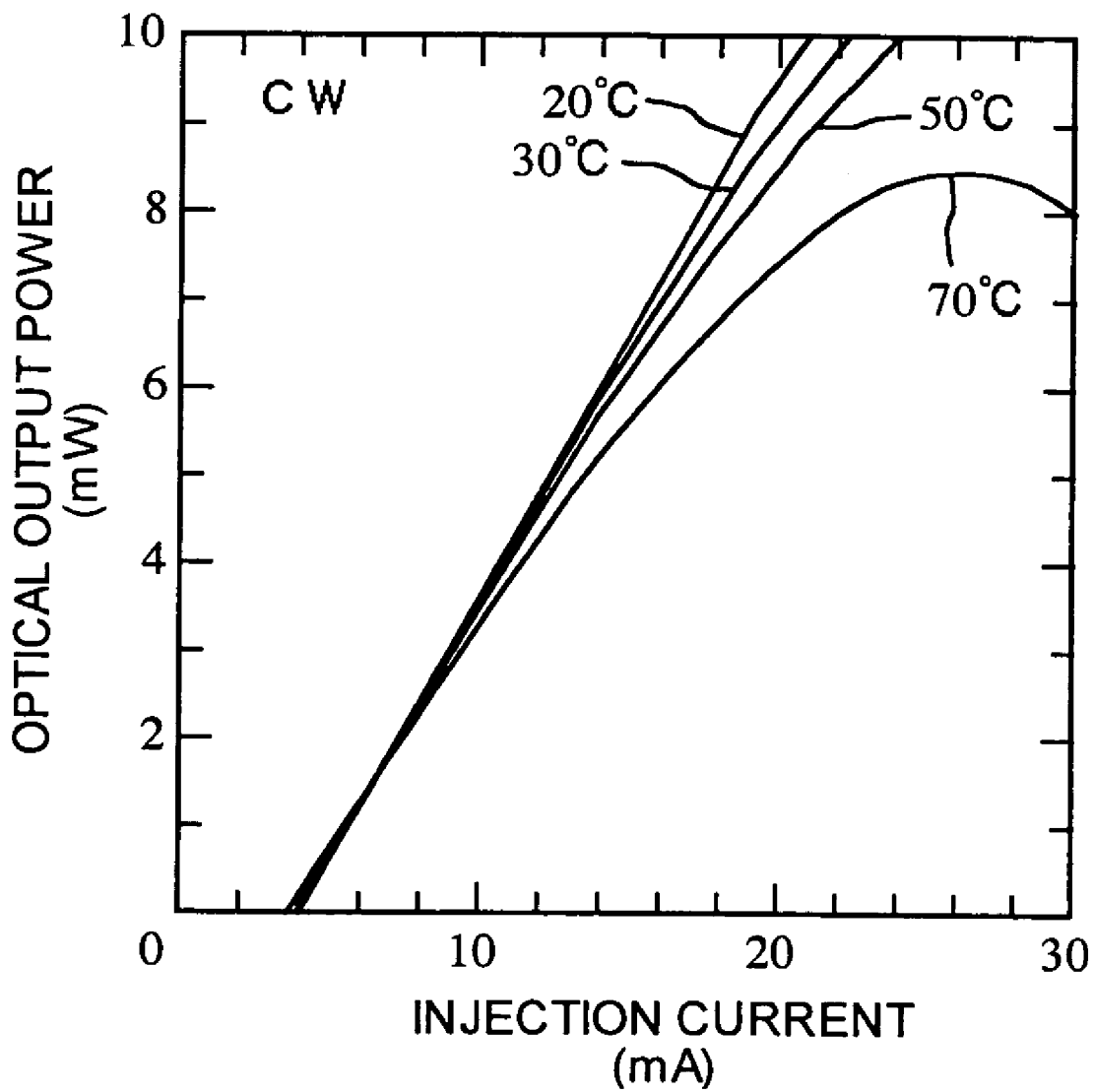
FIG. 9 is a diagram of current-optical output power characteristics of the conventional surface emitting laser.

A relation between a thickness of the AlAs layer and an oxidation rate will be explained. As shown in FIG. 8B on page 916 of the IEEE Journal of Selected topics in Quantum Electronics Vol. 3, 3, Jun. 1997, it is known that the easiness of oxidation of AlAs rapidly increases according to an increase in a film thickness up to a certain film thickness. As a result of detailed experiments concerning the relation between a film thickness of AlAs and an oxidation rate, the inventors found that, although the oxidation rate varies depending on conditions of epitaxial growth and oxidation conditions, AlAs is stable and is rarely oxidized when the film thickness is 10 nanometers or less. In other words, the inventors came to obtain knowledge that a surface emitting laser, which has a high reflectivity and satisfactory temperature characteristics and can be manufactured by the same simple process as in the past, can be provided by including an AlAs layer with a film thickness of 10 nanometer or less in a semiconductor multilayer mirror.

Figure 2:
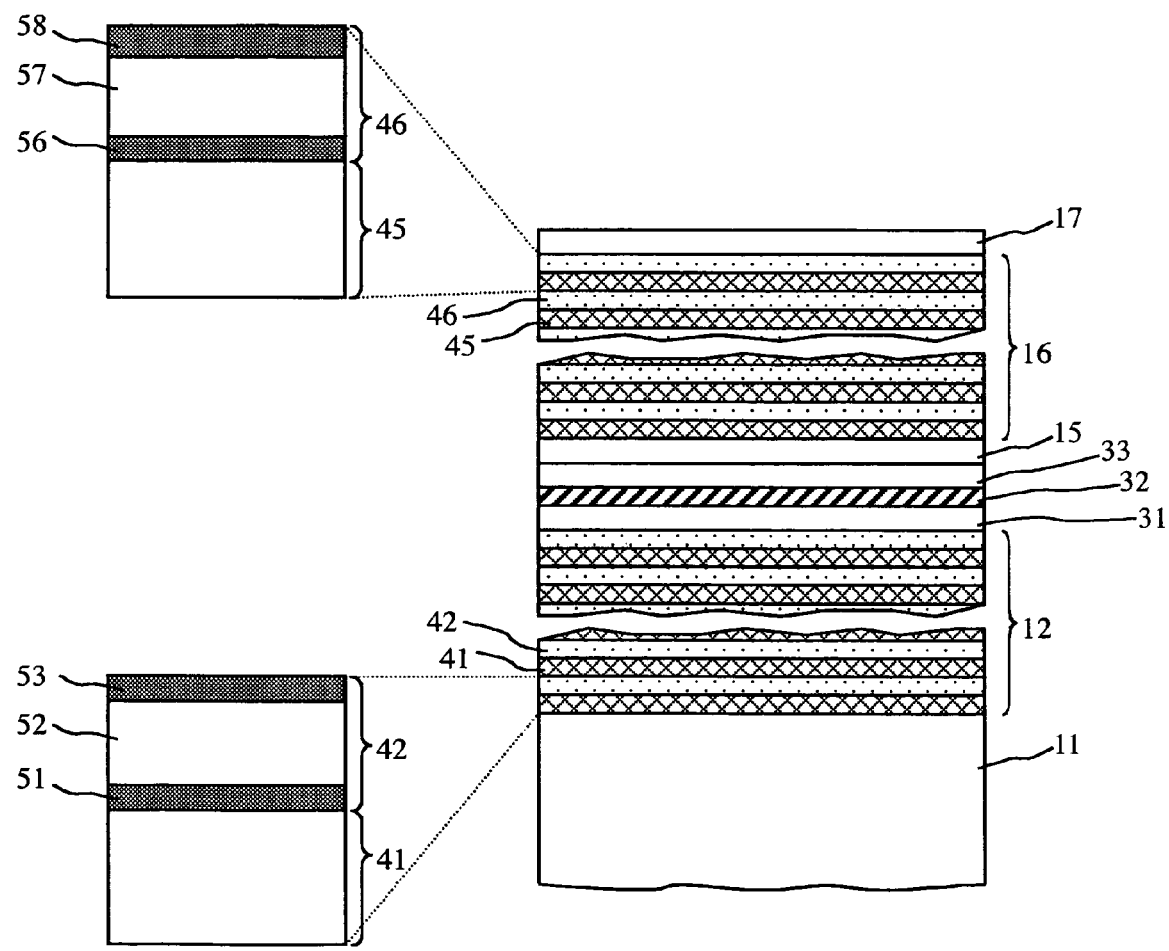
FIG. 2 is an explanatory diagram for explaining structures of a lower semiconductor multilayer mirror and an upper semiconductor multilayer mirror of a surface emitting laser according to the first embodiment.

FIG. 1 is a perspective sectional view of the surface emitting laser according to the first embodiment. FIG. 2 is an explanatory diagram for explaining structures of a lower semiconductor multilayer mirror and an upper semiconductor multilayer mirror of the surface emitting laser according to the first embodiment. Note that, portions common to FIG. 1 and FIG. 7 are denoted by identical reference numerals, and portions common to FIG. 1 and FIG. 2 are denoted by identical reference numerals.

Figure 7:
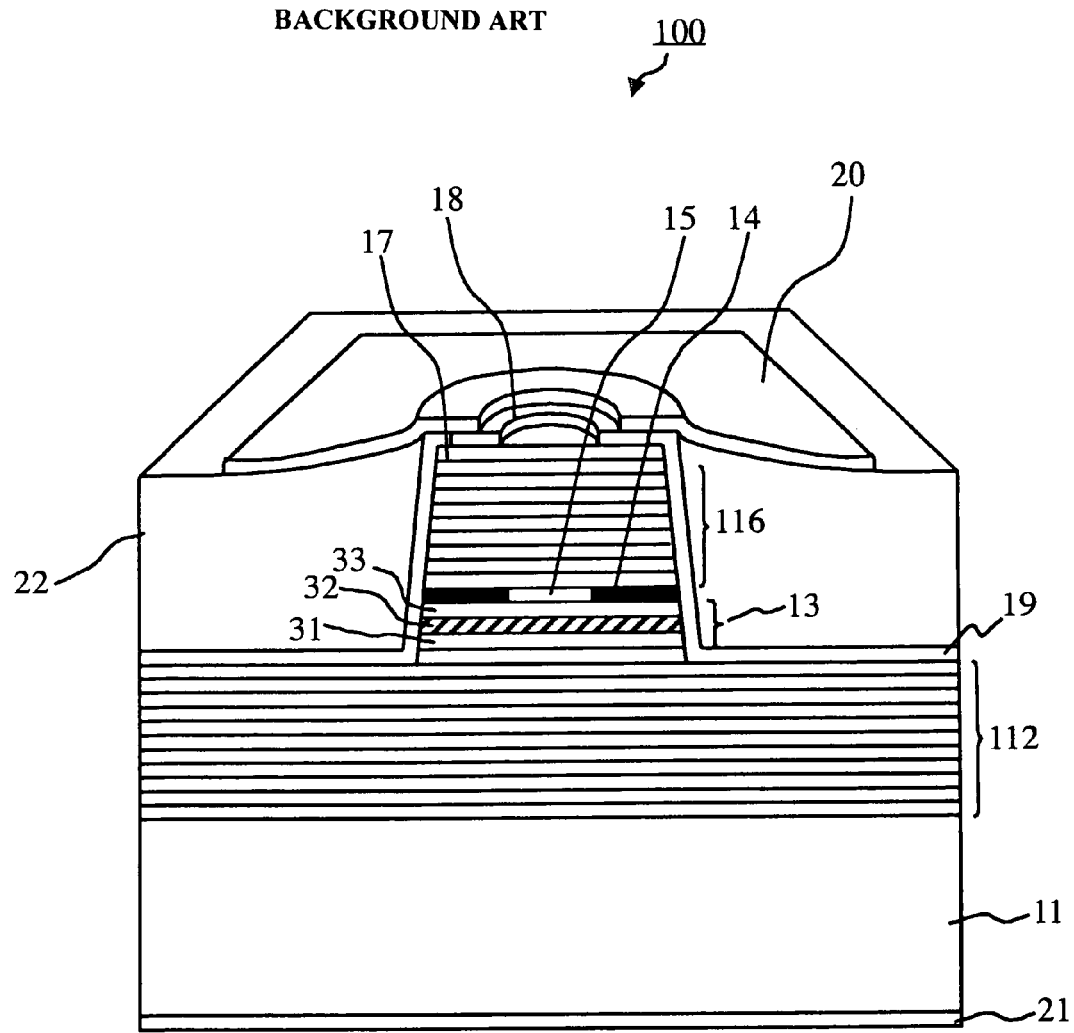
FIG. 7 is a perspective sectional view of a conventional surface emitting laser.

A surface emitting laser 10 shown in FIG. 1 is different from a conventional surface emitting laser shown in FIG. 7 in respective layer structures of a lower semiconductor multilayer mirror 12 and an upper semiconductor multilayer mirror 16. Thus, the large difference is explained in FIG. 2. To manufacture the surface emitting laser 10 shown in FIG. 1, first, the lower semiconductor multilayer mirror (lower DBR mirror) 12 is formed on an n-type GaAs substrate 11 by the MOCVD method. Here, in the lower semiconductor multilayer mirror 12, as shown in FIG. 2, assuming that a stacked structure of an n-type high-refractive-index area 41 and an n-type low-refractive-index area 42 having respective thicknesses of $\lambda/4n$ ($\lambda$ is an oscillation wavelength and n is a refractive index) forms one pair, thirty-five pairs are stacked.

Note that, although the n-type high-refractive-index area 41 is formed of n-type $Al_{0.2}Ga_{0.8}As$ as in the past, the n-type low-refractive-index area 42 is formed of three layers, namely, a first n-type AlAs layer 51, an n-type $Al_{0.9}Ga_{0.1}As$ layer 52, and a second n-type AlAs layer 53. In particular, thicknesses of the first n-type AlAs layer 51 and the second n-type AlAs layer 53 are about 5 nanometers, respectively, and a thickness of the n-type $Al_{0.9}Ga_{0.1}As$ layer 52 is calculated by subtracting a sum of thicknesses of the first n-type AlAs layer 51 and the second n-type AlAs layer 53 from $\lambda/4n$.

Then, a QW active layer 32 vertically sandwiched by cladding layers 31 and 33 is formed on the lower semiconductor multilayer mirror 12. In addition, the $Al_zGa_{1-z}As$ ($0.95 \leq z \leq 1$) layer 15 for forming a current confinement layer in a later process is formed. Further, an upper semiconductor multilayer mirror 16 (upper DBR mirror) is formed on the $Al_zGa_{1-z}As$ ($0.95 \leq z \leq 1$) layer 15. Here, as shown in FIG. 2, in the upper semiconductor multilayer mirror 16, assuming that a stacked structure of a p-type high-refractive-index area 45 and a p-type low-refractive-index area 46 having respective thicknesses of $\lambda/4n$ ($\lambda$ is an oscillation wavelength and n is a refractive index) forms one pair, twenty-five pairs are stacked.

Note that, although the p-type high-refractive-index area 45 is formed of p-type $Al_{0.2}Ga_{0.8}As$ as in the past, the p-type low-refractive-index area 46 is formed of three layers, namely, a first p-type AlAs layer 56, an p-type $Al_{0.9}Ga_{0.1}As$ layer 57, and a second p-type AlAs layer 58. In particular, thicknesses of the first p-type AlAs layer 56 and the second p-type AlAs layer 58 are about 5 nanometers, respectively, and a thickness of the p-type $Al_{0.8}Ga_{0.1}As$ layer 57 is calculated by subtracting a sum of thicknesses of the first p-type AlAs layer 56 and the second p-type AlAs layer 58 from $\lambda/4n$. In addition, a p-type GaAs contact layer 17 is formed on the upper semiconductor multilayer mirror 16.

Next, a photolithography process and an etching process (dry etching or wet etching) are performed. An outer edge of a stacked structure, which consists of the upper semiconductor multilayer mirror 16, the $Al_zGa_{1-z}As$ ($0.95 \leq z \leq 1$) layer 15, the cladding layer 33, the QW active layer 32, the cladding layer 31, and a part of the lower semiconductor multilayer mirror 12, is removed. Consequently, for example, a columnar mesa-post with a diameter of 30 micrometers is formed.

Next, oxidation treatment is performed at temperature of about 400° C. for twenty minutes in a moisture vapor atmosphere to selectively oxidize the $Al_zGa_{1-z}As$ ($0.95 \leq z \leq 1$) layer 15 from a sidewall of the mesa-post to form the Al oxide layer 14. For example, when the Al oxide layer 14 is formed in a ring shape with a band width of 10 micrometers, an area of the $Al_zGa_{1-z}As$ ($0.95 \leq z \leq 1$) layer 15 in the center, that is, an area of an aperture to which a current is injected is about 80 $\mu m^2$ (with a diameter of 10 micrometers). Here, in particular, an oxidation amount of the first n-type AlAs layer 51 and the second n-type AlAs layer 53 in the lower semiconductor multilayer mirror 12 and the first p-type AlAs layer 56, the p-type $Al_{0.9}Ga_{0.1}As$ layer 57, and the second p-type AlAs layer 58 was only 0.2 micrometers from peripheries thereof.

Then, the silicon nitride film 19 functioning as a protective layer is formed on an upper surface and a side surface of the mesa-post and an exposed upper surface of the lower semiconductor multilayer mirror 12. Subsequently, periphery of the mesa-post, on which the silicon nitride film 19 is formed, is filled with the polyimide 22. The silicon nitride film 19 formed on the upper surface of the mesa-post is removed in a circular shape with a diameter of 30 micrometers to further form the p-type electrode 18 of a ring shape with an inner diameter of 20 micrometers and an outer diameter of 30 micrometers on the p-type GaAs contact layer 17 exposed by the removal. After grinding the substrate to have a thickness of, for example, 200 micrometers, the n-type electrode 21 is formed on the back of the n-type GaAs substrate 11. The electrode pad 20, on which a wire is bonded, is formed on the polyimide 22 to come into contact with the p-type electrode 18.

Figure 3:
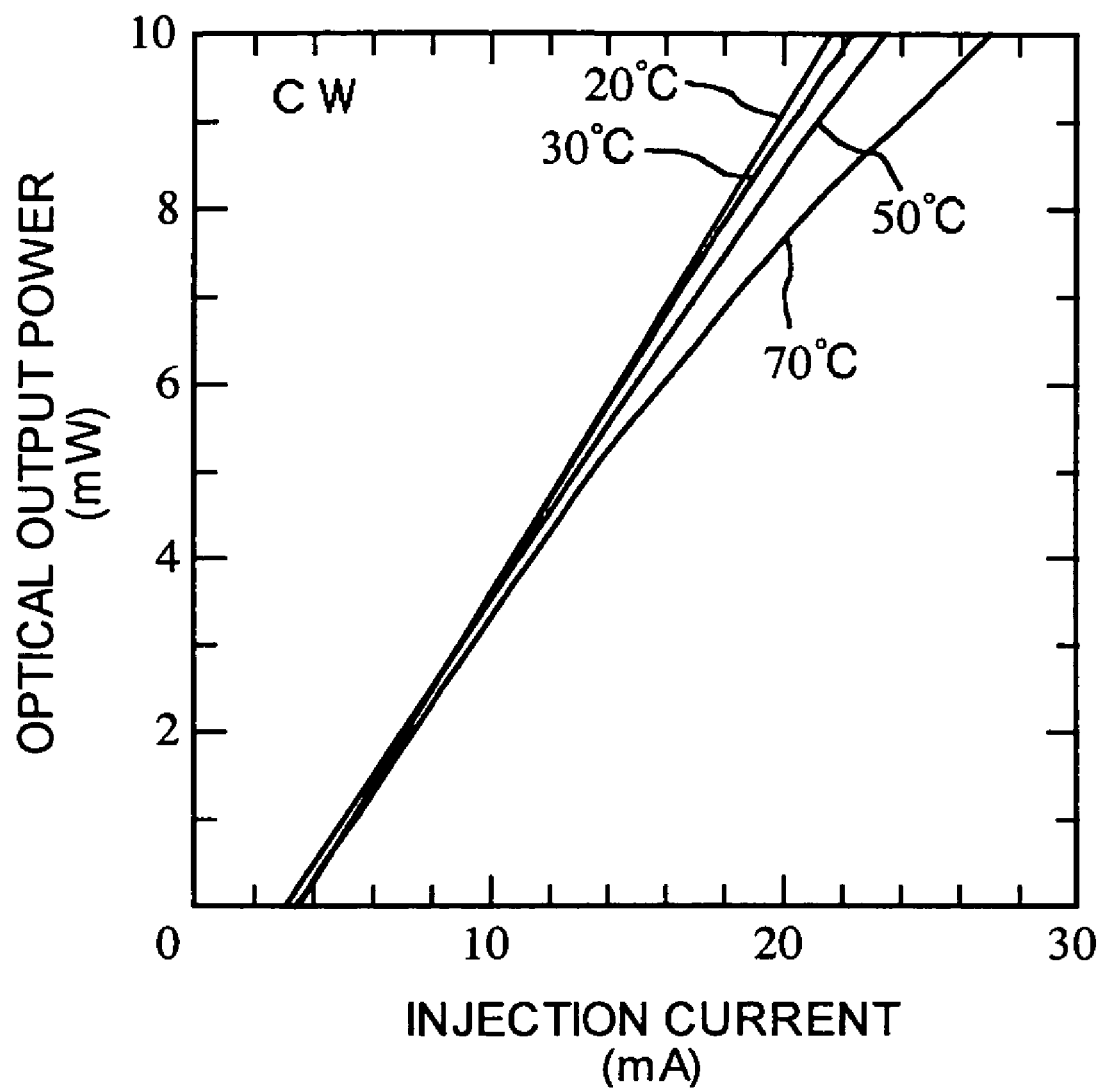
FIG. 3 is a diagram of current-optical output power characteristics of the surface emitting laser according to the first embodiment.

FIG. 3 is a diagram of current-optical output power characteristics of the surface emitting laser according to the first embodiment. As shown in FIG. 3, it is seen that the surface emitting laser according to the first embodiment has satisfactory thermal saturation characteristics of optical output power and operates stably at high power even in a high temperature environment. Note that, results of other characteristic evaluation performed by the inventors indicate that an oscillation threshold value is also satisfactory and there is no dislocation error.

Figure 4A:
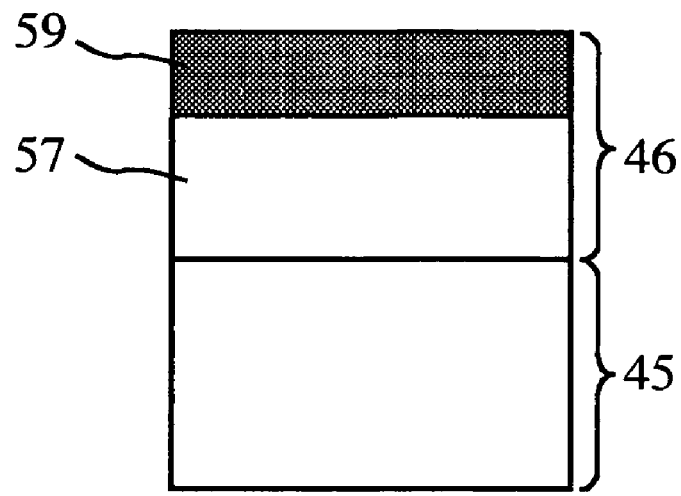
FIGS. 4A and 4B are diagrams of structures of one pair of semiconductor multilayer mirrors in other arrangement examples of an AlAs layer in the surface emitting laser according to the first embodiment.
Figure 4B:
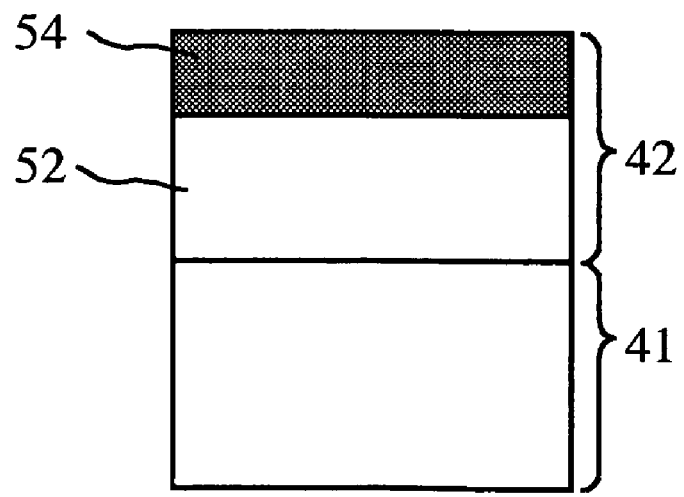

In the above explanation, the two AlAs layers are arranged to sandwich the $Al_{0.9}Ga_{0.1}As$ layer in the n-type low-refractive-index area 42 and the p-type low-refractive-index area 46, respectively. However, only one AlAs layer may be arranged in a low-refractive-index area if the AlAs layer has a thickness of 10 nanometers or less. FIGS. 4A and 4B are diagrams showing a structure of one pair of semiconductor multilayer mirrors in that case. In other words, the p-type low-refractive-index area 46 can be formed of the a p-type AlAs layer 59 with a thickness of 10 nanometers and p-type $Al_{0.9}Ga_{0.1}As$ layer 57 as shown in FIG. 4A, and the n-type low-refractive-index area 42 can be formed of a p-type AlAs layer 54 with a thickness of 10 nanometers and the n-type $Al_{0.9}Ga_{0.1}As$ layer 52 as shown in FIG. 4B. The invention is not limited to this, and three or more AlAs layers may be arranged in an identical low-refractive-index area as long as a condition that an AlAs layer has a thickness of 10 nanometers or less is satisfied. In addition, although it is preferable to include AlAs layers in all pairs forming the lower semiconductor multilayer mirror 12 and the upper semiconductor multilayer mirror 16, the AlAs layers may be included in a part of the pairs.

As described above, according to the surface emitting laser according to the first embodiment, AlAs layers with a thickness of 10 nanometers or less, which is not easily oxidized, are included in both the lower semiconductor multilayer mirror 12 and the upper semiconductor multilayer mirror 16 sandwiching the active layer 13. Thus, characteristics of a low refractive index and high thermal conductivity inherent in the AlAs layer can be adopted in the semiconductor multilayer mirrors. Consequently, a reflectivity and temperature characteristics are improved to make laser oscillation at high power possible.

Note that, it is also possible to design the surface emitting laser such that one of the lower semiconductor multilayer mirror 12 and the upper semiconductor multilayer mirror 16 is formed of a pair including an AlAs layer, although the effect is reduced.

Next, a surface emitting laser according to a second embodiment of the invention will be explained. The surface emitting laser according to the second embodiment is characterized in that thin AlAs layers, which are not easily oxidized, are included in a lower semiconductor multilayer mirror and an upper semiconductor multilayer mirror and inclined composition layers are arranged as a layers adjacent to the AlAs layers.

Figure 5:
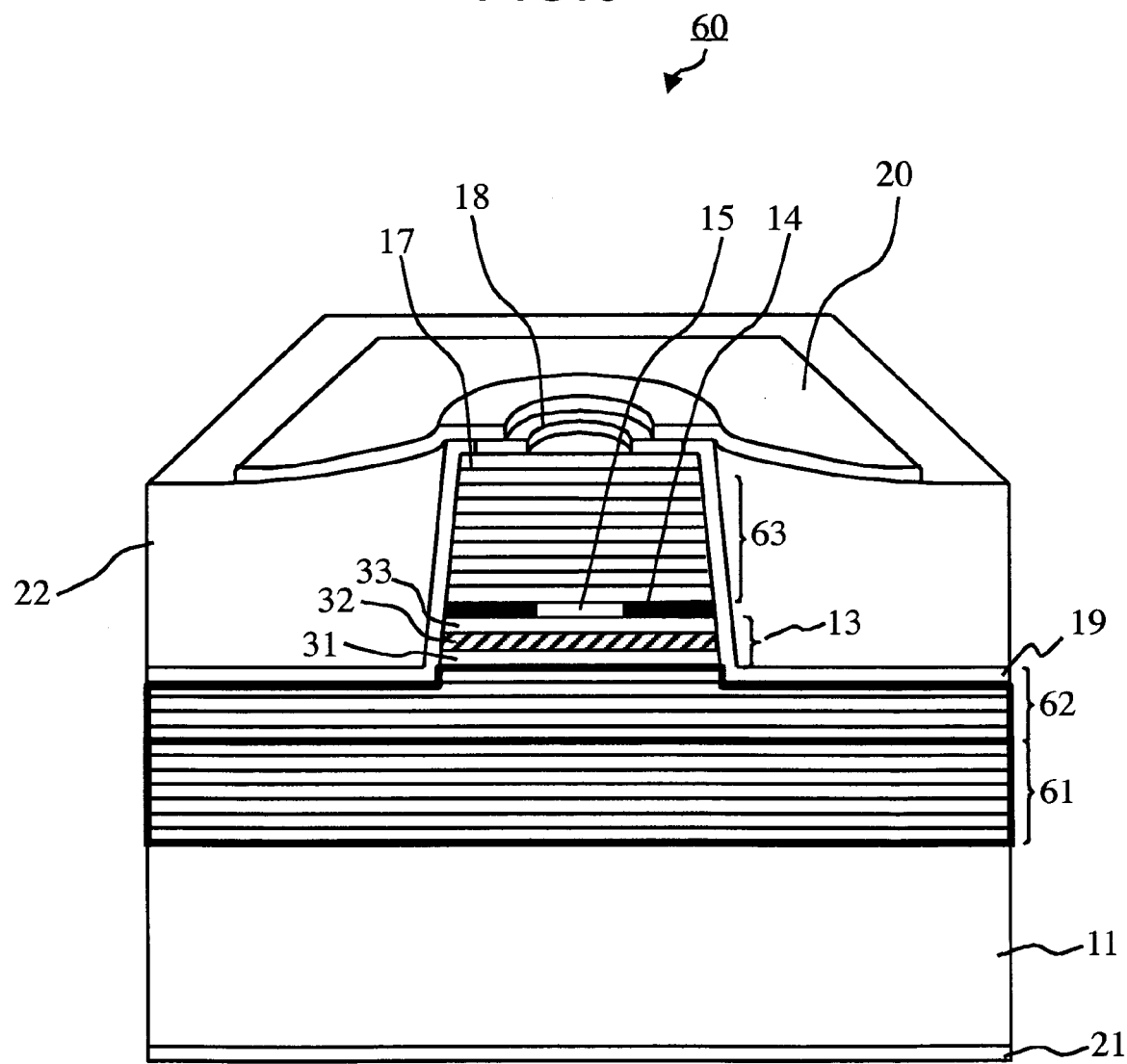
FIG. 5 is a perspective sectional view of a surface emitting laser according to a second embodiment of the invention.
Figure 6:
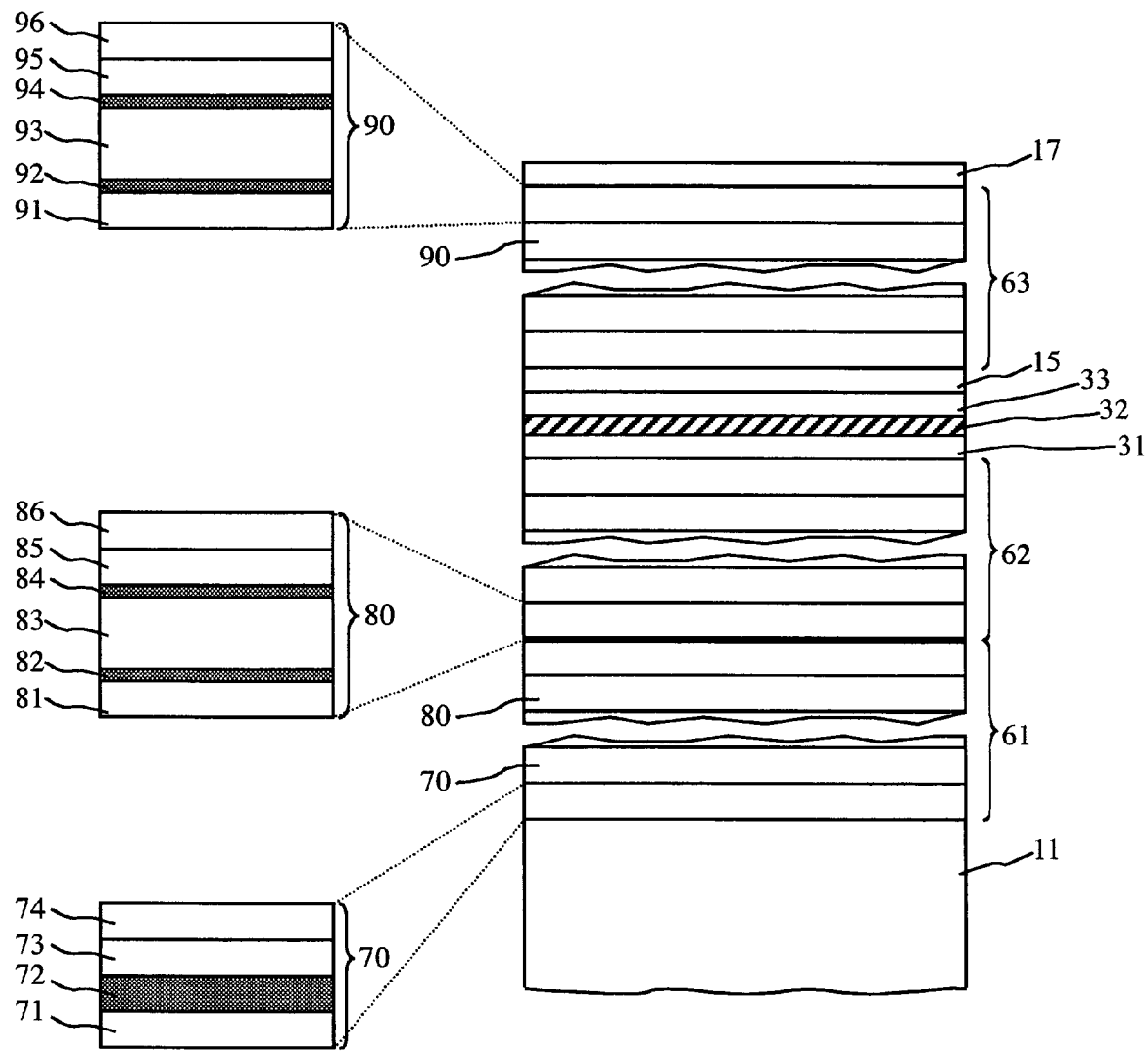
FIG. 6 is an explanatory diagram for explaining structures of a lower semiconductor multilayer mirror and an upper semiconductor multilayer mirror of a surface emitting laser according to the second embodiment.

FIG. 5 is a perspective sectional view of the surface emitting laser according to the second embodiment. FIG. 6 is an explanatory diagram for explaining structures of the lower semiconductor multilayer mirror and the upper semiconductor multilayer mirror according to the second embodiment. Note that, portions common to FIG. 1 and FIG. 5 are denoted by the identical reference numerals, and portions common to FIG. 5 and FIG. 6 are denoted by the identical reference numerals.

The surface emitting laser shown in FIG. 5 is different from the surface emitting laser according to the first embodiment shown in FIG. 1 in that the lower semiconductor multilayer mirror is divided into two areas of a first lower semiconductor multilayer mirror 61 and a second semiconductor multilayer mirror 62 and in a layer structure of an upper semiconductor multilayer mirror 63. Thus, the large difference is explained in FIG. 6. To manufacture a surfaced emitting laser element 60 shown in FIG. 5, first, the first lower semiconductor multilayer mirror (lower DBR mirror) 61 is formed on the n-type GaAs substrate 11 by the MOCVD method.

As shown in FIG. 6, in the first lower semiconductor multilayer mirror 61, assuming that a semiconductor layer 70 consisting of lamination of an n-type low-refractive-index area and an n-type high-refractive-index area forms one pair, twenty pairs are stacked. A first inclined composition layer 71 is formed of n-type $Al_iGa_{1-i}As$ (i=0.2→1.0), an Al composition of which increases gently from 20 percent to 100 percent. A thickness of the first inclined composition layer 71 is usually 10 to 30 nanometers and is 20 nanometers in the second embodiment. In addition, an n-type low-refractive-index area 72 is formed of n-type AlAs.

A second inclined composition layer 73 is formed of n-type $Al_jGa_{1-j}As$ (j=1.0→0.2), an Al composition of which decreases gently from 100 percent to 20 percent. Note that a thickness of the second inclined composition layer 73 is the same as that of the first inclined composition layer 71. In addition, an n-type high-refractive-index area 74 is formed of n-type $Al_{0.2}Ga_{0.8}As$. A thickness of the n-type low-refractive-index area (n-type AlAs) 72 is calculated by subtracting half a thickness of the first inclined composition layer 71 and further subtracting half a thickness of the second inclined composition layer 73 from $\lambda/4n$. Thus, for example, when the thickness of the first inclined composition layer 71 is 20 nanometers and the thickness of the second inclined composition layer 73 is 20 nanometers, the thickness of the n-type low-refractive-index area (n-type AlAs) 72 is ($\lambda/4n$-10-10) nanometers. A thickness of the high-refractive-index layer 74 is calculated in the same manner and is ($\lambda/4n$-10-10) nanometers in this case. Note that, since the n-type low-refractive-index area (n-type AlAs) 72 in this embodiment is never exposed by etching in a later process, the thickness of the n-type low-refractive-index area (n-type AlAs) 72 may be 10 nanometers or more. Here, the inclined composition layer such as the first inclined composition layer 71 or the second inclined composition layer 73 is publicly known as a structure with which an effect of reducing an electric resistance is obtained.

On the other hand, as shown in FIG. 6, the second lower semiconductor multilayer mirror 62 is a layer in which, assuming that a semiconductor layer 80 consisting of lamination of an n-type low-refractive-index area and an n-type high-refractive-index area forms one pair, fifteen pairs are stacked. A first inclined composition layer 81 is formed of n-type $Al_iGa_{1-i}As$ (i=0.2→1.0), an Al composition of which increases gently from 20 percent to 100 percent. In addition, the n-type low-refractive-index area is formed of three layers of a first n-type AlAs layer 82, an n-type $Al_{0.9}Ga_{0.1}As$ layer 83, and a second n-type AlAs layer 84. Note that it is necessary to set thicknesses of the first n-type AlAs layer 82 and the second AlAs layer 84 to 10 nanometers or less as explained in the first embodiment. Here, the thicknesses are set to 5 nanometers, respectively.

A second inclined composition layer 85 is formed of n-type $Al_jGa_{1-j}As$ (j=1.0→0.2), an Al composition of which decreases gently from 100 percent to 20 percent. Note that a thickness of the second inclined composition layer 85 is the same as that of the first inclined composition layer 81. An n-type low-refractive-index area 86 is formed of an n-type $Al_{0.2}Ga_{0.8}As$ layer. A thickness of the n-type $Al_{0.9}Ga_{0.1}As$ layer 83 is calculated by subtracting half a thickness of the first inclined composition layer 81, further subtracting a thickness of the first AlAs layer 82, and further subtracting a thickness of the second AlAs layer 84 from $\lambda/4n$. In this case, the thickness of the n-type $Al_{0.9}Ga_{0.1}As$ layer 83 is ($\lambda/4n$-10-5-5-10) nanometers. In addition, a thickness of the n-type low-refractive-index area (AlAs) 86 is calculated by subtracting half a thickness of the first inclined composition layer 81 and further subtracting half a thickness of the second inclined composition layer 85 from $\lambda/4n$.

Next, the QW active layer 32 vertically sandwiched by the cladding layers 31 and 33 is formed on the second lower semiconductor multilayer mirror 62. In addition, the $Al_zGa_{1-z}As$ (0.95≦z≦1) layer 15 for forming a current confinement layer in a later process is formed. Further, the upper semiconductor multilayer mirror 63 (upper DBR mirror) is formed on the $AlGa_{1-z}As$ (0.95≦z≦1) layer 15.

As shown in FIG. 6, the upper semiconductor multilayer mirror 63 is a layer in which, assuming that a semiconductor layer 90 consisting of lamination of a p-type low-refractive-index area and a p-type high-refractive-index area forms one pair, fifteen pairs are stacked. A first inclined composition layer 91 is formed of p-type $AlGa1-iAs$ (i=0.2→1.0), an Al composition of which increases gently from 20 percent to 100 percent. The p-type low-refractive-index area is formed of three layers of a first p-type AlAs layer 92, a p-type $Al_{0.9}Ga_{0.1}As$ layer 93, and second p-type AlAs layer 94. Note that it is necessary to set thicknesses of the first p-type AlAs layer 92 and the second p-type AlAs layer 94 to 10 nanometers or less as explained in the first embodiment. Here, the thicknesses are set to 5 nanometers, respectively.

A second inclined composition layer 95 is formed of p-type $Al_jGa_{1-j}As$ (j=1.0→0.2), an Al composition of which decreases gently from 100 percent to 20 percent. Note that a thickness of the second inclined composition layer 95 is the same as that of the first inclined composition layer 91. A low-refractive-index area 96 is formed of an p-type $Al_{0.2}Ga_{0.8}As$ layer. A thickness of the p-type $Al_{0.9}Ga_{0.1}As$ layer 93 is calculated by subtracting half a thickness of the first inclined composition layer 91, further subtracting a thickness of the first AlAs layer 92, further subtracting a thickness of the second AlAs layer 94, and further subtracting a thickness of the inclined composition layer 95 from $\lambda 4n$. In this case, the thickness of the p-type $Al_{0.9}Ga_{0.1}As$ layer 93 is ($\lambda/4n$-10-5-5-10) nanometers. In addition, a thickness of the p-type AlAs 96 is calculated by subtracting half a thickness of the first inclined composition layer 91 and further subtracting half a thickness of the second inclined composition layer 95 from $\lambda/4n$. As shown in FIG. 6, the upper semiconductor multilayer mirror 63 is a layer in which, assuming that the semiconductor layer 90 consisting of lamination of a p-type low-refractive-index area and a p-type high-refractive-index area having respective thicknesses of $\lambda/4n$ ($\lambda$ is an oscillation wavelength and n is a refractive index) forms one pair, twenty-five pairs are stacked. In the semiconductor layer 90, the p-type low-refractive-index layer is formed of four layers of the first inclined composition layer 91, the first p-type AlAs layer 92, the p-type $Al_{0.9}Ga_{0.1}As$ layer 93, and the second p-type AlAs layer 94. Here, in particular, the first inclined composition layer 91 is formed of p-type $Al_iGa_{1-i}As$ (i=0.2→1.0), an Al composition of which increases gently from 20 percent to 100 percent. Note that it is necessary to set thicknesses of the first p-type AlAs layer 92 and the second p-type AlAs layer 94 to 10 nanometers or less as explained in the first embodiment. Here, the thicknesses are set to 5 nanometers, respectively. Thus, for example, when the thickness of the first inclined composition layer 91 is set to 20 nanometers, the thickness of the p-type $Al_{0.9}Ga_{0.1}As$ layer 93 is calculated by subtracting 30 nanometers from $\lambda/4n$.

Then, the p-type GaAs contact layer 17 is formed on the upper semiconductor multilayer mirror 63. Next, a photolithography process and an etching process (dry etching or wet etching) are performed. With the processes, an outer edge of a stacked structure, which consist of the upper semiconductor multilayer mirror 63, the $Al_zGa_{1-z}As$ ($0.95 \leq z \leq 1$) layer 15, the cladding layer 33, the QW active layer 32, the cladding layer 31, and a part of the lower semiconductor multilayer mirror 62, is removed. Consequently, for example, a columnar mesa-post with a diameter of 30 micrometer is formed.

Next, oxidation treatment is performed at temperature of about 400° C. for twenty minutes in a moisture vapor atmosphere to selectively oxidize the $Al_zGa_{1-z}As$ ($0.95 \leq z \leq 1$) layer 15 from a sidewall of the mesa-post to form the Al oxide layer 14. For example, when the Al oxide layer 14 is formed in a ring shape with a band width of 10 micrometers, an area of the $Al_zGa_{1-z}As$ ($0.95 \leq z \leq 1$) layer 15 in the center, that is, an area of an aperture to which a current is injected is about 80 $\mu m^2$ (with a diameter of 10 micrometers).

Then, the silicon nitride film 19 functioning as a protective layer is formed on an upper surface and a side surface of the mesa-post and an exposed upper surface of the lower semiconductor multilayer mirror 112. Subsequently, periphery of the mesa-post, on which the silicon nitride film 19 is formed, is filled with the polyimide 22. The silicon nitride film 19 formed on the upper surface of the mesa-post is removed in a circular shape with a diameter of 30 micrometers to further form the p-type electrode 18 of a ring shape with an inner diameter of 20 micrometers and an outer diameter of 30 micrometers on the p-type GaAs contact layer 17 exposed by the removal. After grinding the substrate to have a thickness of, for example, 200 micrometers, the n-type electrode 21 is formed on the back of the n-type GaAs substrate 11. The electrode pad 20, on which a wire is bonded, is formed on the polyimide 22 to come into contact with the p-type electrode 18.

As explained above, according to the surface emitting laser according to the second embodiment, the AlAs layers with a thickness of 10 nanometers or less, which are not easily oxidized, are included in the second lower semiconductor multilayer mirror 62 and the upper semiconductor multilayer mirror 63, respectively. Thus, the same effects as those in the first embodiment can be realized. In addition, the introduction of an inclined composition layer further reduces an electric resistance of a semiconductor multilayer mirror to make it possible to further increase power.

Note that, although the respective layers are manufactured by the MOCVD method in the first and the second embodiment, the layers may be manufactured by a molecular beam epitaxy (MBE) method or the like. In addition, although the respective layers are formed on the n-type GaAs substrate 11 to obtain the surface emitting laser in the first and the second embodiment, a p-type GaAs substrate may be used instead of the n-type GaAs substrate 11. In this case, a p-type lower semiconductor multilayer mirror and an n-type upper semiconductor multilayer mirror are used, and an electrode material corresponding to the p-type lower semiconductor multilayer mirror and the n-type upper semiconductor multilayer mirror is used. Moreover, the surface emitting laser does not limit an oscillation wavelength. The surface emitting laser can be applied to a structure for oscillating a wavelength in a bandwidth between 700 nanometers to 1600 nanometers, more specifically, a wavelength of 780 nanometers, 850 nanometers, 980 nanometers, 1300 nanometers, or 1550 nanometers.

First, a surface emitting laser according to a third embodiment will be explained. In the surface emitting laser according to the third embodiment, a structure of a selectively oxidized area is optimized for a surface emitting laser in a 1300-nanometer-band. FIG. 10 is a sectional view of a structure of a surface emitting laser according to the third embodiment. The structure of the surface emitting laser according to the third embodiment will be explained with reference to FIG. 10 according to circumstances.

The surface emitting laser according to the third embodiment has a structure in which a lower reflective layer 1002 is stacked on a substrate 1001. An upper area of the lower reflective layer 1002 is formed in a mesa shape, and a lower cladding layer 1003, an active layer 1004, an upper cladding layer 1005, and an upper reflective layer 1006 are sequentially stacked on the area formed in the mesa shape. Note that the mesa shape is formed such that a horizontal sectional shape thereof is circular. Moreover, a contact layer 1007 is stacked on the upper reflective layer 1006, and a p side electrode 1008 formed in an annular shape including a current injection area is arranged in the center on the contact layer 1007, and an n side electrode 1009 is arranged on a lower surface of the substrate 1001. In the upper reflective layer 1006, a current confinement layer 1020, which consists of a current injection area 1019a arranged near the mesa center and having a circular shape in a horizontal section and a selectively oxidized area 1019b provided adjacent to the current injection area 1019a, is arranged. A specific structure of the selectively oxidized area 1019b will be explained in detail later.

The substrate 1001 consists of an n-type GaAs substrate. Usually, the substrate 1001 has a (100) surface as a principal plane, and a thin film structure of the lower reflective layer 1002 and layers above the upper reflective layers 1002 are stacked on the (100) surface. The lower reflective layer 1002 is a layer for reflecting and feeding back light of an emission wavelength in light generated in the active layer 1004. More specifically, the lower reflective layer 1002 has a structure in which a large number of mirror layers 1012 formed by a stacked structure of a high-refractive-index layer 1010 and a low-refractive-index layer 1011 are stacked.

The high-refractive-index layer 1010 is formed of an n-type GaAs layer, and the low-refractive-index layer 1011 is formed of an n-type $Al_{0.9}Ga_{0.1}As$ layer. Film thicknesses of the high-refractive-index layer 1010 and the low-refractive-index layer 1011 are adjusted such that an optical length thereof is ¼ of an emission wavelength λ to reflect only light of the emission wavelength. More specifically, since an emission wavelength of the surface emitting laser according to the embodiment is 1300 nanometers, the film thickness of the high-refractive-index layer 1010 is set to about 94 nanometers and the film thickness of the low-refractive-index layer 1011 is set to about 110 nanometers. With such a structure, the mirror layer 1012 has a function of reflecting light of the emission wavelength at a fixed ratio in a combination of the high-refractive-index layer 1010 and the low-refractive-index layer 1011. To increase a reflectivity in the lower reflective layer 1002 as a whole, the lower reflective layer 1002 is formed by stacking 34.5 mirror layers 1012. Note that a fraction below the decimal point is due to a layer consisting only of the high-refractive-index layer 1010.

The active layer 1004 has a structure including a QW layer. More specifically, as shown in FIG. 10, the active layer 1004 is formed of a barrier layer 1013a, a QW layer 1014a, a barrier layer 1013b, a QW layer 1014b, a barrier layer 1013c, a QW layer 1014c, and a barrier layer 1013d that are sequentially stacked on the lower cladding layer 1003. In other words, the active layer 1004 has a structure in which the three QW layers 1014a to 1014c are sandwiched among the four barrier layers 1013a to 1013d.

The QW layers 1014a to 1014c are layers for confining a carrier at high efficiency with a quantum confinement effect and are formed of GaInNAsSb layers. The QW layers 1014a to 1014c have high quality crystallinity when a very small amount of Sb is added. In addition, the QW layers 1014a to 1014c are required to be formed thin to show the quantum confinement effect. In the third embodiment, film thicknesses of the respective QW layers are set to about 7 nanometers.

The barrier layers 1013a to 1013d are layers for separating the QW layers 1014a to 1014c from each other. Film thicknesses of the barrier layer 1013a and the barrier layer 1013d are about 30 nanometers, and film thicknesses of the barrier layer 1013 and the barrier layer 1013c are about 20 nanometers.

The lower cladding layer 1003, the active layer 1004, and the upper cladding layer 1005 are formed such that a sum of optical length of the film thicknesses of the respective layers is twice as long as the emission wavelength λ and function as an optical cavity. Therefore, in the following explanation, the lower cladding layer 1003, the active layer 1004, and the upper cladding layer 1005 are generally referred to as a 2λ cavity 1015. In the third embodiment, the lower cladding layer 1003 consists of an n-type GaAs layer and the upper cladding layer 1005 consists of a p-type GaAs layer. Film thicknesses of the respective layers are about 297 nanometers.

Like the lower reflective layer 1002, the upper reflective layer 1006 is a layer for reflecting and feeding back light of an emission wavelength in light generated in the active layer 1004. More specifically, the upper reflective layer 1006 has a structure in which a large number of mirror layers 1018, which are formed of a pair of a low-refractive-index layer 1016 and a high-refractive-index layer 1017 stacked sequentially, are stacked. The low-refractive-index layer 1016 has a p-type $Al_{0.9}Ga_{0.1}As$ layer, and the high-refractive-index layer 1017 has a p-type GaAs layer. The upper reflective layer 1006 has a high reflectivity to feeding back a laser beam generated in the active layer 1004. Since the surface emitting laser according to the third embodiment emits a laser beam in a vertically upward direction with respect to the substrate 1001, the upper reflective layer 1006 is required to have a reflectivity lower than that of the lower reflective layer 1002. Therefore, the upper reflective layer 1006 has a structure consisting of twenty-five mirror layers 1018 that are smaller in number than the mirror layers in the lower reflective layer 1002. In the following explanation, concerning the twenty-five mirror layers 1012 or mirror layers 1018 forming the lower reflective layer 1002 or the upper reflective layer 1006, a mirror layer arranged on a side closest to the active layer 1004 is referred to as a mirror layer in a first round, a mirror layer arranged in contact with the mirror layer in the first round is referred to as a mirror layer in a second round, a mirror layer arranged in contact with the mirror layer in the second round is referred to as a mirror layer in a third round, and so on.

Among the low-refractive-index layers 1016 forming the upper reflective layer 1006, the low-refractive-index layer 1016 forming the mirror layer in the first round adjacent to the lowermost layer, that is, the upper cladding layer 1005 has a structure in which a p-type $Al_{0.9}Ga_{0.1}As$ layer and a p-type AlAs layer are stacked sequentially. Further, the current confinement layer 1020 is formed of the current injection area 1019a formed in an area near the center of the AlAs layer and the selectively oxidized area 1019b formed by selective oxidation in a part near the end of the AlAs layer.

The selectively oxidized area 1019b is an area for constricting a current injected from the p-side electrode 1008 to increase a density of a current flowing into the active layer 1004 and reduce an oscillation threshold value. In addition, since a refractive index of the selectively oxidized area 1019b has a value different from those of the current injection area 1019a and the $Al_{0.9}Ga_{0.1}As$ layer present around the selectively oxidized area 1019b, the refractive index affects light confinement in the horizontal direction. In other words, since the selectively oxidized area 1019b is present, the surface emitting laser according to the third embodiment includes a refractive index-guiding type waveguide.

In the third embodiment, a film thickness of the selectively oxidized area 1019b is set to 13 nanometers. In addition, a diameter of the current injection area 1019a defined by a width of the selectively oxidized area 1019b is set to 5.3 micrometers. A reason for adopting such a structure will be hereinafter explained.

The surface emitting laser according to the third embodiment improves oscillation characteristics by optimizing a structure of the selectively oxidized area 1019b. More specifically, it is necessary to examine a position where the selectively oxidized area 1019b is arranged in a mirror layer, a mirror layer in which the selectively oxidized area 1019b is arranged, and a width and a film thickness of the selectively oxidized area 1019b. Optimization of these requirements will be hereinafter explained.

First, it will be explained in which position in a mirror layer the selectively oxidized area 1019b should be arranged. The current injection area 1019a adjacent to the selectively oxidized area 1019b has a refractive index close to that of an $Al_{0.9}Ga_{0.1}As$ layer. Therefore, it is necessary to arrange the AlAs layers, which form the selectively oxidized area 1019b and the current injection area 1019a, in the low-refractive-index layer 1011 or the low-refractive-index layer 1016. Moreover, to control a loss of light generated in the active layer 1004, it is preferable to arrange the selectively oxidized area 1019b in a position close to a part of a node of a standing wave (position where a field intensity is minimized), that is, an area spaced apart from the active layer 1004 in the low-refractive-index layer 1011 or the low-refractive-index layer 1016, that is, a position near a lower surface of the low-refractive-index layer 1011 or an upper surface of the low-refractive-index layer 1016.

Next, it will be explained in which mirror layer the selectively oxidized area 1019b should be arranged. As already described, the selectively oxidized area 1019b includes a current confinement function. From the viewpoint of constricting a current to increase a density of a current flowing into the active layer 1004, it is preferable that the selectively oxidized area 1019b is arranged in a position near the active layer 1004. This is because, when the selectively oxidized area 1019b is arranged in a position spaced apart from the active layer 1004, the current constricted by the selectively oxidized area 1019b diffuses again by the time when the current is flown into the active layer 1004, and the current density falls. Therefore, from the viewpoint of controlling an oscillation threshold value to be low, it is preferable to arrange the selectively oxidized area 1019b near the active layer 1004.

On the other hand, when the selectively oxidized area 1019b is arranged near the active layer 1004, other problems occur. The selectively oxidized area 1019b is formed by once stacking an AlAs layer and other layers to process the layers in a mesa shape and then heating the layers in a moisture vapor atmosphere to introduce oxygen atoms from the outside and oxidize the layers selectively. Since an initial crystalline order is damaged by introducing the oxygen atoms from the outside, dislocation occurs in the selectively oxidized area 1019b. Therefore, when the selectively oxidized area 1019b is arranged too close to the active layer 1004, the dislocation in the selectively oxidized area 1019b affects a crystal structure of the active layer 1004, and reliability as a surface emitting laser is deteriorated. Thus, from the viewpoint of securing reliability of the surface emitting laser, it is preferable to arrange the selectively oxidized area 1019b spaced apart from the active layer 1004.

As described above, the control of an oscillation threshold value and the securing of reliability of the surface emitting laser is in a relation of tradeoff, there is an optimum value for a position in a stacking direction of the selectively oxidized area 1019b. Therefore, concerning the surface emitting laser, the inventors changes the position of the selectively oxidized area 1019b in the stacking direction to check characteristics of the surface emitting laser and derived the optimum value.

More specifically, concerning a surface emitting laser with an emission wavelength of about 850 nanometers (hereinafter referred to as "850 nm band surface emitting laser"), the inventors changed a position for arranging a selectively oxidized area in a stacking direction thereof and measured values of threshold currents and reliability of the surface emitting laser. The inventors used the 850 nm band surface emitting laser as an object of measurement because the 850 nm band surface emitting laser has been widely studied and characteristics thereof has been grasped well. Therefore, it is possible to eliminate an influence on a measurement result due to portions other than the selectively oxidized area and grasp an influence of the selectively oxidized area on characteristics of the surface emitting laser. Note that it is assumed that a structure of the 850-nm-band surface emitting laser used in the measurement is identical with the structure of the surface emitting laser according to the third embodiment other than portions corresponding to a wavelength like an optical length of an optical cavity.

The inventors measured a threshold current and reliability concerning the 850 nm band surface emitting laser having a $\lambda$ cavity in which current confinement layers 1020a, 1020b, and 1020c were formed of selectively oxidized areas 1019b-1, 1019b-2, and 1019b-3, current injection areas 1019a-1, 1019a-2, and 1019a-3 in a mirror layer in a first round, a mirror layer in a third round, and a mirror layer in a fifth round, respectively, as shown in FIGS. 11A to 11C. As a result, it was found that there was a problem in reliability when the selectively oxidized area 1019b-1 was arranged in the mirror layer in the first round, and it was inappropriate to put the surface emitting laser to practical use. However, when the selectively oxidized area 1019b-2 was arranged in the mirror layer in the third round, the reliability was high and the threshold current had a low value. When the selectively oxidized area 1019b-3 was arranged in the mirror layer in the fifth round, the reliability could be secured but the threshold current showed a tendency of increase compared with the time when the selectively oxidized area 1019b-2 was arranged in the mirror layer in the third round. Since an increase in the threshold current was within an allowable range when the selectively oxidized area 1019b-3 was arranged in the mirror layer in the fifth round, concerning the 850-nm-band surface emitting laser, the inventors concluded that it was preferable to arrange a selectively oxidized area in the mirror layer in the third round or the fifth round.

In the 850-nm-band surface emitting laser used in the measurement, a film thickness of an upper cladding layer and film thicknesses of a low-refractive-index layer and a high-refractive-index layer are different from those in the surface emitting laser according to the third embodiment due to a difference of an emission wavelength. Therefore, in optimizing the position in the stacking direction of the selectively oxidized area 1019b in the third embodiment, a distance from the center of the active layer was taken into account concerning the measurement result. In the 850-nm-band surface emitting laser used for the measurement, a distance from the center of the active layer to a lower end of the mirror layer in the third round is 390 nanometers, and a distance from the center of the active layer to a lower end of the mirror layer in the fifth round is 660 nanometers. Taking these values into account, in the surface emitting laser according to the third embodiment, a mirror layer, in which the selectively oxidized area 1019b is arranged, is decided as a mirror layer having a lower end present in a range of 370 nanometers to 680 nanometers from the center of the active layer 1004.

In the third embodiment, the mirror layer in the first round is selected as a mirror layer suitable for this numerical value range. This is because the distance from the center of the active layer 1004 is 375 nm in the mirror layer in the first round. In addition, concerning a position in the mirror layer, when the selectively oxidized area 1019b is provided in the upper reflective layer as already explained, it is preferable that the selectively oxidized area 1019b is arranged near an upper surface of a low-refractive-index layer. Therefore, from these viewpoints, the position in the stacking direction of the selectively oxidized area 1019b is decided as a place shown in FIG. 10.

Next, from the viewpoint of realizing the single lateral mode oscillation, optimization of the width in the horizontal direction and the film thickness in the stacking direction of the selectively oxidized area 1019b will be explained one after another. Note that, since the width in the horizontal direction of the selectively oxidized area 1019b is determined by optimizing a diameter of the current injection area 1019a, optimization of the diameter of the current injection area 1019a will be hereinafter mainly explained.

First, optimization of the diameter of the current injection area 1019a depending upon the width of the selectively oxidized area 1019b will be explained. In general, it is possible to realize the single lateral mode oscillation by reducing the diameter of the current injection area 1019a. On the other hand, a problem occurs in that a threshold current increases due to a diffraction loss as the diameter of the current injection area 1019a decreases. Thus, it is necessary to increase the diameter of the current injection area 1019a to control the increase in a threshold current. Therefore, a relation of tradeoff is also established between the control of a threshold current and conditions under which the single lateral mode oscillation is possible, and there is an optimum value in the diameter of the current injection area 1019a.

Thus, concerning the 850 nm surface emitting laser, the inventors measured an oscillation lateral mode at the time when a diameter of a current injection area was changed and checked an optimum value of the diameter of the current injection area. More specifically, as shown in FIG. 11B, the inventors inserted a selectively oxidized area in the mirror layer in the third round, fixed a film thickness of the selectively oxidized area at 20 nanometers, and varied the diameter of the current injection area 1019a to measure a threshold current and a form of a lateral mode.

As a result of the measurement, it was found that a maximum value of the diameter of the current injection area, with which the single lateral mode oscillation was possible, was 3.5 micrometers. In addition, when the diameter was 3.5 micrometers, a value of the threshold current could be controlled to be within an allowable range. Note that an effective refractive index difference to be described later was 0.0165 in this surface emitting laser.

Based on this result, the inventors set a condition that the diameter of the current injection area 1019a of the surface emitting laser according to the third embodiment was 3.5 micrometers or more. This is because, the control of the increase in the threshold current has little correlation with an emission wavelength of the surface emitting laser, and when the threshold current is controlled to be within the allowable range in the 850-nm-band surface emitting laser, it is considered that the threshold current can also be controlled to be within the allowable range in the case of 1300 nanometers. However, the inventors thought that it was preferable to increase the diameter of the current injection area 1019*a* according to a ratio of the emission wavelength and considered an optimum value of the diameter of the current injection area 1019*a* was 5.3 micrometers calculated by multiplying 3.5 micrometers by (1300/850).

Next, under such conditions concerning the diameter of the current injection area 1019*a*, an optimum value of the film thickness of the selectively oxidized area 1019*b* necessary for realizing the single lateral mode oscillation will be examined. This is because not only the diameter of the current injection area 1019*a* but also the effective refractive index difference in the refractive index-guiding type waveguide affects the lateral mode oscillation. In the following explanation, first, the effective refractive index difference will be explained briefly and an optimum value of the effective refractive index difference will be derived, and then conditions for the film thickness of the selectively oxidized area 1019*b* necessary for realizing the optimum value will be derived.

Figure 12:
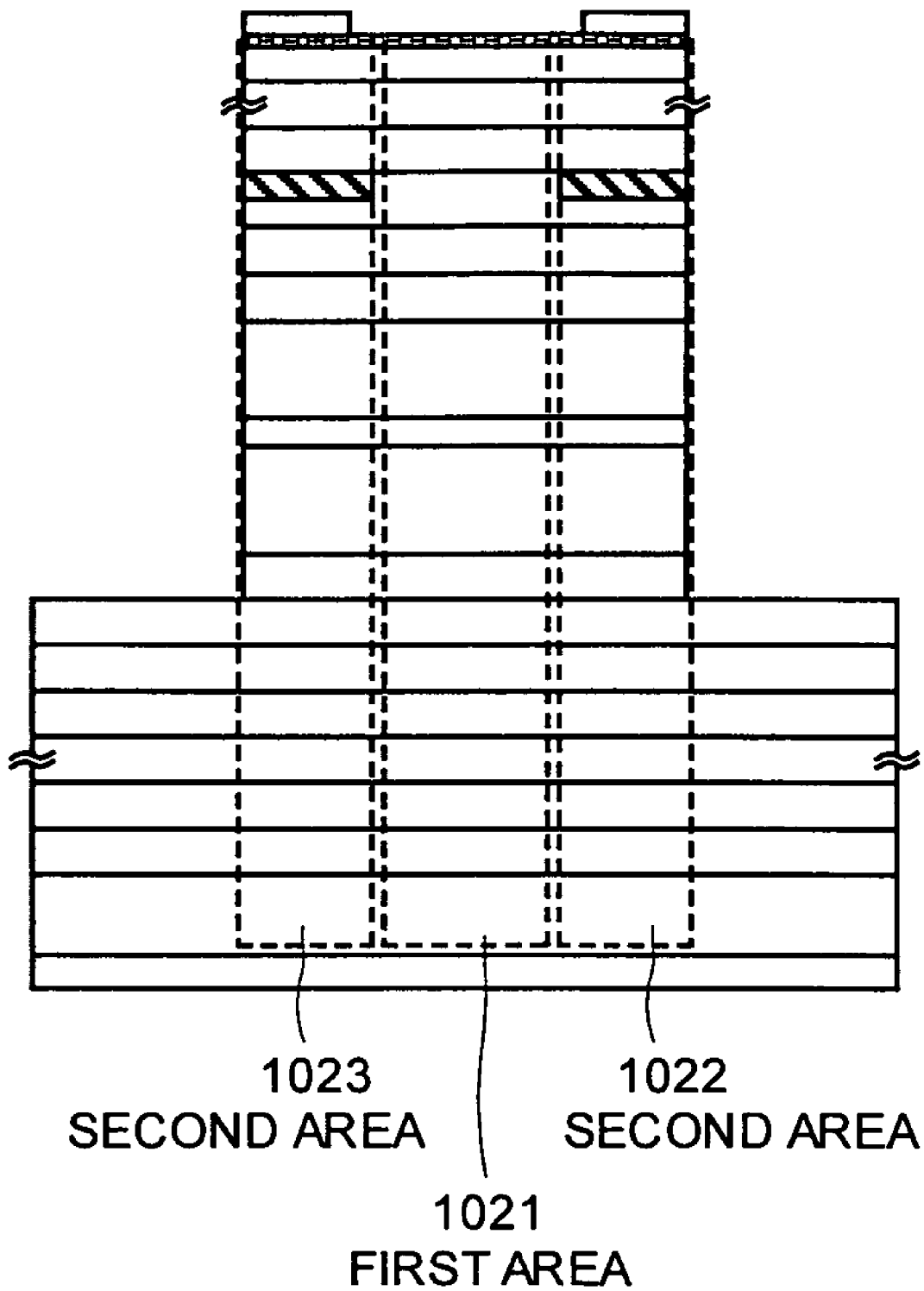
FIG. 12 is a schematic diagram for explaining an effective refractive index difference.

As described above, since the selectively oxidized area 1019*b* is present, the surface emitting laser according to the third embodiment includes the refractive index-guiding type waveguide. For example, as shown in FIG. 12, the refractive index-guiding type waveguide means a structure in which, due to an effective refractive index difference that is a difference of equivalent refractive indexes in a first area 1021, which is a stacking direction area including the current injection area 1019*a*, and second areas 1022 and 1023 including the selectively oxidized area 1019*b*, the first area 1021 functions as a waveguide. A structure of the refractive index-guiding type waveguide is explained by a refractive index distribution of the surface emitting laser. More specifically, the structure of the refractive index guiding wave guide and the lateral mode can be analyzed by equivalently replacing light confinement in the horizontal direction with a planar waveguide having the equivalent refractive indexes of the first area 1021 and the second areas 1022 and 1023 and evaluating the light confinement.

For example, in the surface emitting laser according to the third embodiment, a refractive index of the selectively oxidized area 1019*b* has a small value compared with a refractive index of AlAs forming the current injection area 1019*a*. Therefore, the equivalent refractive index of the second areas 1022 and 1023 has a value smaller than the equivalent refractive index of the first area 1021, and light generated from the active layer 1004 is guided through the first area 1021 and emitted to the outside. Since the structure of the refractive index-guiding type waveguide corresponds to the effective refractive index difference, which is a differential value between the equivalent refractive index of the first area 1021 and the equivalent refractive index of the second areas 1022 and 1023, a form of light guiding changes according to the effective refractive index difference.

It is known that a relation between a diameter $\Phi_c$ of the current injection area 1019*a*, with which the single lateral mode oscillation can be performed, and an effective refractive index difference $\Delta n$ is approximated as follows.

$$\Phi_c \propto 1/(\Delta n)^{1/2} \tag{1}$$

Therefore, the width in the horizontal direction and the film thickness of the selectively oxidized area 1019*b* in the surface emitting laser according to the third embodiment can be determined using the measurement result obtained about the 850 nm band surface emitting laser and expression (1).

First, a conditional expression for the effective refractive index difference $\Delta n$ at the time when the diameter of the current injection area 1019*a* is set to 3.5 micrometers at the minimum to control the increase in the threshold current is calculated as follows from the measurement result and expression (1).

$$\Phi_c(\lambda=1.3\,\mu m)/\Phi_c(\lambda=0.85\,\mu m)=\{1.3/(\Delta n)^{1/2}\}/\{0.85/(0.0165)^{1/2}\} \tag{2}$$

Here, since $\Phi_c$ ($\lambda=0.85\,\mu m$)=3.5 $\mu m$, if a value of the left part of expression (2) is 1 or more, the diameter of the current injection area 1019*a* is also 3.5 $\mu m$ or more in the surface emitting laser according to the third embodiment. When expression (2) is calculated for $\Delta n$, to satisfy the above condition, the effective refractive index difference $\Delta n$ only has to be equal to or less than 0.038. Since a value of the effective refractive index difference $\Delta n$ can be controlled by the film thickness of the selectively oxidized area 1019*b*, a maximum value of the film thickness of the selectively oxidized area 1019*b* can be calculated from this condition. In addition, it is preferable to set the effective refractive index difference $\Delta n$ to 0.0165 as in the measurement result for the 850 nm band surface emitting laser because the diameter of the current injection area 1019*a* increases to be 1.5 times as large according to a wave length ratio.

Here, it is possible to derive the film thickness of the selectively oxidized area 1019*b*, which is necessary for realizing the effective refractive index difference, by carrying out a calculation known to those skilled in the art taking into account the position in the stacking direction of the selectively oxidized area 1019*b*. As a conclusion, since the selectively oxidized area 1019*b* is arranged in the first mirror layer in the third embodiment, to reduce the effective refractive index difference $\Delta n$ to 0.038 or less, the film thickness of the selectively oxidized area 1019*b* only has to be set to 32 nanometers or less. In addition, the film thickness of the selectively oxidized area 1019*b* at the time when the effective refractive index difference is set to 0.0165 is 13 nanometers. Therefore, to realize the single lateral mode oscillation with the surface emitting laser according to the third embodiment, it is necessary to reduce the film thickness of the selectively oxidized area 1019*b* to 32 nm or less and, more preferably to 13 nanometers or less.

Next, a minimum value of the film thickness of the selective oxidized area 1019*b* will be examined. As described already, the selectively oxidized area 1019*b* is formed by stacking an AlAs layer once and then introducing oxygen atoms to selectively oxidize the AlAs layer in a moisture vapor atmosphere. Here, in forming the selectively oxidized area 1019*b*, if a film thickness of the AlAs layer is too thin, it becomes difficult to introduce oxygen atoms and to form the selectively oxidized area 1019*b*. It is considered that the film thickness of the selectively oxidized area 1019*b* at least required for introducing oxygen atoms is 6 nanometers. If the selectively oxidized area 1019*b* preferably has a film thickness of 10 nanometers or more, it is possible to perform the selective oxidation easily.

From the above discussion, a range of a film thickness d of the selectively oxidized area 1019*b*, which is required for controlling the threshold current to be low and realizing the single lateral oscillation mode is as follows.

$$6 \text{ nm} \leq d \leq 32 \text{ nm} \quad (3)$$

In addition, a preferable range of the film thickness d, with which the selective oxidation can be performed promptly and the diameter of the current injection area 1019a can be set large, is as follows $$10 \text{ nm} \leq d \leq 13 \text{ nm} \quad (4)$$

Since it is preferable that the selectively oxidized area 1019b has a thickness satisfying expression (4), in the third embodiment, the film thickness of the selectively oxidized area 1019b is set to 13 μm, and the diameter of the current injection area 1019a is set to 5.3 μm.

The inventors actually manufactured a surface emitting laser satisfying the above-mentioned conditions to check characteristics of the surface emitting laser. More specifically, an n-type GaAs buffer layer was stacked 0.1 μm on an n-type GaAs (100) surface substrate and 34.5 mirror layers consisting of n-type $Al_{0.9}Ga_{0.1}As$ and GaAs were stacked to form a lower reflective layer. In addition, an active layer included a triple QW layer, and an optical length of an optical cavity including the active layer was set to 2λ. Further, twenty-five mirror layers consisting of p-type $Al_{0.9}Ga_{0.1}As$ and GaAs were stacked to form an upper reflective layer. These semiconductor layers were grown by any one of a gas source MBE method, the MBE method, and the MOCVD method and doped with carbon (C) as a p-type impurity and silicon (Si) as an n-type impurity. An AlAs layer was arranged in an upper end of the $Al_{0.9}Ga_{0.1}As$ layer forming a lowermost mirror layer (a mirror layer in the first round) of the upper reflective layer, and a film thickness thereof was set to 12 nanometers. An outer diameter of a horizontal section of a part formed in a mesa shape was set to 40 μm. After forming the mesa, the AlAs layer was held in a moisture vapor atmosphere of 420° C. for twenty minutes to form a selectively oxidized area. A diameter of a current injection area formed by the AlAs layer, which was not oxidized, was set to 5.2 μm.

When oscillation characteristics was checked about the surface emitting laser manufactured in this way, a value of a threshold current was 0.5 microampere and slope efficiency was 0.25 W/A, and continuous oscillation was possible at 100° C. or more. In addition, if an injection current value was 10 microamperes or less, single lateral mode oscillation was possible. When an optical signal directly modulated at 10 Gbit/s was made incident in an optical fiber for transmission, a transmittable distance was 15 kilometers or more, and a satisfactory eye pattern of the optical signal was obtained after the optical signal was transmitted 15 kilometers.

Figure 13:
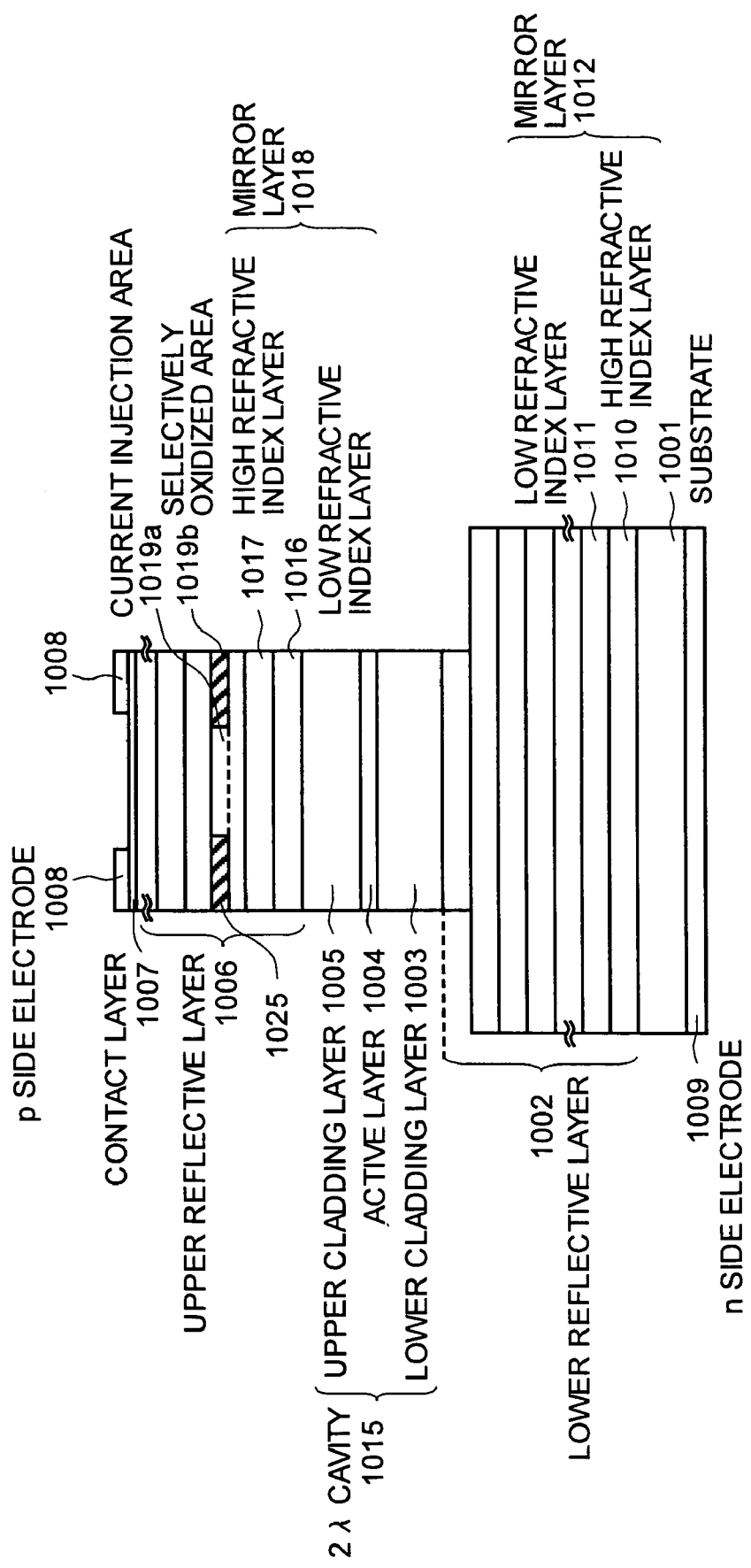
FIG. 13 is a sectional view of a structure of a surface emitting laser according to a modification of the third embodiment.

Next, a structure of a surface emitting laser according to a modification of the third embodiment will be explained. FIG. 13 is a sectional view showing the structure of the surface emitting laser according to the modification. Although the mirror layer, in which the selectively oxidized area 1019b is arranged is the mirror layer in the first round in the third embodiment, it is also possible to arrange the selectively oxidized area 1019b in the mirror layer in the second round. This is because, since a distance from the center to the lower end of the active layer 1004 is 580 nanometers in the mirror layer in the second round, the distance is included in the numerical value range of 370 nanometers to 680 nanometers defined for a position in the stacking direction, and the securing of reliability and the control of the threshold current are possible.

Since the mirror layer, in which the selectively oxidized area 1019b is arranged, is the mirror layer in the second round, to maintain a diameter of the current injection area 1019a and maintain an effective refractive index difference, a film thickness of the selectively oxidized area 1019b changes. This is because equivalent refractive indexes also change according to the position in the stacking direction of the selectively oxidized area 1019b. As a result of calculation, the diameter of the current injection area 1019a is 3.5 μm or more, a range of the film thickness d, with which selective oxidation is possible, is calculated as follows, $$6 \text{ nm} \leq d \leq 46 \text{ nm} \quad (5)$$

the diameter of the current injection area 1019a is 5.3 μm or more, and a range of the film thickness d, with which selective oxidation is possible sufficiently, is calculated as follows $$10 \text{ nm} \leq d \leq 20 \text{ nm} \quad (6)$$

Figure 14:
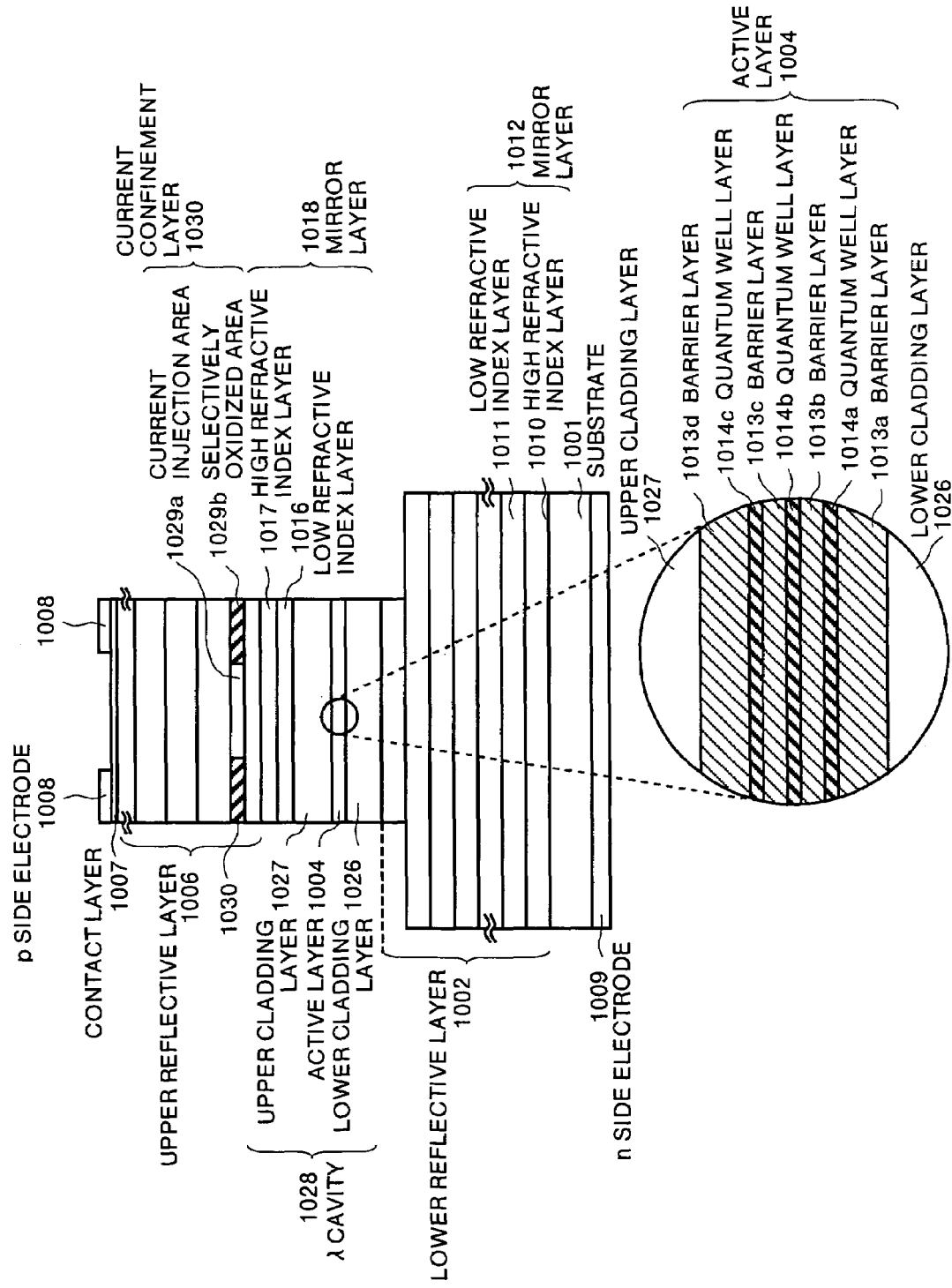
FIG. 14 is a sectional view of a structure of a surface emitting laser according to a fourth embodiment of the invention.

Next, a surface emitting laser according to a fourth embodiment of the invention will be explained. As shown in FIG. 14, the surface emitting laser according to the fourth embodiment has an emission wavelength of 1300 nanometers and has a λ cavity structure in which an optical length of an optical cavity formed of an active layer and an upper cladding layer is equal to a wavelength of emitted light. More specifically, the surface emitting laser according to the fourth embodiment has a structure in which the lower reflective layer 1002 is stacked on the substrate 1001. An upper area of the lower reflective layer 1002 is formed in a mesa shape, and a lower cladding layer 1026, the active layer 1004, an upper cladding layer 1027, and the upper reflective layer 1006 are sequentially stacked on the area formed in the mesa shape. Note that the mesa shape is formed such that a horizontal sectional shape thereof is circular. Moreover, the contact layer 1007 is stacked on the upper reflective layer 1006, and the p side electrode 1008 formed in an annular shape including a current injection area is arranged in the center on the contact layer 1007, and the n side electrode 1009 is arranged on a lower surface of the substrate 1001. In the upper cladding layer 1027, a current confinement layer 1030, which consists of a current injection area 1029a arranged near the mesa center and having a circular shape in a horizontal section and a selectively oxidized area 1029b provided adjacent to the current injection area 1029a, is arranged. Note that, in the fourth embodiment, portions denoted by reference numerals identical with or similar to those in the third embodiment have the identical or similar structures and show the identical or similar functions unless specifically noted otherwise.

In the fourth embodiment, an optical length of a λ cavity 1028 formed of the lower cladding layer 1026, the active layer 1004, and the upper cladding layer 1027 is equal to a wavelength of emitted light. Therefore, a position in a stacking direction and an optimum value of a film thickness of the selectively oxidized area 1029b are different from those in the third embodiment. Optimization of the selectively oxidized area 1029b of the surface emitting laser having the emission wavelength of 1300 nanometers and having the λ cavity 1028 will be hereinafter explained.

First, optimization of the position in the stacking direction of the selectively oxidized area 1029b will be explained. In the third embodiment, the inventors found that it is preferable to arrange the selectively oxidized area 1029b in a mirror layer, an end facet on the active layer side of which is present in a range of 370 nanometers to 680 nanometers from the center of the active layer 1004. In the fourth embodiment, it is necessary to determine an appropriate mirror layer taking into account a difference of an optical length of the λ cavity 1028, and a mirror layer in a second round is selected as the appropriate mirror layer. This is because a distance from the center of the active layer 1004 to the mirror layer in the second round is 392 nanometers, which meets the above-mentioned condition. In addition, as in the third embodiment, in the mirror layer of the second round, it is preferable to arrange the selectively oxidized area 1029b is arranged on a far side from an active layer of a low-refractive-index layer. Consequently, the position in the stacking direction of the selectively oxidized area 1029b is determined to be a position shown in FIG. 14.

Next, optimization of the diameter of the current injection area 1029a defined by a width in a horizontal direction of the selectively oxidized area 1029b will be explained. As explained in the third embodiment, the diameter of the current injection area 1029a is decided from the viewpoint of controlling an increase in a threshold current and realizing single lateral mode oscillation and is determined irrespective of an optical length of an optical cavity. Therefore, the same discussion as the third embodiment is established. From the measurement result for the 850 nm band surface emitting laser, the diameter of the current injection area 1029a is required to be 2.5 μm or more, and when a wavelength ratio is taken into account, it is preferable that the diameter is 5.3 μm.

Lastly, optimization of the film thickness of the selective oxidized area 1029b will be explained. From the viewpoint of realizing the single lateral mode oscillation, the relation of expression (1) is established between the effective refractive index difference of the first area 1021 and the second areas 1022 and 1023 shown in FIG. 12 and the diameter of the current injection area 1029a. As conditions under which the single lateral mode oscillation is possible with the diameter of the current injection area 1029a of 3.5 μm or more, the effective refractive index difference is required to be 0.038 or less. To realize the single lateral mode oscillation when the diameter of the current injection area 1029a is 5.3 μm, the effective refractive index difference is 0.0165.

Figure 15:
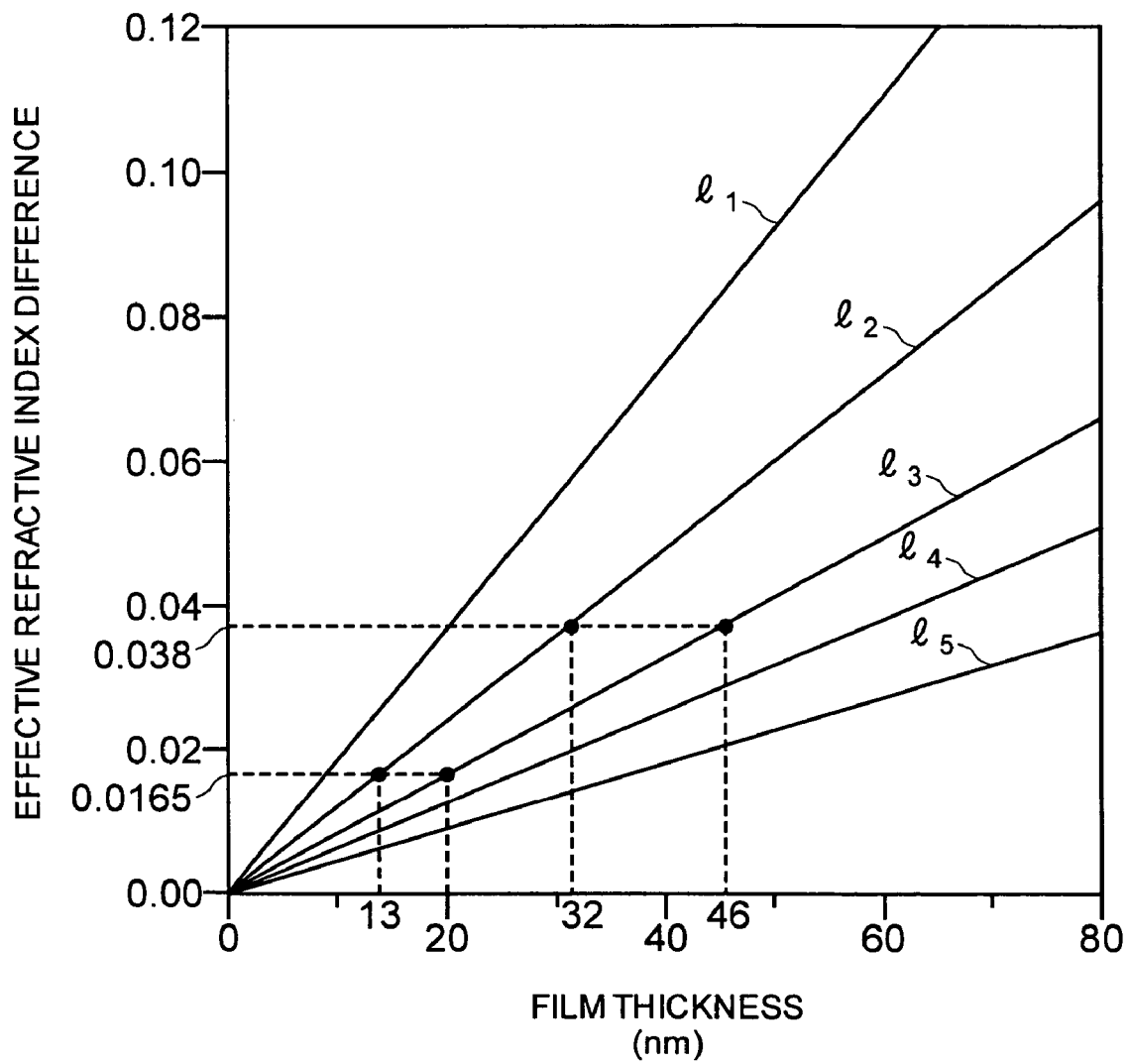
FIG. 15 is a graph showing a relation between a film thickness of a selectively oxidized area and an effective refractive index difference for each mirror layer in which the selectively oxidized area is arranged.

In determining the film thickness of the selectively oxidized area 1029b necessary for realizing such an effective refractive index difference, a graph shown in FIG. 15 is used in the fourth embodiment. FIG. 15 is a graph showing, concerning a surface emitting laser having a λ cavity, a relation between a film thickness of a selectively oxidized area and an effective refractive index difference for each mirror layer in which the selectively oxidized area is arranged (K. D. Choquette et al., Proceedings of SPIE Vertical-Cavity Surface-Emitting Lasers, vol. 3003, pp. 194-200, 1997). In FIG. 15, a curve $I_1$ indicates a case in which the selectively oxidized layer is arranged in a first round, and curves $I_2$, $I_3$, $I_4$, and $I_5$ indicate cases in which the selectively oxidized layer is arranged in mirror layers in a second round, a third round, a fourth round, and a fifth round, respectively. A horizontal axis of the graph indicates a film thickness of the selectively oxidized area, and a vertical axis of the graph indicates an effective refractive index difference.

In the surface emitting laser according to the fourth embodiment, since the selectively oxidized area 1029b is arranged in the mirror layer in the second round, the curve $I_2$ will be referred to in the graph in FIG. 15. Referring to the curve $I_2$, it is seen that the film thickness is required to be 32 nanometers or less such that the effective refractive index difference is 0.038 or less. In addition, it is seen that the film thickness is 13 nanometers such that the effective refractive index difference is 0.0165.

The same discussion as the third embodiment is established concerning a minimum value of the film thickness. As a result, a range of a film thickness d of the selectively oxidized area 1029b necessary for realizing the single lateral oscillation mode while controlling a threshold current to be low is as follows $$6 \text{ nm} \leq d \leq 32 \text{ nm} \quad (7)$$

A preferable range of the film thickness d, with which selective oxidation can be performed promptly and the diameter of the current injection area 1029a can be increased, is as follows $$10 \text{ nm} \leq d \leq 13 \text{ nm} \quad (8)$$

The structure of the selectively oxidized area 1029b is optimized as described above in the surface emitting laser according to the fourth embodiment.

Figure 16:
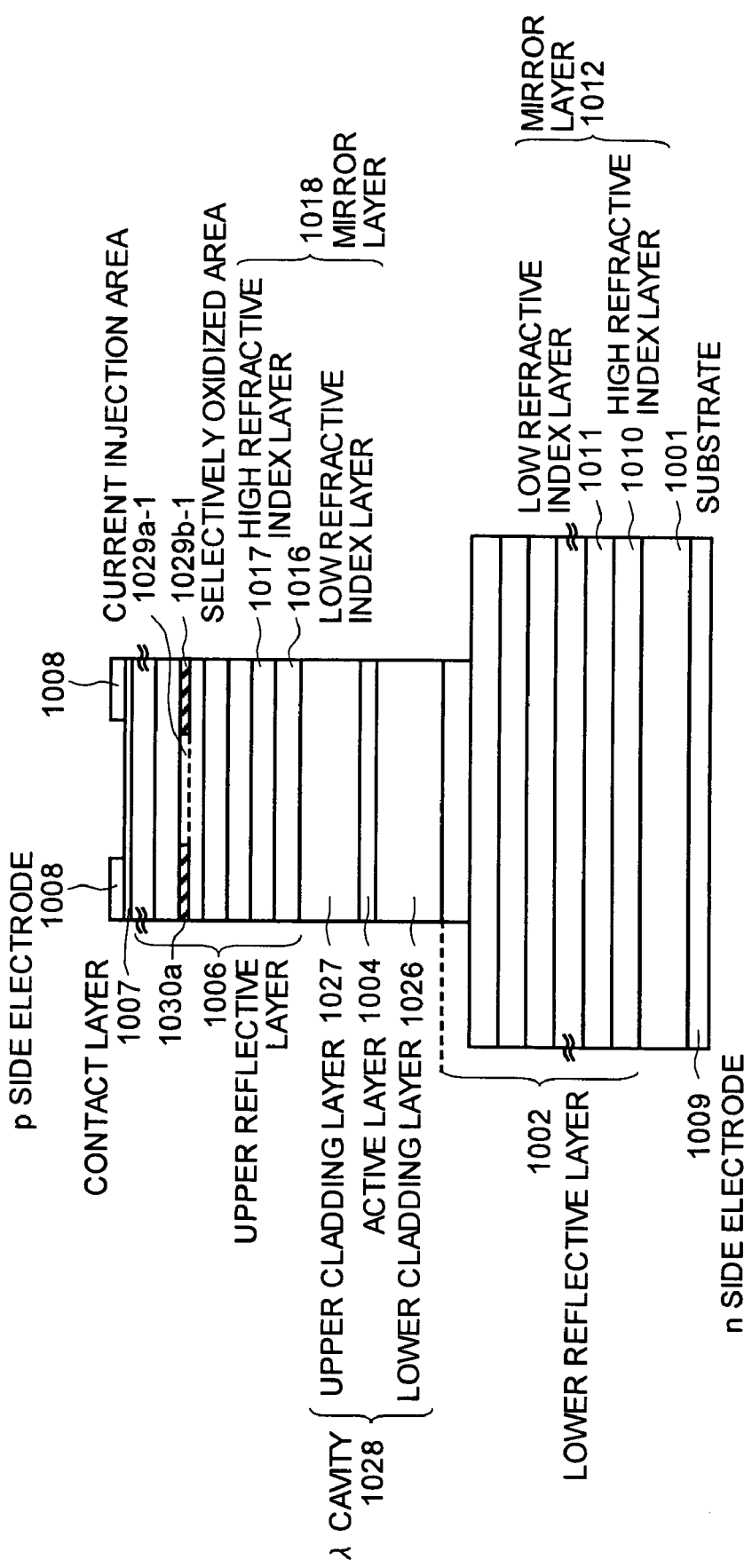
FIG. 16 is a sectional view of a structure of a surface emitting laser according to a modification of the fourth embodiment.

Next, a surface emitting laser according to a modification of the fourth embodiment will be explained. FIG. 16 is a sectional view of a structure of the surface emitting laser according to the modification. The modification is different from the fourth embodiment in that the selectively oxidized area 1029b is arranged in a mirror layer in a third round.

As described already, in the fourth embodiment, it is also possible to arrange the selectively oxidized area 1029b in the mirror layer, a lower end of which is present in the range of 370 nanometers to 680 nanometers from the center of the active layer 1004. It is seen that, when an emission wavelength is 1300 nanometers and an optical length of an optical cavity is equal to a wavelength of emitted light, a lower end of the mirror layer in the third round is spaced apart from the center of the active layer 1004 by 596 nanometers and is included in the above-mentioned range. Therefore, it is possible to adopt a structure in which the selectively oxidized area 1029b-1 is arranged in the mirror layer in the third round.

The conditions for the diameter of the current injection area 1029a-1 and the effective refractive index difference can be considered the same as those in the surface emitting laser according to the fourth embodiment. As a conclusion, it is necessary to set the diameter of the current injection area 1029a-1 to 3.5 μm or more, preferably 5.3 μm, and set the effective refractive index difference to 0.038 or less, preferably 0.0165.

A film thickness satisfying the effective refractive index difference will be examined with reference to the graph shown in FIG. 15. Since the selectively oxidized area 1029b-1 is arranged in the mirror layer in the third round in the surface emitting laser according to the modification, it is necessary to refer to the curve 13 in the figure. According to the curve 13, the film thickness is required to be 46 nanometers or less such that the effective refractive index difference is 0.038 or less and is required to be 20 nanometers such that the effective refractive index difference is 0.0165. Here, the optimization of the structure of the selectively oxidized area 1029b-1 according to the modification ends.

Note that the surface emitting laser according to the invention has been explained using the third embodiment and the fourth embodiment and the modifications thereof. However, it is also possible to adopt structures other than those explained above. For example, in the third embodiment and the fourth embodiment and the modifications thereof, the emission wavelength of the surface emitting laser is 1300 nanometers. The invention is not limited to this, and optimization of a structure of a selectively oxidized area is also possible for a surface emitting laser having a long wavelength equal to or longer than 850 nanometers. This will be hereinafter explained.

First, concerning a position of the selectively oxidized area in a mirror layer, regardless of an emission wavelength, it is preferable to arrange the selectively oxidized area near an interface on a far side viewed from an active layer of a low-refractive-index layer. It is determined in which mirror layer the selectively oxidized area is arranged from the viewpoint of controlling an increase in a threshold current and securing reliability. These viewpoints have little correlation with the emission wavelength. Further, a diameter of the current injection area is also derived from the measurement result concerning the 850 nm surface emitting laser. As described above, the measurement result is used irrespective of the emission wavelength. Concerning a film thickness of the selectively oxidized area, a film thickness for realizing a necessary effective refractive index difference only has to be derived by a known method. Therefore, concerning a surface emitting laser with a long wavelength of 850 nanometers or more, optimization of the structure of the selectively oxidized area can be performed using the method described in the third embodiment or the fourth embodiment. Note that, due to the same reason, optimization of the structure of the selectively oxidized area can be performed for a surface emitting laser including an optical cavity of a different optical wavelength. Here, concerning the position in the stacking direction of the selectively oxidized area is set in a range of 370 nanometers to 680 nanometers from the center of the active layer. However, concerning a position of the selectively oxidized area itself, it is preferable to set an upper limit of a distance from the center of the active layer to 780 nanometers taking into account a film thickness of the low-refractive-index layer forming the mirror layer.

Other than using carbon as a p-type impurity, zinc (Zn) or beryllium (Be) can be used. The same holds true for an n-type impurity, and a dopant other than silicon may be used.

As a semiconductor material forming the selectively oxidized area and the current injection area, AlAs is used. Other than AlAs, it is possible to perform selective oxidation using $Al_xGa_{1-x}As$ ($0.97 \leq x<1$) and form a current injection area.

Concerning the mirror layers forming the upper reflective layer and the lower reflective layer, when the low-refractive-index layer is formed of $Al_xGa_{1-x}As$ ($0.5 \leq x \leq 1$) and the high-refractive-index layer is formed of $Al_xGa_{1-x}As$ ($0 \leq x \leq 0.2$), the low-refractive-index layer and the high-refractive-index layer can reflect light of the emission wavelength and function as mirror layers. In addition, an inclined composition layer for mitigating a refractive index difference of the low-refractive-index layer and the high-refractive-index layer may be arranged near a boundary surface of the low-refractive-index layer and the high-refractive-index layer.

Concerning the substrate, when an InP substrate, a GaInAs substrate, or the like is used other than the GaAs substrate, it is also possible to realize the surface emitting laser according to the invention.

Concerning the active layer, instead of the structure consisting of the triple QW layer and the barrier layers separating the QW layers, the active layer may be formed of a single QW layer or may have QW layers of other numbers. In addition, it is possible to form the QW layer with a GaInAs or GaAsSb semiconductor material. A quantum dot formed of (Ga)InAs or the like may be adopted instead of the QW layer. Further, a surface emitting laser of a double hetero structure may be simply adopted.

Concerning the semiconductor material forming the surface emitting laser, it is possible to reverse a conduction type. For example, the substrate, the lower cladding layer, and the lower reflective layer may be formed of a p-type semiconductor, and the upper reflective layer and the upper cladding layer may be formed of an n-type semiconductor.

Moreover, it is preferable to arrange the current confinement layer consisting of the selectively oxidized area and the current injection layer in a p-type reflective layer. However, the discussion is established even if the current confinement layer is arranged in an n-type reflective layer, and the current confinement layer can show the equivalent effects.

Figure 17:
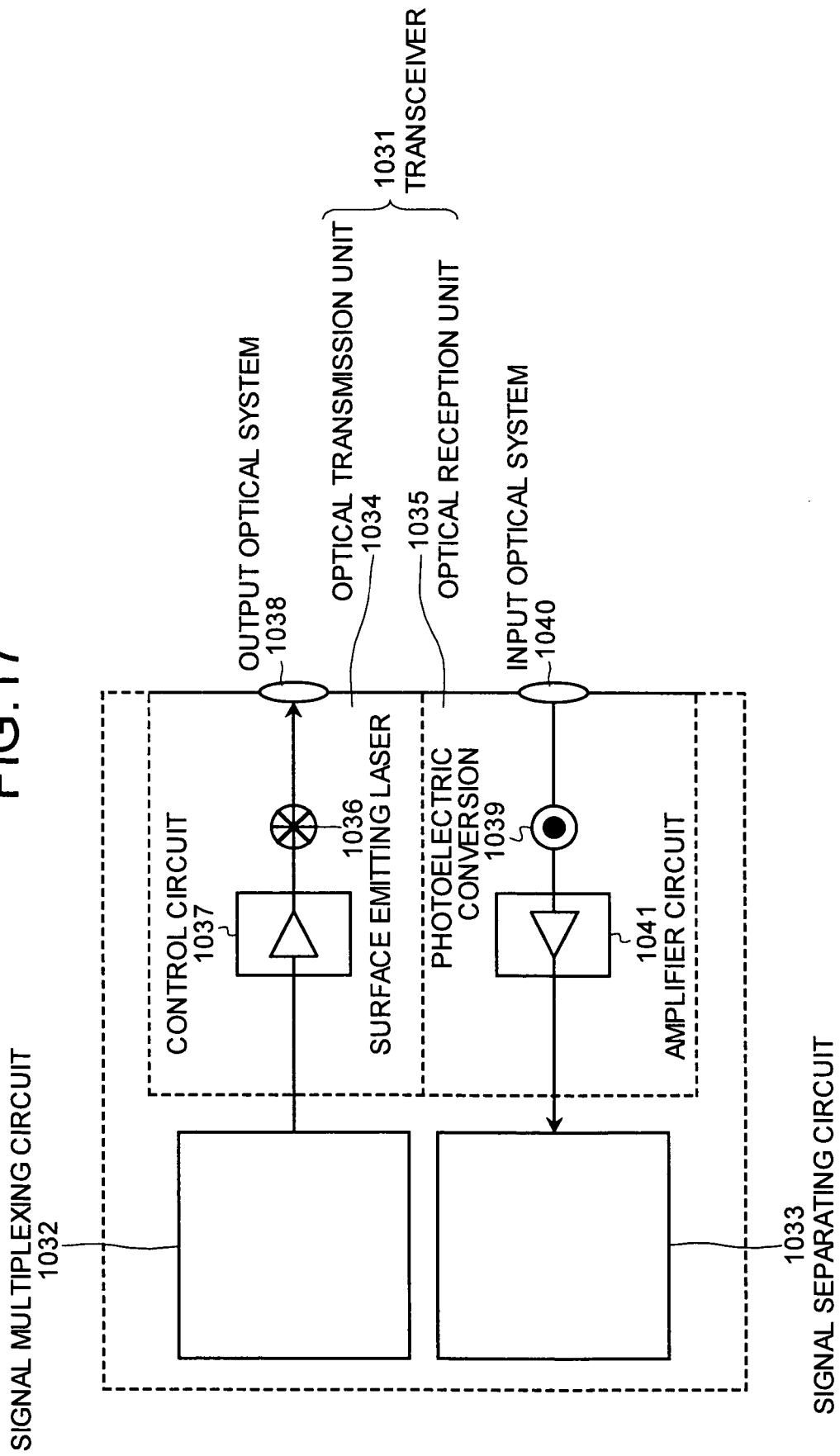
FIG. 17 is a block diagram of a structure of an optical transceiver according to a fifth embodiment of the invention.

Next, an optical transceiver according to a fifth embodiment of the invention will be explained. FIG. 17 is a block diagram of a structure of the optical transceiver according to the fifth embodiment. The optical transceiver according to the fifth embodiment includes a transceiver 1031 that has an optical transmitting unit 1034 and an optical receiving unit 1035 for transmitting and receiving an optical signal, a signal multiplexing circuit 1032 that inputs an electric signal to the transceiver 1031, and a signal separating circuit 1033 that separates an electric signal obtained from an optical signal received by the transceiver 1031.

The optical transmitting unit 1034 is a unit for converting an electric signal inputted from the signal multiplexing circuit 1032 into an optical signal and transmitting the optical signal. More specifically, the optical transmitting unit 1034 includes a surface emitting laser 1036 that emits an optical signal, a control circuit 1037 that controls the surface emitting laser 1036 based on the inputted electric signal, and an output optical system 1038 for outputting the optical signal emitted from the surface emitting laser 1036 to the outside.

As the surface emitting laser 1036 included in the optical transmitting unit 1034, the surface emitting laser according to the third embodiment or the fourth embodiment is used. Therefore, the surface emitting laser 1036 has a low threshold current and high reliability and can perform single lateral mode oscillation.

The optical receiving unit 1035 is a unit for converting an optical signal received from the outside into an electric signal and outputting the electric signal to the signal separating circuit 1033. More specifically, the optical receiving unit 1035 includes a photoelectric conversion element 1039 for receiving an optical signal and converting the optical signal into an electric signal, an input optical system 1040 for guiding the optical signal to the photoelectric conversion element 1039, and an amplifier circuit 1041 that amplifies the electric signal outputted from the photoelectric conversion element 1039. The photoelectric conversion element 1039 outputs an electric signal based on intensity of the received optical signal. As the photoelectric conversion element 1039, it is possible to use a photoresistor and the like other than a photodiode.

The signal multiplexing circuit 1032 is a circuit for multiplexing plural electric signals inputted from the outside into one electric signal. The one electric signal obtained by multiplexing the electric signals is outputted to the optical transmitting unit 1034 constituting the transceiver 1031.

The signal separating circuit 1033 is a circuit for separating an electric signal obtained from the optical receiving unit 1035 constituting the transceiver 1031 into plural electric signals. This is because, since an optical signal received by the optical receiving unit 1035 originally includes plural signals, to extract information, it is necessary to separate an electric signal obtained by subjecting the optical signal to photoelectric conversion into plural electric signals.

Operations of the optical transceiver according to the fifth embodiment will be explained. The optical transceiver according to the fifth embodiment is an optical transceiver for transmitting and receiving plural electric signals. A transmission operation will be explained in the first place.

First, plural electric signals inputted from the outside are converted into a single electric signal by the signal multiplexing circuit 1032. Then, this single electric signal is inputted to the control circuit 1037 from the signal multiplexing circuit 1032, and the control circuit 1037 controls a current to be injected into the surface emitting laser 1036 based on this electric signal. More specifically, an optical signal having a waveform corresponding to an electric signal waveform is emitted from the surface emitting laser 1036 by the control circuit 1037. Note that, since the surface emitting leaser element 1036 consists of the surface emitting laser according to the third embodiment or the fourth embodiment, direct optical modulation is possible at 10 Gbit/s at the maximum. Therefore, it is possible to add a large amount of information to an optical signal to transmit the optical signal. The optical signal outputted from the surface emitting laser 1036 is outputted to the outside via the output optical system 1038. Here, the transmission operation ends.

Next, a reception operation will be explained. An optical signal transmitted from the outside is made incident in the optical transceiver via the input optical system 1040 and received by the photoelectric conversion element 1039. The photoelectric conversion element 1039 has a function of outputting an electric signal having a waveform corresponding to a change in intensity of the received optical signal. The converted electric signal is inputted to the amplifier circuit 1041. Since intensity of the optical signal inputted from the outside is generally feeble, intensity of the electric signal outputted from the photoelectric conversion element 1039 is also feeble and is amplified by the amplifier circuit 1041. Thereafter, the amplified electric signal is inputted to the signal separating circuit 1033 and separated into plural electric signals. Here, the reception operation ends.

The optical transceiver according to the fifth embodiment has the surface emitting laser according to the third embodiment or the fourth embodiment. Therefore, in the fifth embodiment, the surface emitting laser 1036 has a low value of a threshold current and has high reliability. In addition, direct modulation is possible at 10 Gbit/s, which makes it possible to output an optical signal having a large amount of information. Moreover, when an outputted optical signal is transmitted by an optical fiber, a transmittable distance is 15 kilometers or more, which makes it possible to perform long distance transmission.

Figure 18:
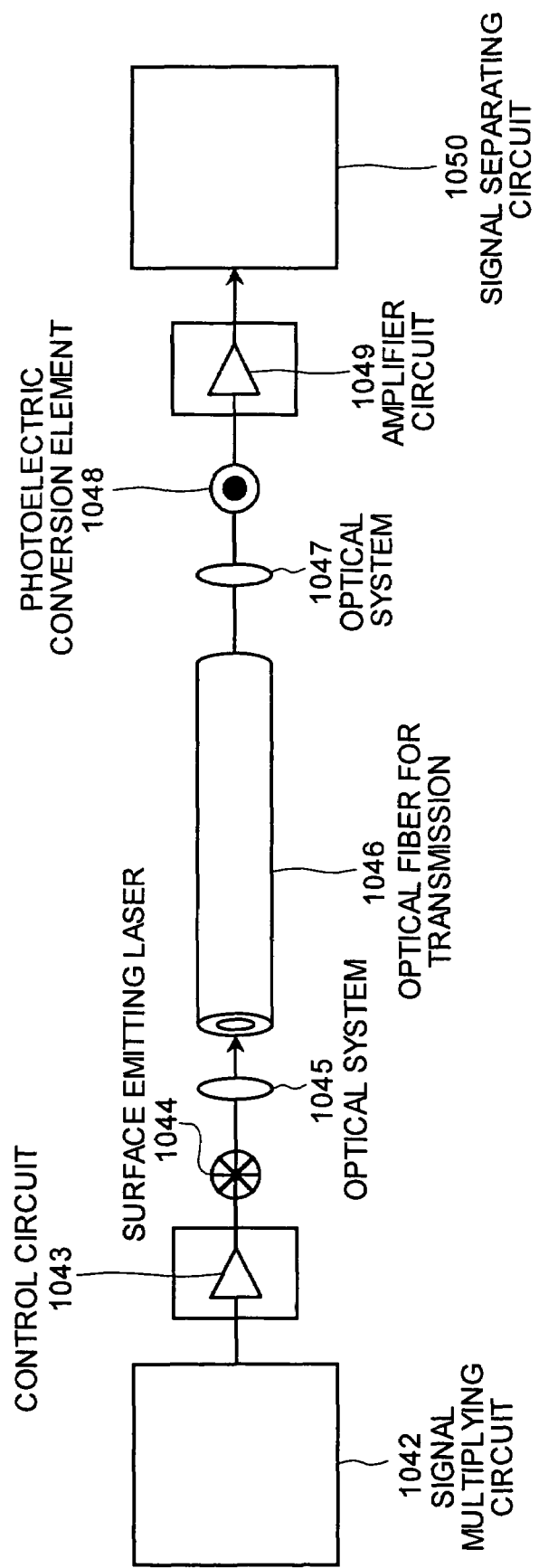
FIG. 18 is a block diagram of a structure of an optical communication system according to a sixth embodiment of the invention.
Figure 19:
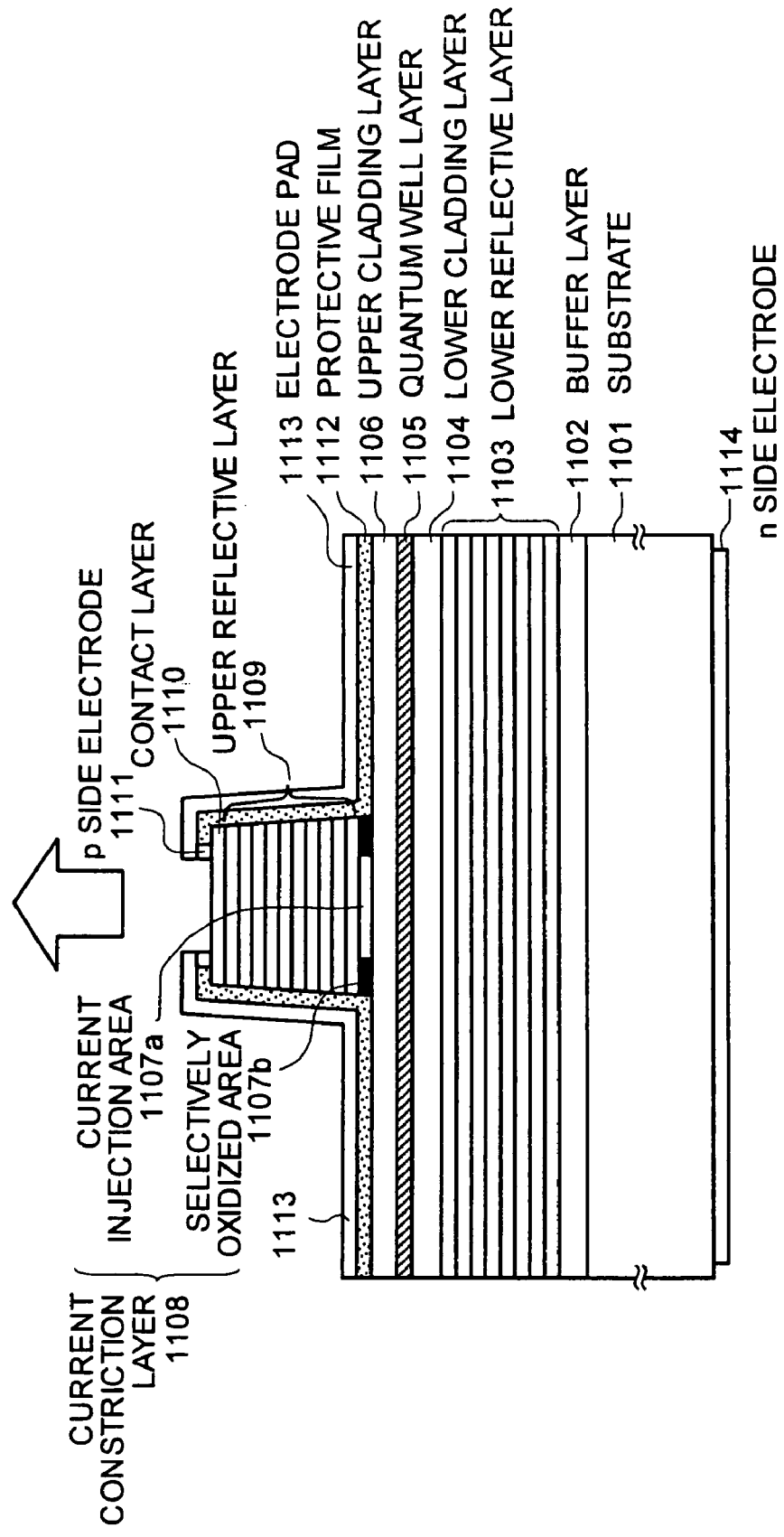
FIG. 19 is a sectional view of a structure of a conventional surface emitting laser.

Next, an optical communication system according to a sixth embodiment of the invention will be explained. FIG. 18 is a schematic diagram of a structure of the optical communication system according to the sixth embodiment. The optical communication system according to the sixth embodiment uses the surface emitting laser according to the third embodiment or the fourth embodiment as a signal light source. More specifically, the optical communication system according to the sixth embodiment includes a signal multiplexing circuit 1042, a control circuit 1043 connected to the signal multiplexing circuit 1042, a surface emitting laser 1044 connected to the control circuit 1043, an optical fiber for transmission 1046, and an optical system 1045 for optically combining the surface emitting laser 1044 and an end of the optical fiber for transmission 1046. In addition, the optical communication system further includes an photoelectric conversion element 1048 optically combined with the other end of the optical fiber for transmission 1046 via the optical system 1047, an amplifier circuit 1049 connected to the photoelectric conversion element 1048, and a signal separating circuit 1050 connected to the amplifier circuit 1049.

The single electric signal obtained by the signal multiplexing circuit 1042 is inputted to the control circuit 1043. The control circuit 1043 controls a current, which is injected into the surface emitting laser 1024, based on this electric signal. Consequently, an optical signal outputted from the surface emitting laser 1044 has a waveform corresponding to an electric signal obtained by the signal multiplexing circuit 1042. The optical signal outputted from the surface emitting laser 1044 is made incident in an end of the optical fiber for transmission 1046 via the optical system 1045 and transmitted through the optical fiber for transmission 1046.

Then, the optical signal transmitted through the optical fiber for transmission 1046 is emitted from the other end of the optical fiber for transmission 1046 and is made incident in the photoelectric conversion element 1048 via the optical system 1047. The photoelectric conversion element 1048 outputs an electric signal based on the received optical signal. The electric signal is amplified by the amplifier circuit 1049 and then inputted to the signal separating circuit 1050.

The signal separating circuit 1050 separates the inputted electric signal into individual electric signals before being multiplexed by the signal multiplexing circuit 1042 and restores information. In this way, the optical communication system according to the sixth embodiment transmits the information.

In the optical communication system according to the sixth embodiment, the surface emitting laser according to the third embodiment or the fourth embodiment is used as a signal light source on a transmission side. Therefore, it is possible to use a signal light source having a low threshold value and high reliability. In addition, since the single lateral mode oscillation is possible, a signal waveform is not broken in the course of transmission, and an optical signal can be transmitted surely. More specifically, it is possible to transmit an optical signal directly modulated at 10 Gbit/s even if a fiber length of the optical fiber for transmission 1046 is set to 15 km or more.

Since the surface emitting laser according to the third embodiment or the fourth embodiment can change an emission wavelength in the range of 850 nanometers to 1650 nanometers, it is possible to select a wavelength at which a loss is reduced in the optical fiber for transmission 1046. In addition, the surface emitting laser also has an advantage that an existing optical communication system can be used in these wavelength bands. For example, it is also possible that the emission wavelength is set to 980 nanometers and an erbium doped fiber amplifier (EDFA) is arranged in the optical fiber for transmission 1046. In this case, since intensity of an optical signal can be amplified by the EDFA, a transmission distance can be further extended. Similarly, a thulium doped fiber amplifier (TDFA), a Raman amplifier, or the like may be used.

Next, exemplary embodiments of the surface emitting laser according to the invention, and the optical transceiver, the optical communication device, and the optical communication system using the surface emitting laser will be explained with reference to the drawings. In the drawings, identical or similar portions are denoted by identical or similar reference numerals and signs. In addition, it should be noted that the drawings are schematic, and a relation among thicknesses and widths of respective layers and a ratio of the respective layers are different from actual ones. It is needless to mention that a relation of dimensions and a ratio of the dimensions are different in some portions among the drawings.

Figure 20:
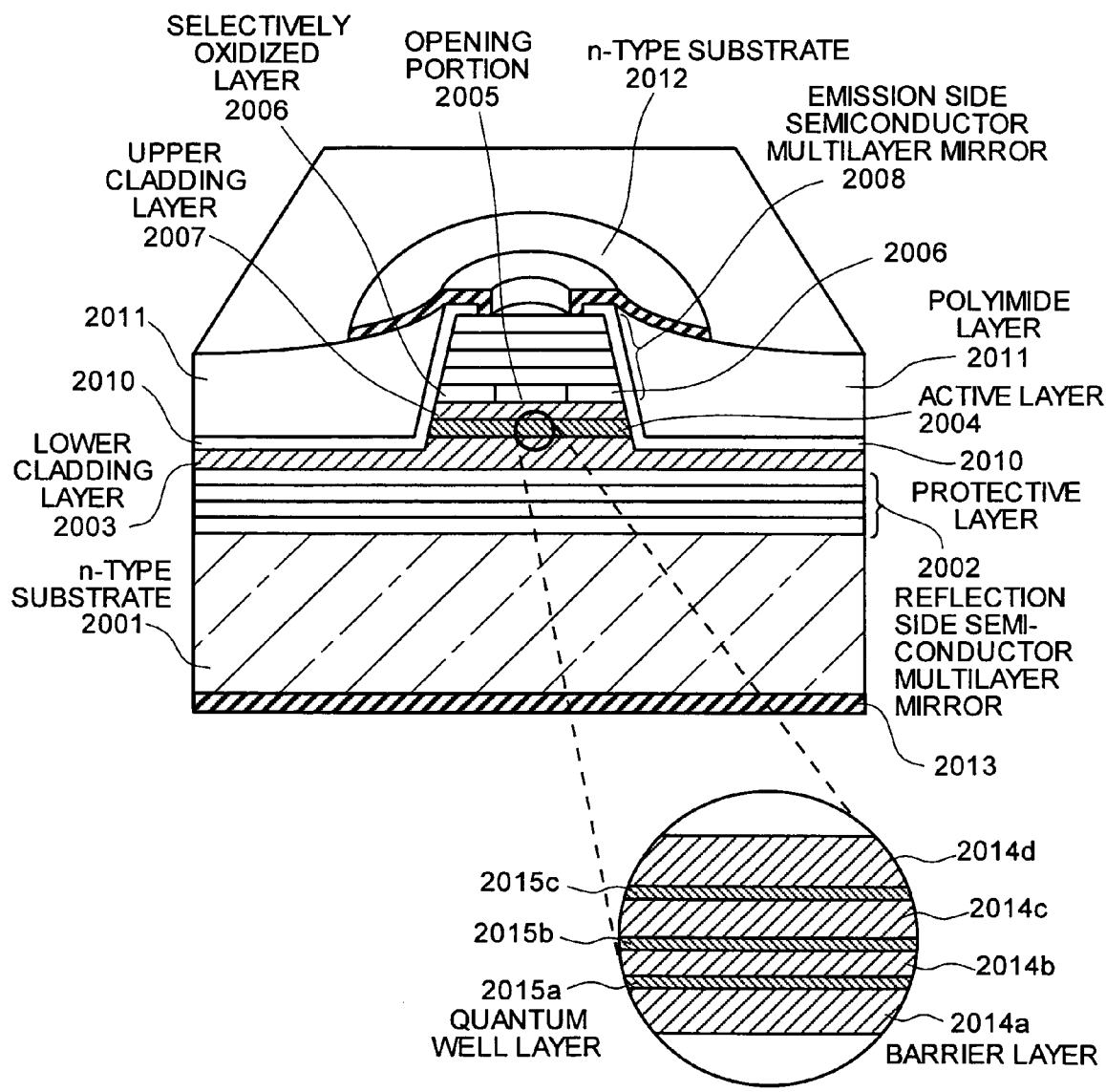
FIG. 20 is a sectional bird's eye view of a structure of a surface emitting element according to a seventh embodiment of the invention.

First, a surface emitting laser according to a seventh embodiment of the invention will be explained. FIG. 20 is a sectional bird's eye view of a structure of the surface emitting laser according to the seventh embodiment. In the surface emitting laser according to the seventh embodiment, reduction of a threshold current value and improvement of slope efficiency are performed by optimizing structures of a reflection-side semiconductor-multilayer-mirror and an emission-side semiconductor-multilayer-mirror. A specific structure of the surface emitting laser will be explained with reference to FIG. 20.

In the surface emitting laser according to the seventh embodiment, a reflection-side semiconductor-multilayer-mirror 2002, a lower cladding layer 2003, an active layer 2004, an upper cladding layer 2007, and an emission-side semiconductor-multilayer-mirror 2008 are sequentially stacked on an n-type substrate 2001. In the emission-side semiconductor-multilayer-mirror 2008, the surface emitting laser also includes an opening portion 2005 and a selectively oxidized layer 2006 arranged around the opening portion 2005. An upper area of the lower cladding layer 2003 and semiconductor layers stacked above the lower cladding layer 2003 are formed in a mesa-post shape. The entire mesa-post shaped area and the entire upper surface of the lower cladding layer 2003 are covered by a protective layer 2010 except a part of an upper surface of the emission-side semiconductor-multilayer-mirror 2008. A polyimide layer 2011 is arranged at a periphery of the mesa-post shaped area, and a p side electrode 2012, which includes an opening portion and is in contact with an exposed part of the upper surface of the semiconductor multilayer mirror 2008, is arranged in the center of the mesa-post shaped area. In addition, an n side electrode 2013 is arranged on a lower surface of the n-type substrate 2001. Note that the n-type substrate 2001 is formed of GaAs having a conduction type of an n-type.

The lower cladding layer 2003 and the upper cladding layer 2007 are stacked to vertically sandwich the active layer 2004 and form an optical cavity together with the active layer 2004. In the seventh embodiment, it is assumed that an optical length of the optical cavity is equal to the emission wavelength. However, the optical cavity may have other optical lengths like a value twice as large as the emission wavelength. The lower cladding layer 2003 is formed of n-type GaAs, and the upper cladding layer 2007 is formed of p-type GaAs. Note that it is preferable that the lower cladding layer 2003 and the upper cladding layer 2007 have film thicknesses for realizing a substantially equal optical length such that an antinode of a standing wave in the cavity coincides with the part of the active layer 2004.

The active layer 2004 has a structure including multiple QW layers. More specifically, the active layer 2004 is formed of a barrier layer 2014a, a QW layer 2015a, a barrier layer 2014b, a QW layer 2015b, a barrier layer 2014c, a QW layer 2015c, and a barrier layer 2014d that are stacked sequentially. In other words, the active layer 2004 has a structure in which three QW layers are sandwiched by four barrier layers.

The QW layers 2015a to 2015c have a structure for efficiently confining a carrier with a quantum confinement effect and are formed of $Ga_{x3}In_{1-x3}N_{y3}As_{1-y3}$ ($0.3 \leq x_3 < 1$, $0 < y_3 < 1$). The barrier layers 2014a to 2014d are layers for spatially separating the plural QW layers from each other and are formed of GaNAs or GaAs.

The opening portion 2005 is formed of p-type AlAs. In addition, the selectively oxidized layer 2006 is formed by selectively oxidizing AlAs. The selectively oxidized layer 2006 has insulating properties and has a function of constricting a current injected from the p-side electrode 12 to increase a current density in the active layer 2004. In addition, the selectively oxidized layer 2006 has a refractive index different from that of the opening part 2005 and also has a function of controlling an oscillation lateral mode.

The p side electrode 2012 has a structure in which an opening portion is provided in the center. This opening portion functions as an emission window for outputting light generated in the active layer 2004 to the outside. In addition, since the p-side electrode 2012 has a structure extending not only onto the emission-side semiconductor-multilayer-mirror 2008 but also onto the polyimide layer 2011, the polyimide layer 2011 is formed of a substance with a low dielectric constant from the viewpoint of reducing parasitic capacitance.

The reflective side semiconductor multilayer mirror 2002 has a conduction type of an n-type and has a structure in which plural n-type DBR mirrors, which include a high-refractive-index area and a low-refractive-index area as a pair, are stacked. In addition, the emission-side semiconductor-multilayer-mirror 2008 has a conduction type of a p-type and has a structure in which plural p-type DBR mirrors, which include a high-refractive-index area and a low-refractive-index area as a pair, are stacked. The high-refractive-index area is formed of p-type or n-type GaAs, and the low-refractive-index area is formed of p-type or n-type $Al_{0.9}Ga_{0.1}As$. Here, the n-type DBR mirrors forming the reflective side semiconductor multilayer mirror 2002 are stacked in thirty layers, and the p-type DBR mirrors forming the emission-side semiconductor-multilayer-mirror 2008 are stacked in twenty to thirty layers. Note that it is preferable to interpose inclined composition areas in interfaces of the respective areas to reduce a resistance.

Next, a reason why the numbers of stacking the n-type DBR mirrors and the p-type DBR mirrors are determined as described above will be explained. As explained already, to use the surface emitting laser as a signal light source or the like, it is necessary to control a threshold current to be low and improve slope efficiency. First, reflectivities of the reflection-side semiconductor-multilayer-mirror 2002 and the emission-side semiconductor-multilayer-mirror 2008 necessary for satisfying these conditions are derived, and the numbers of stacking n-type DBR mirrors and p-type DBR mirrors necessary for realizing the derived reflectivities are determined.

In the first place, conditions necessary for improving slope efficiency will be examined. Efficiency $\eta_f$ of a laser beam outputted from the opening portion provided in the p side electrode 2012 can be represented as follows using external differential quantum efficiency $\eta_d$, a reflectivity $R_f$ of the emission-side semiconductor-multilayer-mirror 2008, and a reflectivity $R_r$ of the reflection-side semiconductor-multilayer-mirror 2002.

$$\eta_f = \eta_d(1 + [R_f/R_r\{1-(R_r/1-R_f)\}]^{1/2})^{-1} \qquad (11)$$

Efficiency of a laser beam to be outputted has a large value as the efficiency $\eta_f$ is larger. A relation between the efficiency and slope efficiency $S_f$ is represented as follows using a wavelength $\lambda$ of the laser beam.

$$S_f = 1.24\, \eta_f/\lambda \qquad (12)$$

Figure 21:
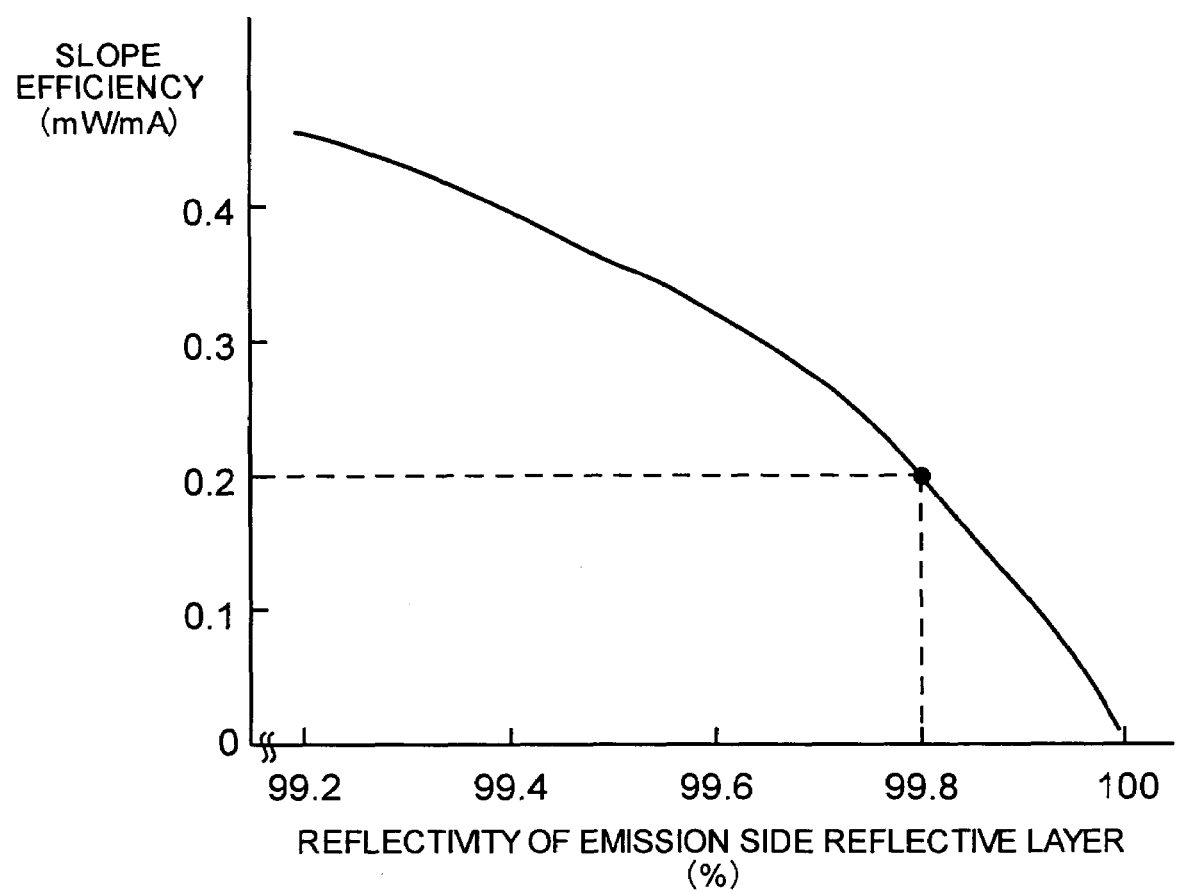
FIG. 21 is a graph showing a relation between a reflectivity and slope efficiency of an emission-side semiconductor-multilayer-mirror.

Therefore, conditions under which the slope efficiency $S_f$ is equal to or higher than 0.2 mW/mA can be found using expression (11) and expression (12). Here, since the external differential quantum efficiency $\eta_d$ and the wavelength $\lambda$ are known values, desired slope efficiency can be realized by optimizing the reflectivity $R_f$ of the emission-side semiconductor-multilayer-mirror 2008 and the reflectivity $R_r$ of the reflection-side semiconductor-multilayer-mirror 2002. FIG. 21 shows a result of specific calculation. In a graph of FIG. 21, a horizontal axis indicates a reflectivity of the emission-side semiconductor-multilayer-mirror 2008 and a vertical axis indicates slope efficiency. Note that, in the graph, a value of the reflectivity $R_r$ of the reflection-side semiconductor-multilayer-mirror 2002 is assumed to be 99.9 percent or more. In this embodiment, since it is not taken into account that a laser beam is emitted from the reflection-side semiconductor-multilayer-mirror 2002 side, it is necessary to set the reflectivity $R_r$ high. As shown in the graph of FIG. 21, to improve the slope efficiency $S_f$, it is preferable that the reflectivity $R_f$ of the emission-side semiconductor-multilayer-mirror 2008 is 99.8 percent or less, and it is necessary to stack p-type DBR layers by a number corresponding to this reflectivity.

Next, conditions necessary for reducing a threshold current to 1 milliampere or less will be examined. A threshold current density $J_{th}$ is represented as follows $$J_{th}=(N_w J_{tr} \eta_i)\exp\{\alpha_i+(\alpha_m/G_0 N_w \Gamma_w)\} \quad (13)$$

Note that, in expression (13), $N_w$ is the number of QWs, $J_{tr}$ is a transparency current density, $\eta_i$ is an internal quantum efficiency, $\alpha_i$ is an internal loss, $\alpha_m$ is a mirror loss, $G_0$ is a gain, and $\gamma_w$ is a coefficient of light confinement in the active layer 2004. In addition, the mirror loss $\alpha_m$ is represented as follows $$\alpha_m=(\tfrac{1}{2})L \times \ln(1/R_f R_r) \quad (14)$$

Figure 22:
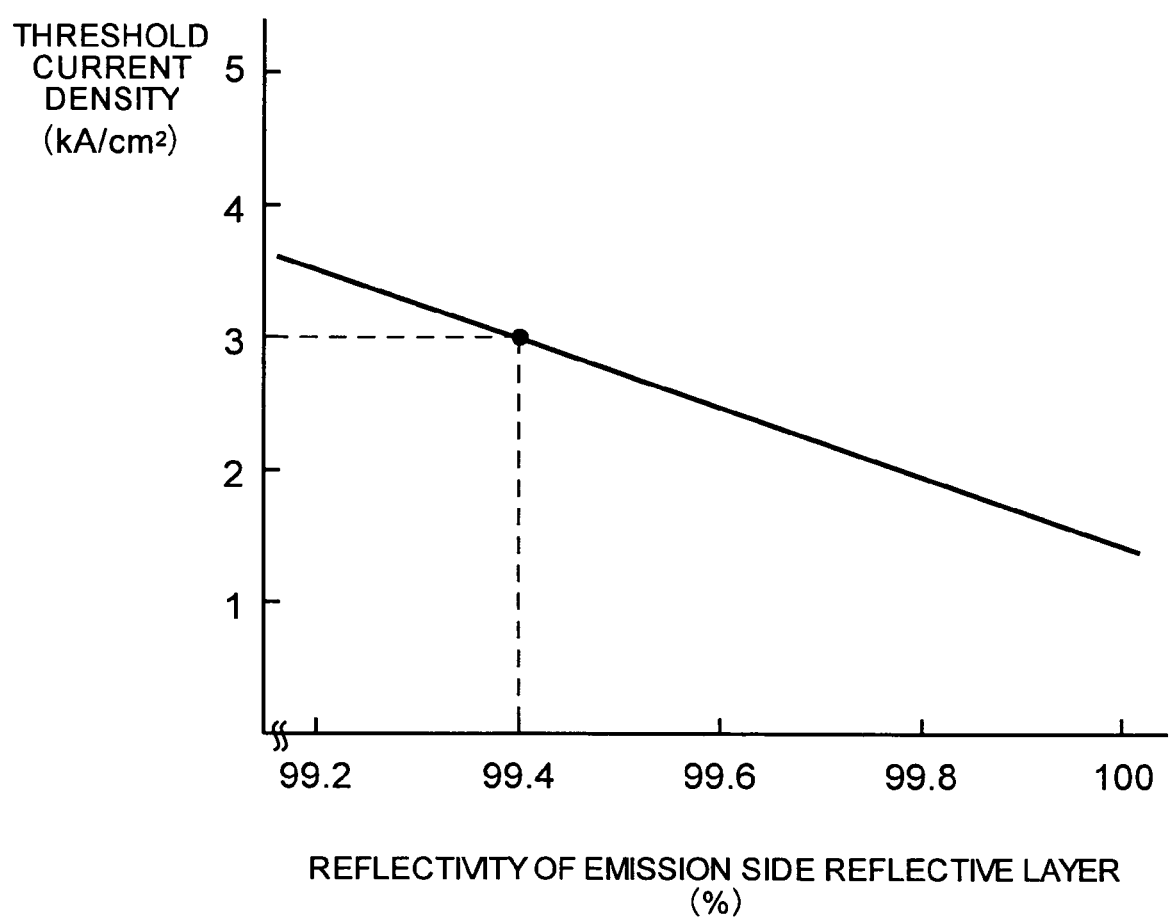
FIG. 22 is a graph showing a relation between a reflectivity and a threshold current value of the emission-side semiconductor-multilayer-mirror.

By substituting expression (14) in expression (13), it is seen that the threshold current density $J_{th}$ is a function of the reflectivity $R_f$ of the emission-side semiconductor-multilayer-mirror 2008, and the threshold current density $J_{th}$ decreases as the reflectivity $R_f$ increases. When the reflectivity $R_r$ of the reflection-side semiconductor-multilayer-mirror 2002 was set to 99.9 percent or more and the threshold current density was calculated by substituting specific values for variables other than the reflectivity $R_f$ of the emission-side semiconductor-multilayer-mirror 2008, a graph shown in FIG. 22 was obtained. In the graph shown in FIG. 22, a horizontal axis indicates the reflectivity $R_f$ and a vertical axis indicates the threshold current density $J_{th}$. Here, since a horizontal sectional area of a part of the active layer 2004 into which a current actually flows to contribute to light emission is generally about 30 μm², the threshold current density $J^{th}$ has to be reduced to 3 kA/cm² or less to reduce a value of the threshold current to 1 milliampere or less. From this condition and the graph of FIG. 22, it is preferable that the reflectivity Rf of the emission-side semiconductor-multilayer-mirror 2008 necessary for reducing the threshold current to 1 milliampere or less is 99.4 percent or more.

In other words, as a condition for increasing the slope efficiency to 0.2 mW/mA or more, a reflectivity of the emission-side semiconductor-multilayer-mirror 2008 is 99.8 percent or less, and as a condition for reducing the threshold current to 1 milliampere or less, a reflectivity of the emission-side semiconductor-multilayer-mirror 2008 is 99.4 percent or more. As a result, a reflectivity of the emission-side semiconductor-multilayer-mirror 2008 satisfying both the conditions is 99.4 percent or more and 99.8 percent or less.

Next, the number of stacked layers of p-type DBR mirrors and the number of stacked layers of n-type DBR mirrors necessary for realizing such a reflectivity is derived. FIG. 23A is a table showing a relation between the number of stacked layers of the n-type DBR mirrors and a reflectivity, and FIG. 23B is a table showing a relation between the number of stacked layers of the p-type DBR mirrors and a reflectivity. Note that, in FIG. 23A and FIG. 23B, reflectivities of the n-type DBR mirrors and the p-type DBR mirrors of the same number of stacked layers are different because refractive indexes in areas outside the respective DBR mirrors are different. For example, the n-type substrate 2001, that is, a semiconductor layer of GaAs or the like is present outside (below) the n-type DBR mirror, and a reflectivity of the semiconductor layer is about 3.5. On the other hand, the air with a refractive index of about 1 is present outside (above) the p-type DBR mirror. Thus, the reflectivities are different. The inventors actually created surface emitting lasers with different structures experimentally and then measured reflectivities to calculate a maximum reflectivity.

Referring to the table in FIG. 23A, it is seen that the number of stacked layers of the n-type DBR mirror necessary for setting the reflectivity of the reflection-side semiconductor-multilayer-mirror 2002 provided on the n-type substrate 2001 side to 99.9 percent or more is thirty or more. In addition, from FIG. 23B, the number of stacked layers of the p-type DBR mirror necessary for setting the reflectivity of the emission-side semiconductor-multilayer-mirror 2008 to 99.4 percent or more and 99.8 percent or less is twenty or more and twenty-three or less.

By forming the reflection-side semiconductor-multilayer-mirror 2002 and the emission-side semiconductor-multilayer-mirror 2008 in this way, the reflectivity of the reflection-side semiconductor-multilayer-mirror 2002 is set to 99.9 percent, and the reflectivity of the emission-side semiconductor-multilayer-mirror 2008 is set to 99.4 percent or more and 99.8 percent or less. This makes it possible to control a threshold current value to 1 milliampere or less and increase the slope efficiency to 0.2 mW/mA or more. Therefore, when an injection current five or more times as large as the threshold current value, for example, a current of 6 milliamperes is injected, intensity of a laser beam emitted from the surface emitting laser according to the seventh embodiment is increased to 1 milliwatt or more. Thus, the surface emitting laser can be used for applications like a signal light source.

Figure 24:
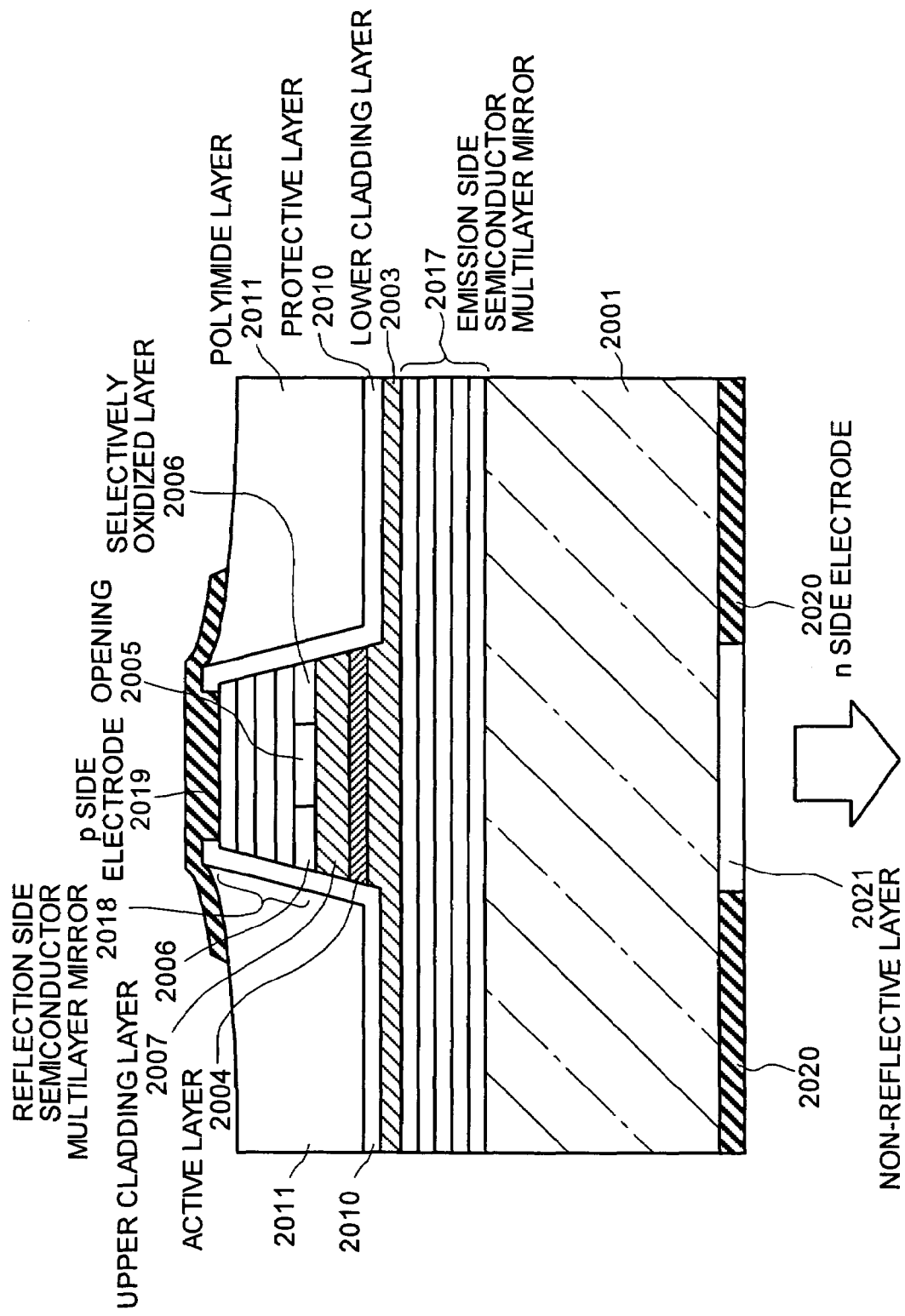
FIG. 24 is a sectional view of a structure of a surface emitting laser according to an eighth embodiment.

Next, a surface emitting laser according to an eighth embodiment of the invention will be explained. FIG. 24 is a schematic diagram of a structure of the surface emitting laser according to the eighth embodiment. In the surface emitting laser according to the eighth embodiment, an electrode arranged on a lower surface of a substrate has an opening portion, and a laser beam is emitted from this opening portion. A structure of the surface emitting laser according to the eighth embodiment will be hereinafter explained specifically.

As shown in FIG. 24, the surface emitting laser according to the eighth embodiment has a structure in which an emission-side semiconductor-multilayer-mirror 2017, the lower cladding layer 2003, the active layer 2004, the upper cladding layer 2007, and a reflection-side semiconductor-multilayer-mirror 2018 are sequentially stacked on the n-type substrate 2001. In a part of the area of the reflection-side semiconductor-multilayer-mirror 2018, the opening portion 2005 and the selectively oxidized layer 2006 around the opening portion 2005 are arranged. An upper area of the lower cladding layer 2003 and semiconductor layers stacked above the lower cladding layer 2003 are formed in a mesa-post shape. The entire mesa-post shaped area and the entire upper surface of the lower cladding layer 2003 are covered by the protective layer 2010 except a part of an upper surface of the emission-side semiconductor-multilayer-mirror 2018. The polyimide layer 2011 is stacked at a periphery of the mesa-post shaped area with the protective layer 2010 between the periphery of the mesa-post shaped area and the polyimide layer 2011. A p side electrode 2019 is arranged on the upper surface of the reflection-side semiconductor-multilayer-mirror 2018 and on the polyimide layer 2011. The p side electrode 2019 does not have an opening unlike the seventh embodiment, and a laser beam is never emitted from an area near the p side electrode 2019. Alternatively, an n side electrode 2020 including an opening portion is arranged on a lower surface of the n-type substrate 2001, and a laser beam is emitted from the opening portion included in the n side electrode 2020. In addition, to prevent reflection on an interface of the n-type substrate 2001 and the air, a non-reflective film 2021 is formed in the opening portion of the n side electrode 2020, that is, a laser beam emitting portion. Note that the n side electrode 2020 may be arranged over the entire lower surface of the n-type substrate 2002 as shown in FIG. 24 or may be formed in an annular shape. In addition, in the eighth embodiment, portions denoted by reference numerals identical with those in the seventh embodiment have equivalent structures and show equivalent functions unless specifically noted otherwise.

The emission-side semiconductor-multilayer-mirror 2017 has a conduction type of an n-type and has a structure in which plural n-type DBR mirrors, which include a high-refractive-index area and a low-refractive-index area as a pair, are stacked. The reflection-side semiconductor-multilayer-mirror 2018 has a conduction type of an p-type and has a structure in which plural p-type DBR mirrors, which include a high-refractive-index area and a low-refractive-index area as a pair, are stacked. The high-refractive-index area is formed of p-type or n-type GaAs, and the low-refractive-index area is formed of p-type or n-type $Al_{0.9}Ga_{0.1}As$.

The surface emitting laser according to the eighth embodiment has a structure for emitting a laser beam from the lower surface of the n-type substrate 2001 unlike the seventh embodiment. In the eighth embodiment, the n-type substrate 2001 is formed of GaAs, and a forbidden band width of GaAs is about 1.428 electron-volts at a room temperature. When light of a wavelength of 0.8682 µm or less is made incident, the light is absorbed by the n-type substrate 2001 to generate an electro/hole pair. However, a laser beam emitted from the surface emitting laser according to the eighth embodiment has a wavelength of about 1.2 µm to 1.6 µm, the laser beam can be emitted to the outside without being absorbed by the n-type substrate 2001.

Since the surface emitting laser has the structure for emitting a laser beam from the lower surface of the n-type substrate 2001, the emission-side semiconductor-multilayer-mirror 2017 and the reflection-side semiconductor-multilayer-mirror 2018 are located in positions opposite to those in the seventh embodiment. Therefore, to improve slope efficiency while controlling a threshold current for the surface emitting laser according to the eighth embodiment, it is necessary to optimize the structures of the emission-side semiconductor-multilayer-mirror 2017 and the reflection side multilayer reflection mirror 2018 again.

Expressions (11) to (14) for optimizing a reflectivity are established for the eighth embodiment as in the seventh embodiment. Therefore, referring to FIGS. 21 and 22, a reflectivity of the emission-side semiconductor-multilayer-mirror 2017 is set to 99.4 percent or more and 99.8 percent or less, and a reflectivity of the reflection-side semiconductor-multilayer-mirror 2018 is set to 99.9 percent or more.

Next, the number of stacked layers of the n-type DBR mirrors forming the emission-side semiconductor-multilayer-mirror 2017 and the number of stacked layers of the p-type DBR mirrors forming the reflection-side semiconductor-multilayer-mirror 2018 will be examined. Since the number of stacked layers of the n-type DBR mirrors and a reflectivity of the emission-side semiconductor-multilayer-mirror 2017 have the relation shown in FIG. 23A, to set the reflectivity of the emission-side semiconductor-multilayer-mirror 2017 to 99.4 percent or more and 99.8 percent or less, twenty-three or more layers and twenty-six or less layers of the n-type DBR mirrors only have to be stacked. Similarly, since the number of stacked layers of the p-type DBR mirror and a reflectivity of the reflection-side semiconductor-multilayer-mirror 2018 have the relation shown in FIG. 23B, to set the reflectivity of the reflection-side semiconductor-multilayer-mirror 2018 to 99.9 percent or more, twenty-six or more layers only has to be stacked. By forming the emission-side semiconductor-multilayer-mirror 2017 and the reflection-side semiconductor-multilayer-mirror 2018 in this way, a surface emitting laser with a threshold current of 1 milliampere or less and slope efficiency of 0.2 mW/mA can be realized.

As described above, the surface emitting laser according to the invention are explained according to the seventh embodiment and the eighth embodiment. However, the descriptions and the drawings forming a part of this disclosure do not limit the invention. Those skilled in the art would be able to derive various alternative modes for carrying out the invention, embodiments, and operation techniques from this disclosure. For example, although the n-type substrate 1 is explained as being formed of GaAs in the seventh embodiment and the eighth embodiment, the n-type substrate 1 may be formed of InP. In addition, for the QW layer forming the active layer 2004, other than $Ga_{x3}In_{1-x3}N_{y3}As_{1-y3}$ ($0.3 \leq x_3 < 1$, $0 < y_3 < 1$), $Ga_{x4}In_{1-x4}As_{1-y4-z}Ny_4Sb_z$ ($0.3 \leq x_4 < 1$, $0 < y_4 < 0.03$, $0.002 \leq z \leq 0.06$) may be used. It is confirmed that, when $Ga_{x4}In_{1-x4}As_{1-y4-z}N_{y4}Sb_z$ is used, crystallinity is improved, and a surface emitting laser more excellent in characteristics can be realized. Similarly, $GaAs_{y5}Sb_{1-y5}$ ($0 < y_5 < 1$) may be used, or the active layer 4 may be formed of a quantum dot layer instead of the QW layer.

The high-refractive-index area forming the n-type DBR mirror and the p-type DBR mirror is not limited to GaAs, and it is possible to use $Al_{x1}Ga_{1-x1}As$ ($0 \leq x1 \leq 0.4$) as the high-refractive-index area. Similarly, the low-refractive-index area is not limited to $Al_{0.9}Ga_{0.1}As$, and it is possible to use $Al_{x2}Ga_{1-x2}As$ ($0.6 \leq x_2 \leq 0.95$) as the low-refractive-index area. When compositions of the high-refractive-index area and the low-refractive-index area change, reflectivities of the n-type DBR mirror and the p-type DBR mirror may change. However, even in that case, it is possible to calculate the number of stacked layers realizing appropriate reflectivities by deriving the tables shown in FIGS. 23A and 23B experimentally or theoretically.

Other than AlAs, $Al_{x6}Ga_{1-x6}As$ ($0.97 \leq x6 < 1$) may be used for the semiconductor layer forming the opening portion 2005, that is, the semiconductor layer before oxidation of the selectively oxidized layer 2006. The conduction type may be reversed for the semiconductor layer forming the surface emitting laser. For example, it is possible to stack semiconductor layers on a p-type substrate.

Moreover, the active layer 2004 may not be formed in the structure having a triple QW layer and may be formed in a structure including a single QW layer or multiple QW layers having about two to five QW layers.

Figure 25:
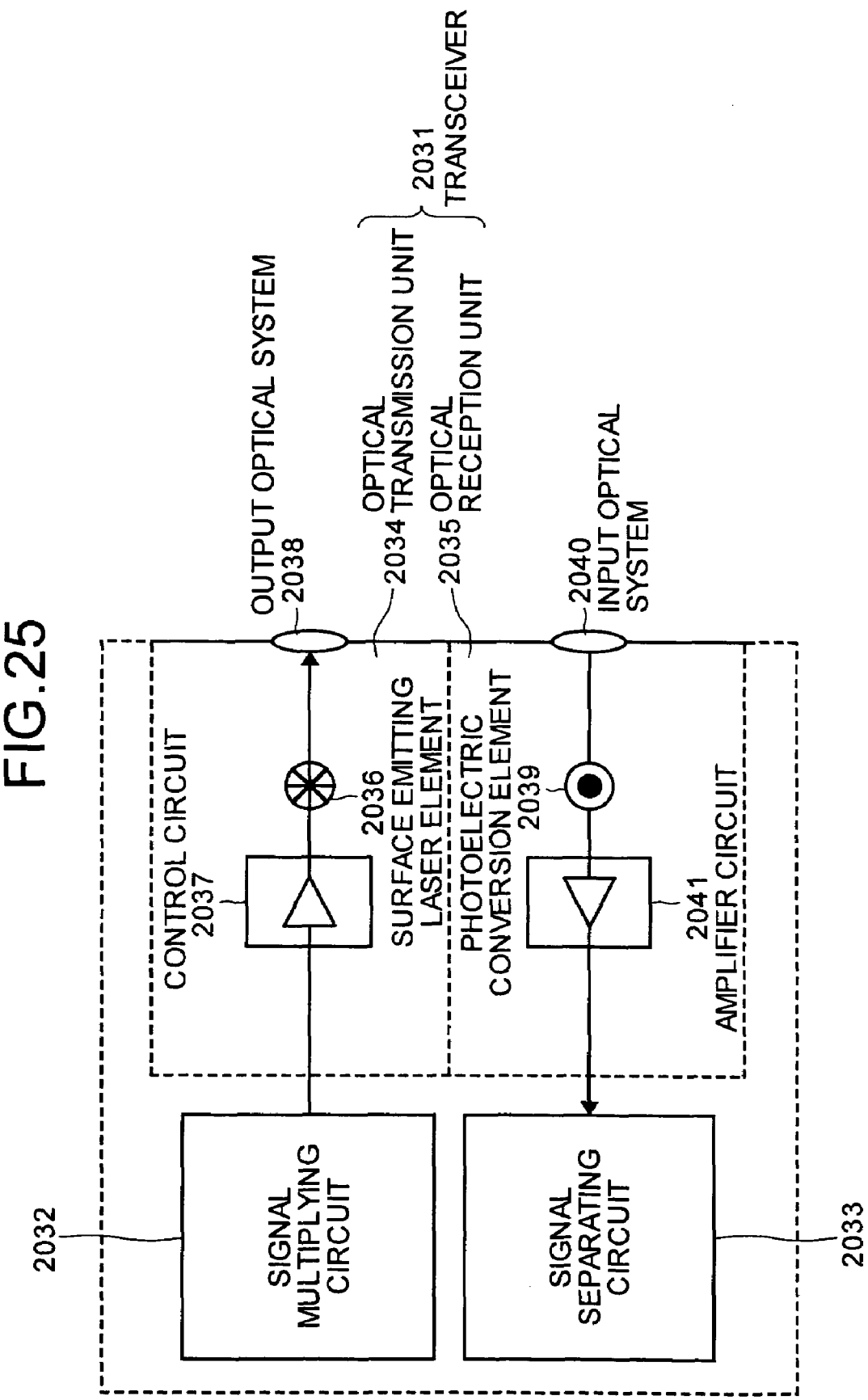
FIG. 25 is a block diagram of a structure of an optical transceiver according to a ninth embodiment of the invention.

Next, an optical transceiver according to a ninth embodiment of the invention will be explained. FIG. 25 is a block diagram of a structure of the optical transceiver according to the ninth embodiment. The optical transceiver according to the ninth embodiment includes a transceiver 2031 having an optical transmitting unit 2034 and an optical receiving unit 2035 for transmitting and receiving an optical signal, a signal multiplexing circuit 2032 that inputs an electric signal to the transceiver 2031, and a signal separating circuit 2033 that separates an electric signal obtained from an optical signal received by the transceiver 2031.

The optical transmitting unit 2034 is a unit for converting an electric signal inputted from the signal multiplexing circuit 2032 into an optical signal and transmitting the optical signal. More specifically, the optical transmitting unit 2034 includes a surface emitting laser 2036 that emits an optical signal, a control circuit 2037 that controls the surface emitting laser 2036 based on an inputted electric signal, and an output optical system 2038 for outputting the optical signal, which is emitted from the surface emitting laser 2036, to the outside.

The surface emitting laser according to the seventh embodiment or the eighth embodiment is used for the surface emitting laser 2036 included in the optical transmitting unit 2034. Therefore, the surface emitting laser 2036 has a low threshold current value and improved slope efficiency and is capable of outputting an optical signal with intensity of 1 milliwatt or more.

The optical receiving unit 2035 is a unit for converting an optical signal received from the outside into an electric signal and outputting the electric signal to the signal separating circuit 2033. More specifically, the optical receiving unit 2035 includes a photoelectric conversion element 2039 for receiving an optical signal and converting the optical signal into an electric signal, an input optical system 2040 for guiding an optical signal to the photoelectric conversion element 2039, and an amplifier circuit 2041 that amplifies an electric signal outputted from the photoelectric conversion element 2039. The photoelectric conversion element 2039 outputs an electric signal based on intensity of the received optical signal. It is possible to use a photoresistor or the like as the photoelectric conversion element 2039 other than a photodiode.

The signal multiplexing circuit 2032 is a circuit for multiplexing plural electric signals inputted from the outside into one electric signal. The one electric signal obtained by multiplexing the electric signals is outputted to the optical transmitting unit 2034 constituting the transceiver 2031.

The signal separating circuit 2033 is a circuit for separating an electric signal obtained from the optical receiving unit 2035 constituting the transceiver 2031 into plural electric signals. This is because, since an optical signal received by the optical receiving unit 2035 originally includes plural signals, to extract information, it is necessary to separate an electric signal, which is obtained by subjecting the optical signal to photoelectric conversion, into plural electric signals.

Next, operations of the optical transceiver according to the ninth embodiment will be explained. The optical transceiver according to the ninth embodiment is an optical transceiver for transmitting and receiving plural electric signals. A transmission operation will be explained in the first place.

First, plural electric signals inputted from the outside is converted into a single electric signal by the signal multiplexing circuit 2032. Then, this single electric signal is inputted to the control circuit 2037 from the signal multiplexing circuit 2032, and the control circuit 2037 controls a current to be injected into the surface emitting laser 2036 based on this electric signal. More specifically, an optical signal having a waveform corresponding to an electric signal waveform is emitted from the surface emitting laser 2036 by the control circuit 2037.

Next, a reception operation will be explained. An optical signal transmitted from the outside is made incident in the optical transceiver via the input optical system 2040 and received by the photoelectric conversion element 2039. The photoelectric conversion element 2039 has a function of outputting an electric signal having a waveform corresponding to a change in intensity of the received optical signal. The converted electric signal is inputted to the amplifier circuit 2041. Since intensity of the optical signal inputted from the outside is generally feeble, intensity of the electric signal outputted from the photoelectric conversion element 2039 is also feeble and is amplified by the amplifier circuit 2041. Thereafter, the amplified electric signal is inputted to the signal separating circuit 2033 and separated into plural electric signals. Here, the reception operation ends.

Figure 26:
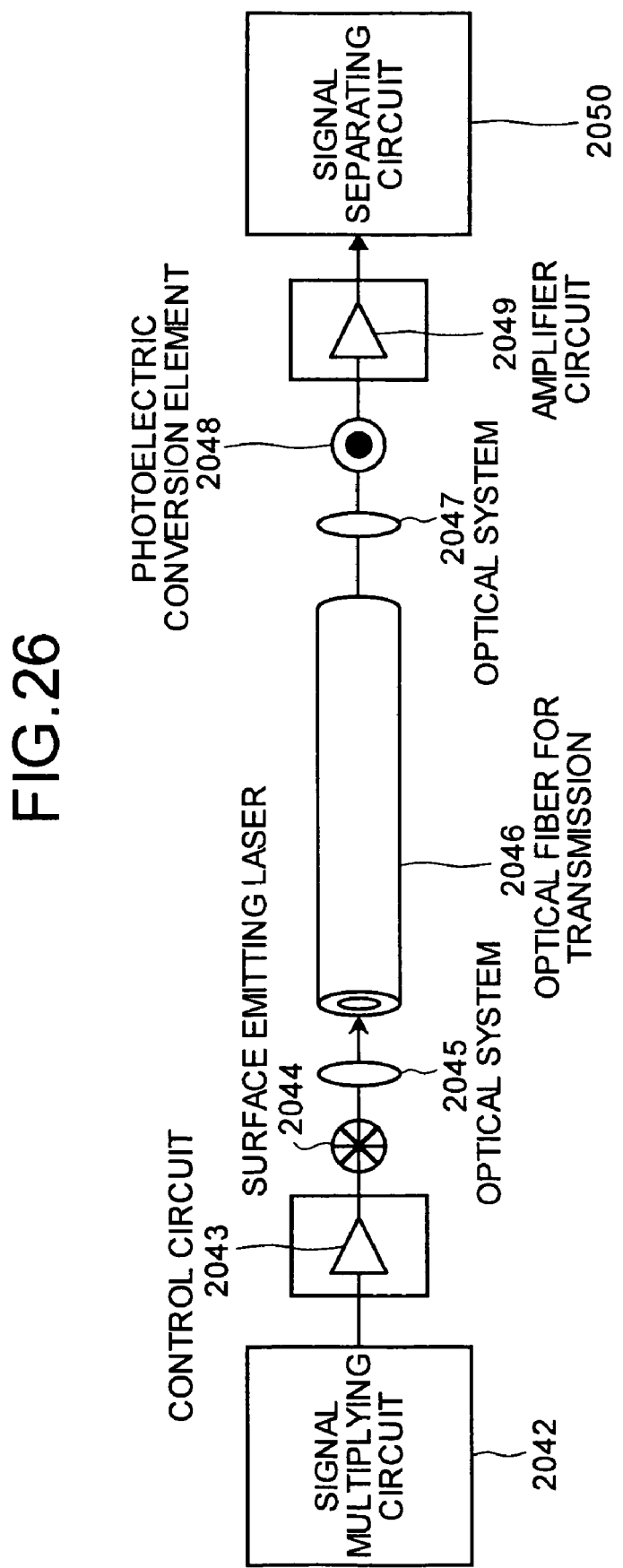
FIG. 26 is a block diagram of a structure of an optical communication system according to a tenth embodiment of the invention.

Next, an optical communication system according to a tenth embodiment of the invention will be explained. FIG. 26 is a schematic diagram showing the optical communication system according to the tenth embodiment. The optical communication system according to the tenth embodiment uses the surface emitting laser according to the seventh embodiment or the eight embodiment as a signal light source. More specifically, the optical communication system according to the tenth embodiment includes a signal multiplexing circuit 2042, a control circuit 2043 connected to the signal multiplexing circuit 2042, a surface emitting laser 2044 connected to the control circuit 2043, an optical fiber for transmission 2046, and an optical system 2045 for optically combining the surface emitting laser 2044 and an end of the optical fiber for transmission 2046. In addition, the optical communication system further includes an photoelectric conversion element 2048 optically combined with the other end of the optical fiber for transmission 2046 via the optical system 2047, an amplifier circuit 2049 connected to the photoelectric conversion element 2048, and a signal separating circuit 2050 connected to the amplifier circuit 2049.

The single electric signal obtained by the signal multiplexing circuit 2042 is inputted to the control circuit 2043. The control circuit 2043 controls a current, which is injected into the surface emitting laser 2044, based on this electric signal. Consequently, an optical signal outputted from the surface emitting laser 2044 has a waveform corresponding to an electric signal obtained by the signal multiplexing circuit 2042. The optical signal outputted from the surface emitting laser 2044 is made incident in an end of the optical fiber for transmission 2046 via the optical system 2045 and transmitted through the optical fiber for transmission 2046.

Then, the optical signal transmitted through the optical fiber for transmission 2046 is emitted from the other end of the optical fiber for transmission 2046 and is made incident in the photoelectric conversion element 2048 via the optical system 2047. The photoelectric conversion element 2048 outputs an electric signal based on the received optical signal. The electric signal is amplified by the amplifier circuit 2049 and then inputted to the signal separating circuit 2050.

The signal separating circuit 2050 separates the inputted electric signal into individual electric signals before being multiplexed by the signal multiplexing circuit 2042 and restores information. In this way, the optical communication system according to the tenth embodiment transmits the information.

In the optical communication system according to the tenth embodiment, the surface emitting laser according to the seventh embodiment or the eighth embodiment is used as a signal light source on a transmission side. Therefore, it is possible to use a surface emitting laser having a low threshold current value and improved slope efficiency and having intensity of 1 milliwatt or more. In addition, it is possible to set a fiber length of the optical fiber for transmission 2046 long in the optical communication system, which makes it possible to perform long distance transmission of an optical signal.

Since the surface emitting laser according to the seventh embodiment or the eighth embodiment emits a laser beam with a wavelength of 1.2 μm or more, it is possible to select a wavelength at which a loss is low in the optical fiber for transmission 2046. In addition, the surface emitting laser also has an advantage that an existing optical communication system can be used in these wavelength bands. For example, it is also possible that the emission wavelength is set to 1.550 μm and an erbium doped fiber amplifier (EDFA) is arranged in the optical fiber for transmission 2046. In this case, since intensity of an optical signal can be amplified by the EDFA, a transmission distance can be further extended. Similarly, a thulium doped fiber amplifier (TDFA), a Raman amplifier, or the like may be used.

Next, embodiments of the surface emitting laser according to the invention, and the transceiver, the optical transceiver, and the optical communication system using the surface emitting laser will be explained in detail with reference to the drawings. Note that the invention is not limited by the embodiments.

First, a surface emitting laser according to an eleventh embodiment of the invention will be explained. The surface emitting laser according to the eleventh embodiment is characterized in that the surface emitting laser oscillates in a bandwidth between 980 nanometers to 1650 nanometers and, in a low-refractive-index layer and a high-refractive-index layer of a p-type semiconductor multilayer mirror belonging to a range of a predetermined number of pairs from an active layer, a predetermined area from an interface of the low-refractive-index layer and the high-refractive-index layer is subjected to p-type doping at a high concentration, and the remaining areas of the low-refractive-index area and the high-refractive-index area is subjected to p-type doping at a low concentration equal to or lower than a predetermined value not affecting laser oscillation.

Figure 27:
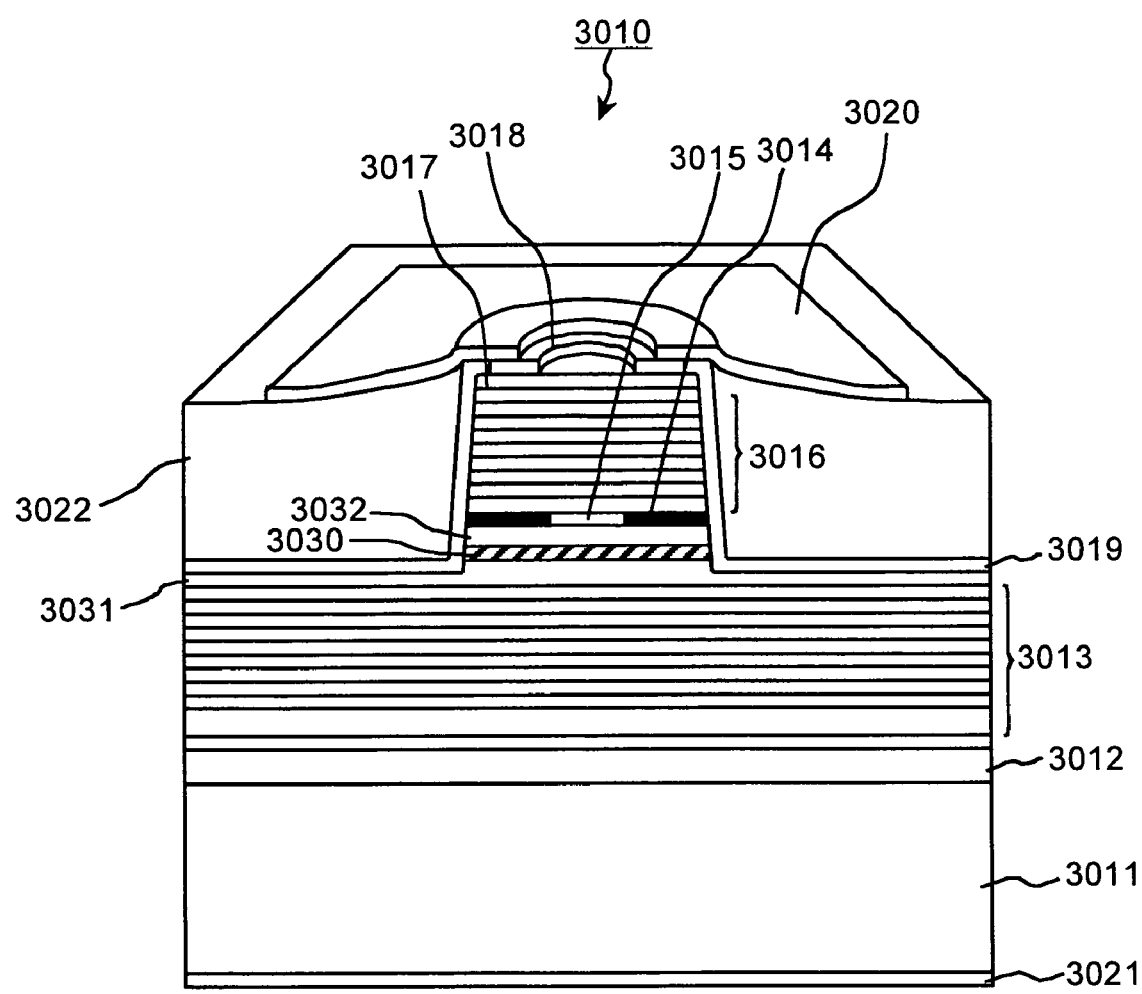
FIG. 27 is a perspective sectional view of a surface emitting laser according to an eleventh embodiment of the invention.
Figure 28:
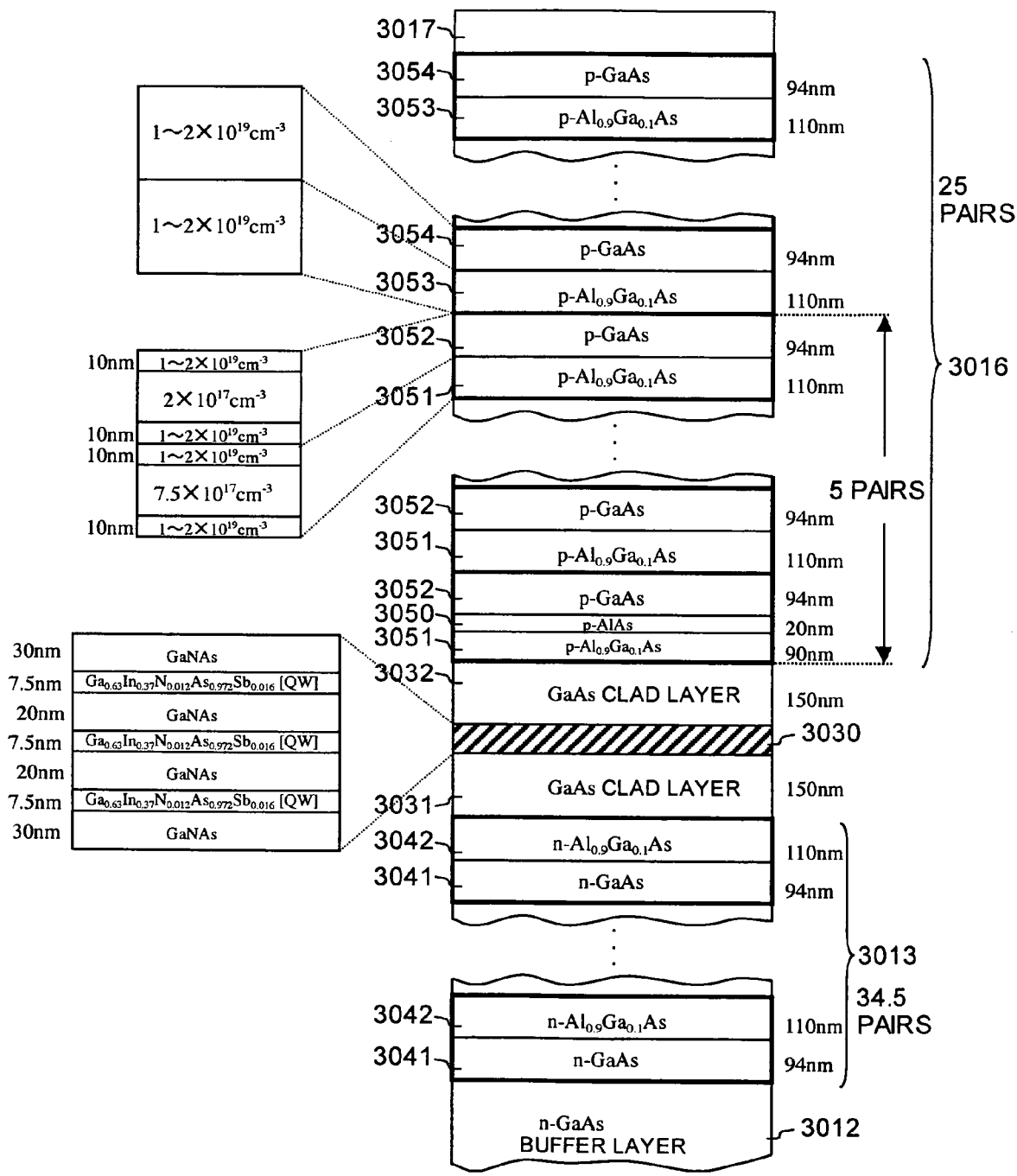
FIG. 28 is an explanatory diagram for explaining a structure of an n-type lower semiconductor multilayer mirror and a p-type upper semiconductor multilayer mirror of the surface emitting laser according to the eleventh embodiment.

FIG. 27 is a perspective sectional view of the surface emitting laser according to the eleventh embodiment. FIG. 28 is an explanatory diagram for explaining a structure of an n-type lower semiconductor multilayer mirror and a p-type upper semiconductor multilayer mirror of the surface emitting laser according to the eleventh embodiment. In particular, the surface emitting laser 3010 shown in FIG. 27 is different from the conventional surface emitting laser in structures of respective layers of a p-type upper semiconductor multilayer mirror 3016. Thus, the large difference is explained in FIG. 28.

To manufacture the surface emitting laser 3010 shown in FIG. 27, first, an n-type GaAs buffer layer 3012 with a thickness of 0.1 μm is formed at an n-type impurity concentration $1 \times 10^{18}$ cm$^{-3}$ by the MOCVD method on an n-type GaAs substrate 3011 of a (100) surface, and an n-type lower semiconductor multilayer mirror (lower DBR mirror) 3013 is further formed on this n-type GaAs buffer layer 3012. Here, as shown in FIG. 28, the n-type lower semiconductor multilayer mirror 3013 is a layer in which, assuming that a stacked structure of an n-type high-refractive-index layer 3041 with a thickness of 94 nanometers and an n-type low-refractive-index layer 3042 with a thickness of 110 nanometers forms one pair, for example, 34.5 pairs are stacked. Note that the n-type high-refractive-index layer 3041 is formed of n-type GaAs, and the n-type refractive index layer 3042 is formed of n-type $Al_{0.9}Ga_{0.1}As$.

Then, a lower GaAs cladding layer 3031, a multiple QW active layer 3030, and an upper GaAs cladding layer 3032 are formed in order on the n-type lower semiconductor multilayer mirror 3013. The GaAs cladding layers 3031 and 3032 are, for example, 150 nanometers thick, and the multiple QW active layer 3030 is a triple QW layer formed of a $Ga_{0.63}In_{0.37}N_{0.012}As_{0.972}Sb_{0.016}$ well layer with a thickness of 7.5 nanometers and a GaNAs barrier layer with a thickness of 30 nanometers at both ends and a thickness of 20 nanometers in other portions.

The p-type upper semiconductor multilayer mirror 3016 (upper DBR mirror) is formed on the upper GaAs cladding layer 3032. As shown in FIG. 28, the p-type upper semiconductor multilayer mirror 3016 is a layer in which, assuming that a stacked structure of a p-type low-refractive-index layer with a thickness of 110 nanometers and a p-type high-refractive-index layer with a thickness of 94 nanometers forms one pair, for example, twenty-five pairs are stacked. Note that the p-type low-refractive-index layer is formed of p-type GaAs, and the p-type high-refractive-index layer is formed of p-type $Al_{0.9}Ga_{0.1}As$. Among the pairs forming the p-type upper semiconductor multilayer mirror 3016, as shown in FIG. 28, a low-refractive-index layer of a first pair adjacent to the GaAs cladding layer 3032 is formed of a p-type $Al_{0.9}Ga_{0.1}As$ layer and a p-type AlAs layer 3050 that is required for forming a current confinement layer in a later process. For example, the low-refractive-index layer of the first pair is formed of the p-type $Al_{0.9}Ga_{0.1}As$ layer with a thickness of 90 nanometers and the p-type AlAs layer 3050.

Here, the invention is characteristic in that, in the p-type upper semiconductor multilayer mirror 3016, an impurity concentration of low-refractive-index layers and high-refractive-index layers for five pairs from the upper GaAs cladding layer 3032 is different from an impurity concentration of low-refractive-index layers and high-refractive-index layers for the remaining twenty pairs. More specifically, as shown in FIG. 28, in the five pairs from the upper GaAs cladding layer 3032, only areas of 10 nanometer thickness from interfaces of low-refractive-index layers 3051 and high-refractive-index layers 3052 are subjected to p-type doping at an impurity concentration of 1 to $2 \times 10^{19}$ cm$^{-3}$, areas of the low-refractive-index layers 3051 other than the areas of 10 nanometer thickness are subjected to p-type doping at an impurity concentration of $7.5 \times 10^{17}$ cm$^{-3}$, and areas of the high-refractive-index layers 3052 other than the areas of 10 nanometer thickness are subjected to p-type doping at an impurity concentration of $2 \times 10^{17}$ cm$^3$. In addition, in the remaining twenty pairs, all the areas of low-refractive-index layers 3053 and high-refractive-index layers 3054 are subjected to p-type doping at an impurity concentration of 1 to $2 \times 10^{19}$ cm$^{-3}$. Note that, as an impurity to be subjected to p-type doping, carbon (C), zinc (Zn), beryllium (Be), or the like can be used.

As described above, the p-type AlAs layer 3050 is included in the five pairs from the upper GaAs cladding layer 3032 as a first pair of the five pairs. In other words, the surface emitting laser according to the eleventh embodiment is designed such that, in the p-type upper semiconductor multilayer mirror 3016, an impurity concentration of the five pairs from the GaAs cladding layer 3032 is low compared with an impurity concentration of the remaining twenty pairs.

Subsequently, a p-type GaAs contact layer 3017 is formed on the p-type upper semiconductor multilayer mirror 3016. Then, through a photolithography process and an etching process (dry etching or wet etching), an outer edge of a stacked structure, which consist of the p-type upper semiconductor multilayer mirror 3016, the p-type AlAs layer 3050, the p-type Al0.9Ga0.1As layer below the p-type AlAs layer 3050, the upper GaAs cladding layer 3032, the multiple QW active layer 3030, and a part of the lower GaAs cladding layer 3031, is removed. Consequently, for example, a circular mesa-post with a diameter of 40 μm is formed.

Next, oxidation treatment is performed at temperature of about 400° C. in a moisture vapor atmosphere to selectively oxidize the p-type AlAs layer 3050 from a sidewall of the mesa-post to form an Al oxide layer 3014. For example, when the Al oxide layer 3014 is formed in a ring shape with a bandwidth of 17.5 μm, an area of a p-type AlAs layer 3015 in the center, that is, an area of an aperture to which a current is injected is about 20 μm$^2$ (with a diameter of 5 μm).

Then, a silicon nitride film 3019 functioning as a protective layer is formed on an upper surface and a side surface of the mesa-post and an exposed upper surface of the lower GaAs cladding layer 3031. Subsequently, periphery of the mesa-post is filled with a polyimide 3022. The silicon nitride film 3019 formed on the upper surface of the mesa-post is removed in a circular shape with a diameter of 40 μm to further form a p-type electrode 3018 of a ring shape with an inner diameter of 10 μm and an outer diameter of 40 μm on the p-type GaAs contact layer 3017 exposed by the removal. After grinding the substrate to have a thickness of, for example, 200 μm, an n-type electrode 3021 is formed on the back of the n-type GaAs substrate 3011. An electrode pad 3020, on which a wire is bonded, is formed on the polyimide 3022 to come into contact with the p-type electrode 3018.

Characteristic points of the invention, that is, an effect realized by reducing an impurity concentration of the five pairs from the GaAs cladding layer 3032 and selection of a value of the impurity concentration will be hereinafter explained.

First, to create a surface emitting laser with satisfactory characteristics of an oscillation threshold current and slope efficiency and realize high-frequency direct modulation serial transmission of 10 Gbps or the like, it is known that an impurity concentration of the p-type upper semiconductor multilayer mirror 3016 is important. To realize a stable direct modulation operation at high frequency, it is necessary to decrease an electric resistance of the p-type upper semiconductor multilayer mirror 3016. Therefore, it is necessary to subject impurities to p-type doping at a high concentration of about $1 \times 10^{19}$ cm$^{-3}$ in a predominant area determining an electric resistance, that is, an interface of a high-refractive-index layer and a low-refractive-index layer forming one pair to decrease an electric resistance in that part. This is often performed. In addition, it is preferable to subject impurities of a certain amount to p-type doping in portions other than the interface to decrease an electric resistance of the entire high-refractive-index layer and low-refractive-index layer.

However, it is well known that areas close to the p-type upper semiconductor multilayer mirror 3016 and the multiple QW active layer 3030 have a high optical density and are susceptible to intervalence band absorption or free carrier absorption. Thus, in areas other than an interface of a high-refractive-index layer and a low-refractive-index layer in a pair belonging to the area, it is necessary to reduce an impurity concentration to a certain degree or less and avoid development of intervalence band absorption or free carrier absorption to secure stable light generation in the multiple QW active layer 3030.

Thus, through a trial calculation of the threshold current density $J_{th}$ necessary for laser oscillation, the inventors found an optimum impurity concentration for high-refractive-index layers and low-refractive-index layers of the p-type upper semiconductor multilayer mirror 3016 for five pairs from the upper GaAs cladding layer 3032. Here, a result of the trial calculation is described. A surface emitting laser manufactured on trial for the trial calculation has the structure shown in FIG. 27 with a 1.3-μm-band as an oscillation wavelength, in which areas other than interfaces of high-refractive-index layers and low-refractive-index layers of the p-type upper semiconductor multilayer mirror 3016 for five pairs from the upper GaAs cladding layer 3032 are subjected to p-type doping at an impurity concentration of $4 \times 10^8$ cm$^{-3}$ and the interfaces areas of the high-refractive-index layers and the low-refractive-index layers and all the areas of the high-refractive-index layers and the low-refractive-index layers of the p-type upper semiconductor multilayer mirror 3016 for the remaining twenty pairs are subjected to p-type doping at an impurity concentration of 1 to $2 \times 10^{19}$ cm$^{-3}$.

Figure 29:
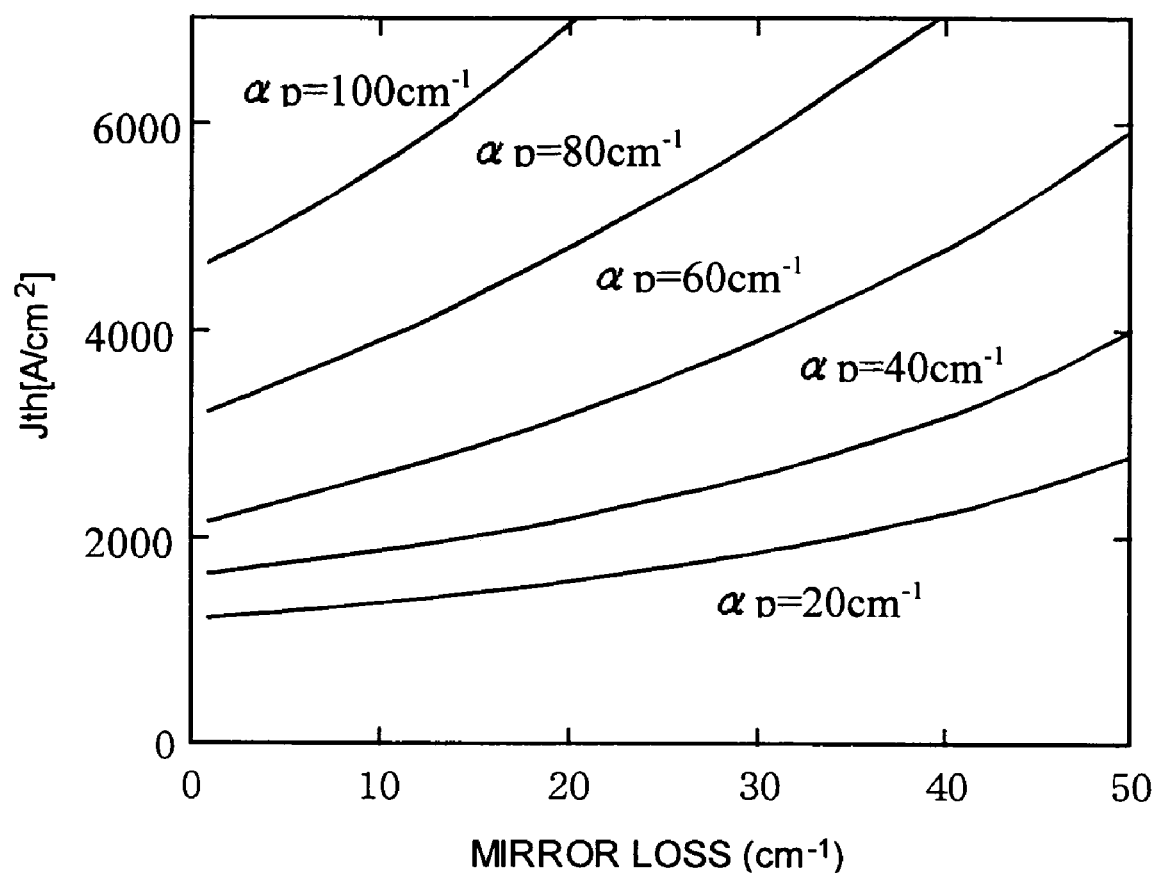
FIG. 29 is a graph in which a relation between a threshold current density $J_{th}$ in a vertical direction and a mirror loss with an absorption loss in a semiconductor multilayer mirror as a parameter using laser parameters extracted by an edge emitting type laser.

FIG. 29 is a graph in which a relation between a threshold current density $J_{th}$ in a vertical direction and a mirror loss with an absorption loss in a p-type semiconductor multilayer mirror in an effective cavity portion, where light seeps out, as a parameter using laser parameters extracted by an edge emitting type laser. More specifically, the graph shown in FIG. 29 is a result that is obtained when an absorption loss ($\alpha_p$) of a p-type semiconductor multilayer mirror portion is changed to 20 cm$^{-1}$, 40 cm$^{-1}$, 60 cm$^{-1}$, 80 cm$_{-1}$, and 100 cm$^{-1}$ using the following expression (21) and laser parameters shown in FIG. 30.

$$J_{th} = N_w \frac{J_{tr}}{\eta} \exp\left[\frac{\xi w N w \alpha_a + (1 - \xi w)\alpha_c + \alpha_m}{\xi w N w G_0}\right] \quad (21)$$

Here, $\alpha_m$ indicates a mirror loss, $N_w$ indicates the number of wells, $\epsilon$ indicates a light confinement coefficient, $\alpha_i$ indicates an absorption loss, $J_{tr}$ is a transparency current density, $\eta$ indicates a current injection ratio of spontaneous emission at a threshold value, and $G_0$ indicates a gain constant. Note that Γ is calculated as 2 percent taking a periodic gain into account. M indicates a ratio of spread of a current with respect to an aperture area of a current confinement layer. In addition, $\alpha_i$ is represented by the following expression.

$$\alpha_i = \frac{(L_{eff} - 0.45\mu m)10 \text{ cm}^{-1} + (0.45 \ \mu m)\alpha_p}{L_{eff}} \quad (22)$$

Here, $L_{eff}$ (μm) indicates an effective cavity length taking into account seeping-out of light to DBR. An average internal loss of an effective cavity portion other than a seeping-out portion to a p-DBR portion is calculated as 10 cm$^{-1}$, and a seeping-out length of DBR is calculated as 0.45 μm.

In addition, the mirror loss $\alpha_m$ can be represented by the following expression using a front facet reflectivity ($R_f$), a rear facet reflectivity ($R_r$), and a cavity length (L).

$$\alpha_m = \frac{1}{2L}\ln\left(\frac{1}{R_f R_r}\right) \quad (23)$$

External differential quantum efficiency ($\eta_d$), external differential quantum efficiency ($\eta_f$) on the front facet side, and slope efficiency ($S_f$) on the front facet side can be represented by the following expression.

$$\eta_d = \eta_i \frac{\alpha_m}{\alpha_i + \alpha_m} \quad (24)$$

where, $\eta_i$ indicates internal efficiency $$\eta_f = \eta_d\left(\frac{1}{1 + \sqrt{\frac{R_f}{R_r}\left(\frac{1 - R_r}{1 - R_f}\right)}}\right) \quad (25)$$

$$S_f = \eta_f \frac{1.24}{\lambda[\mu m]}[W/A] \quad (26)$$

Note that, as a cavity length of a surface emitting laser, an effective cavity length (L) taking into account seeping-out of light (0.45 μm on one side) to a semiconductor multilayer mirror is set in a design value for a cavity itself (2λ) (in this case, L=1.6 μm). FIG. 30 shows the parameters as a list.

In this trial manufacturing, since $\alpha_m$ is 5 cm$^{-1}$ and Jth as VCSEL is 3.6 kA/cm$^2$, an absorption loss ($\alpha_c$) of the p-type semiconductor multilayer mirror is estimated as about 80 cm$^{-1}$ from the graph shown in FIG. 29. In this case, $\alpha_i$ is 27 cm$^{-1}$. Note that, in a surface emitting laser in the 850-nanometer-band, an absorption loss is estimated as $\alpha_p$=20 cm$^{-1}$ by the same method. A surface emitting laser in the 1.3-μm-band has a larger absorption loss of the p-type semiconductor multilayer mirror than that of the surface emitting laser in the 850-nanometer-band. It is surmised that this is because intervalence band absorption or free carrier absorption are large in a long wavelength band in a p-type upper semiconductor multilayer mirror.

Figure 31:
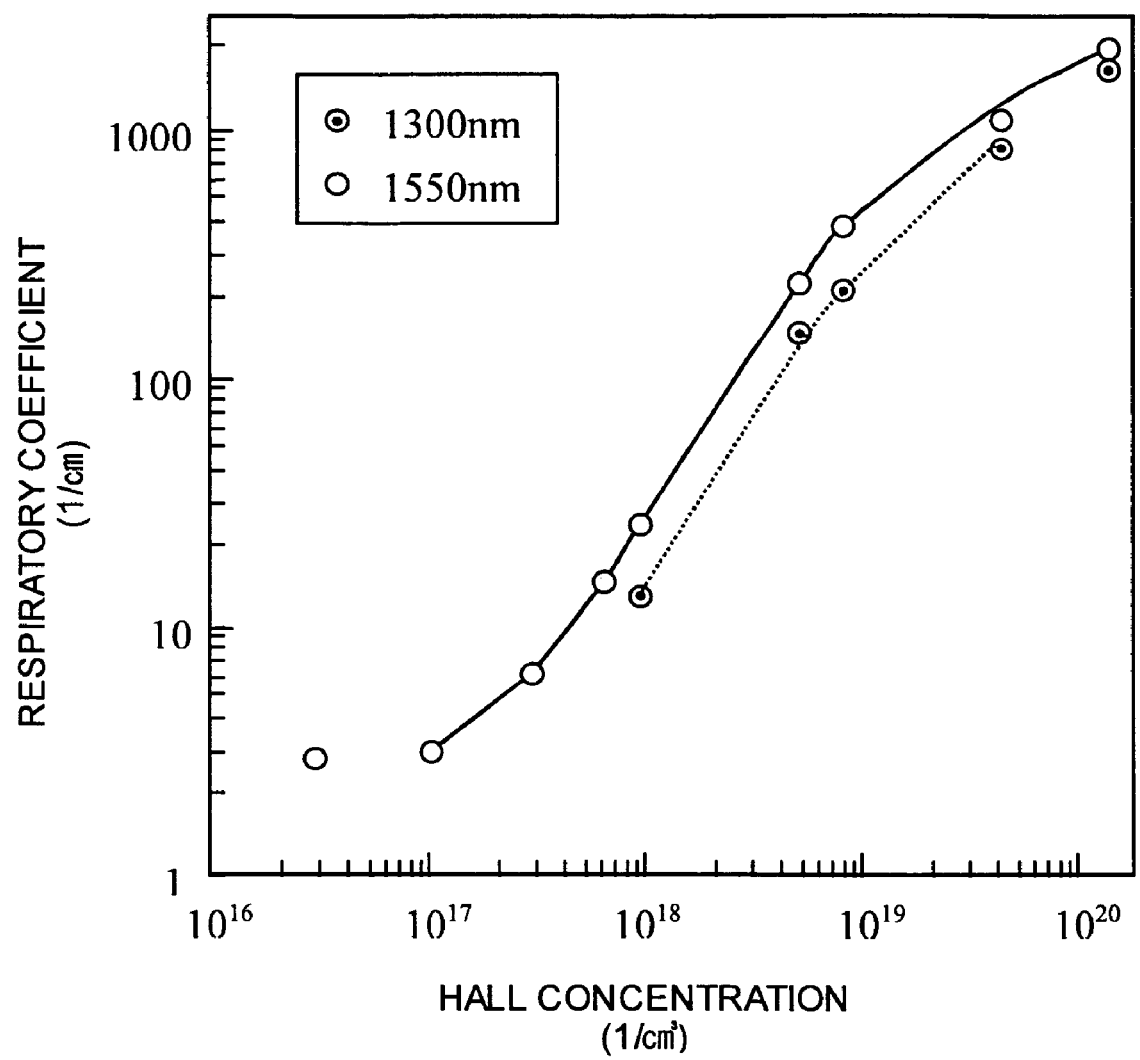
FIG. 31 is a publicly-known graph in which a relation between a doping concentration and an absorption coefficient for p-type GaAs is arranged with respect to incident rays of 1.3 micrometers and 1.55 micrometers.

FIG. 31 is a publicly-known graph in which a relation between a doping concentration and an absorption coefficient for p-type GaAs is arranged with respect to incident rays of 1.3 μm and 1.55 μm [D. I. Babic, UCSB technical report 95-20, p 96, August 1995]. From FIG. 31, since an absorption coefficient is 100 cm$^{-1}$ at an impurity concentration of 4×10$^{18}$ cm$^{-3}$, and a GaAs layer and AlGaAs other than an interface of this time is subjected to p-type doping at an impurity concentration of 4×10$^{18}$ cm$^{-3}$, this analysis is considered to be relatively correct.

Here, it is seen from FIG. 29 that $\alpha_p$ is required to be 30 cm$^{-1}$ or less to realize a sufficiently low oscillation threshold value by reducing $J_{th}$ in the vertical direction to about 1.5 kA/cm$^2$ or less. In FIG. 31, it is seen that it is necessary to set an upper limit of an impurity concentration to 2×10$^{18}$ cm$^{-3}$ for areas other than interface areas of high-refractive-index layers and low-refractive-index layers in pairs near an active layer of the p-type upper semiconductor multilayer mirror. In addition, if $\alpha_p$ is set to 30 cm$^{-1}$, it is possible to increase the slope efficiency $S_f$ to a high value of 0.1 W/A or more, and it is possible to obtain optical output power of 0.5 milliwatt or more at 5 milliamperes.

Conversely, in pairs near an active layer of the p-type upper semiconductor multilayer mirror, a lower limit of the impurity concentration for areas other than interface areas of high-refractive-index layers and low-refractive-index layers is calculated on trial as described below. In a surface emitting laser, a diameter of about 5 μm (an area of about 30 μm$^2$) is necessary as a current confinement area to realize oscillation of single lateral mode in a long wavelength band. In addition, a working voltage of a C-MOS driver, which drives the surface emitting laser, is 3.3 volts, and an upper limit of 2 volts is set for the surface emitting laser itself. A threshold voltage of the surface emitting laser in the 1.3-μm-band is 1.2 volts. It is necessary to set a bias current to ten times as large as $I_{th}$ (=0.5 microampere), that is, 5 microamperes to perform high-frequency direct modulation at 10 Gbps. Therefore, a differential resistance ($R_d$) of the surface emitting laser is required to satisfy the following inequality.

$$V_{th}[=1.2V]+I_{op}\times R_d \leq 2[V] \quad (27)$$

From inequality (27), $R_d \leq 160$ ohms. In addition, by a simulation of a circuit by the inventors, it was found that it is optimum to set the differential resistance to 50 ohms for an operation at 10 Gbps taking into account impedance matching of the circuit, and the operation at 10 Gbps is possible up to about 120 ohms. From these findings, it is preferable to set the differential resistance of the surface emitting laser to 120 ohms or less.

A structure of the surface emitting laser in the 1.3-μm-band according to the eleventh embodiment is substantially identical with that of an oxidation confinement type surface emitting optical laser element in the 850-nanometer-band, which uses an AlGaAs semiconductor multilayer mirror on a GaAs substrate, except a structure other than an active layer. Since a differential resistance of the oxidation confinement type surface emitting laser in the 850-nanometer-band having a current confinement area with a diameter of 5 μm (an area of 20 μm$^2$) is about 65 ohms, it is necessary to control a resistance increase to be about 60 ohms for the oxidation confinement type surface emitting laser in the 850-nanometer-band to reduce the differential resistance of the surface emitting laser in the 1.3-μm-band to 120 ohms or less.

FIG. 32 is a table showing an increase in resistance (ΔR) with respect to the oxidation confinement type surface emitting laser in the 850-nanometer-band at the time when an impurity concentration of areas other than interface areas of low-refractive-index layers and high-refractive-index layers is changed for five pairs from the GaAs cladding layer 3032 in the p-type upper semiconductor multilayer mirror.

From the table shown in FIG. 32, to control the increase in resistance to about 60 ohms or less in total, it is necessary to set an impurity concentration of p-type Al$_{0.9}$Ga$_{0.1}$As forming the low-refractive-index layer 3051 to 7.5×10$^{17}$ cm$^{-3}$ (=40 ohms increase) or more and set an impurity concentration of p-type GaAs forming the high-refractive-index layer 3052 to 2×10$^{17}$ cm$^{-3}$ (=19 ohms increase) or more, or set an impurity concentration of p-type Al$_{0.9}$Ga$_{0.1}$As forming the low-refractive-index layer 3051 to 5×10$^{17}$ cm$^{-3}$ (=53 ohms increase) or more and set an impurity concentration of p-type GaAs forming the high-refractive-index layer 3052 to 5×10$^{17}$ cm$^{-3}$ (=6.4 ohms increase) or more.

Note that, as an example of other combinations, it is also possible that an impurity concentration of p-type Al$_{0.9}$Ga$_{0.1}$As forming the low-refractive-index layer 3051 is set to 1×10$^{18}$ cm$^{-3}$ (=27 ohms increase) or more and an impurity concentration of p-type GaAs forming the high-refractive-index layer 3052 is set to 1×10$^{18}$ cm$^{-3}$ (=2.5 ohms increase) or more. In addition, it is also possible that an impurity concentration of p-type Al$_{0.9}$Ga$_{0.1}$As forming the low-refractive-index layer 3051 is set to 2×10$^{18}$ cm$^{-3}$ (=14 ohms increase) or more and an impurity concentration of p-type GaAs forming the high-refractive-index layer 3052 is set to 5×10$^{17}$ cm$^{-3}$ (=6.4 ohms increase) or more.

Summarizing the upper limits and the lower limits explained above, in the pairs near the active layer of the p-type upper semiconductor multilayer mirror, an impurity concentration in the areas other than the interface areas of the high-refractive-index layers and the low-refractive-index layers is required to satisfy the following conditions:

low-refractive-index layer: 2×10$^{18}$ cm$^{-3}$ ≧ impurity concentration ≧ 7.5×10$^{17}$ cm$^{-3}$
high-refractive-index layer: 2×10$^{18}$ cm$^{-3}$ ≧ impurity concentration ≧ 2×10$^{17}$ cm$^{-3}$ or
low-refractive-index layer: 2×10$^{18}$ cm$^{-3}$ ≧ impurity concentration ≧ 5×10$^{17}$ cm$^{-3}$
high-refractive-index layer: 2×10$^{18}$ cm$^{-3}$ ≧ impurity concentration ≧ 5×10$^{17}$ cm$^{-3}$.

Note that an example adopting the former impurity concentration is described in the explanation of the structure shown in FIG. 27.

By adopting the structure according to such design parameters, CW oscillation at a threshold value of 0.5 milliampere, slope efficiency of 0.25 W/A, and 100° C. or more was obtained in the surface emitting laser according to the eleventh embodiment. Note that a differential resistance was 120 ohms, a working voltage at 5 milliamperes was 1.8 volts, and an eye pattern after transmission of 15 kilometers at 10 Gbps was also obtained as a satisfactory observation result.

As explained above, according to the surface emitting laser according to the eleventh embodiment, in low-refractive-index layers and high-refractive-index layers of a p-type semiconductor multilayer mirror belonging to a range of the predetermined number of pairs from an active layer, predetermined areas from interfaces of the low-refractive-index layers and the high-refractive-index layers are subjected to p-type doping at a high impurity concentration, and the remaining areas of the low-refractive-index layer and the high-refractive-index layer is subjected to p-type doping at a low impurity concentration equal to or lower than a predetermined value to reduce a mirror loss. This makes it possible to perform stable oscillation in a long wavelength band such as the 1.3-μm-band that realizes a low oscillation threshold value, a low resistance, a low working voltage, high slope efficiency, and high-frequency direct modulation.

Note that, in the eleventh embodiment explained above, it is explained that the high-refractive-index layer forming the p-type upper semiconductor multilayer mirror 3016 and the n-type lower semiconductor multilayer mirror 3013 is formed of GaAs. However, the high-refractive-index layer may be formed of $Al_xGa_{1-x}As$ ($0<x≦0.2$). In addition, it is explained that the low-refractive-index layer is formed of $Al_{0.9}Ga_{0.1}As$. However, the low-refractive-index layer may be formed of $Al_xGa_{1-x}As$ ($0.5≦x≦0.97$). An inclined composition layer for easing a refractive index difference between the low-refractive-index layer and the high-refractive-index layer may be arranged near a boundary surface of both the layers.

In the eleventh embodiment, it is explained that, in the low-refractive-index layers 3051 and the high-refractive-index layers 3052 for five pairs from the GaAs cladding layer 3032 of the p-type upper semiconductor multilayer mirror 3016, areas of 10 nanometer thickness from the interfaces of the low-refractive-index layers 3051 and the high-refractive-index layers 3052 are subjected to p-type doping at an impurity concentration of 1 to $2×10^{19}$ $cm^{-3}$. However, the areas may be areas of 1 nanometer to 40 nanometers thickness, and an impurity concentration thereof may be set to $2×10^{19}$ $cm^{-3}$ to $1×10^{20}$ $cm^{-3}$.

In the explanation of eleventh embodiment, an impurity concentration of the low-refractive-index layers 3051 and the high-refractive-index layers 3052 for five pairs form the GaAs cladding layer 3032 of the p-type upper semiconductor multilayer mirror 3016 is limited. However, an impurity concentration of the low-refractive-index layers 3051 and the high-refractive-index layers 3052 for one to ten pairs may be limited. In addition, the p-type AlAs layer 50 forming the oxidation confinement area may be formed of $Al_xGa_{1-x}As$ ($0.97≦x<0.1$).

In the eleventh embodiment, the surface emitting laser using the GaInNAsSb QW on the GaAs substrate in the 1300-nanometer-band is described. However, to create a 1300 nm bad surface emitting laser on the GaAs substrate, various semiconductor materials like a GaInNAs QW, a GaAsSb QW, and a (Ga)InAs quantum dot can be used. Further, the eleventh embodiment is not limited to the surface emitting laser in the 1300-nanometer-band and can be applied to a GaAs surface emitting laser in a long wavelength band with a wavelength of 850 nanometers or more, that is, a 980-nanometer-band, a 1200-nanometer-band, a 1480-nanometer-band, and a 1550-nanometer-band, a 1650-nanometer-band.

In the eleventh embodiment, the surface emitting laser using the AlGaAs semiconductor multilayer mirror on the GaAs substrate is described as an example. However, the invention can be applied to a long wavelength band surface emitting laser (1200-nanometer-band to 1650-nanometer-band) using an AlGaAsSb semiconductor multilayer mirror on an InP substrate. In this case, various semiconductor materials like AlGaInAs, GaInAsP, and GaInNAs(Sb) can be adopted for the active layer. In addition, a GaAs substrate, an in P substrate, a GaInAs ternary substrate can be used as the substrate.

Note that, in the eleventh embodiment, a semiconductor multilayer mirror can also be manufactured by the MOCVD method.

Figure 33:
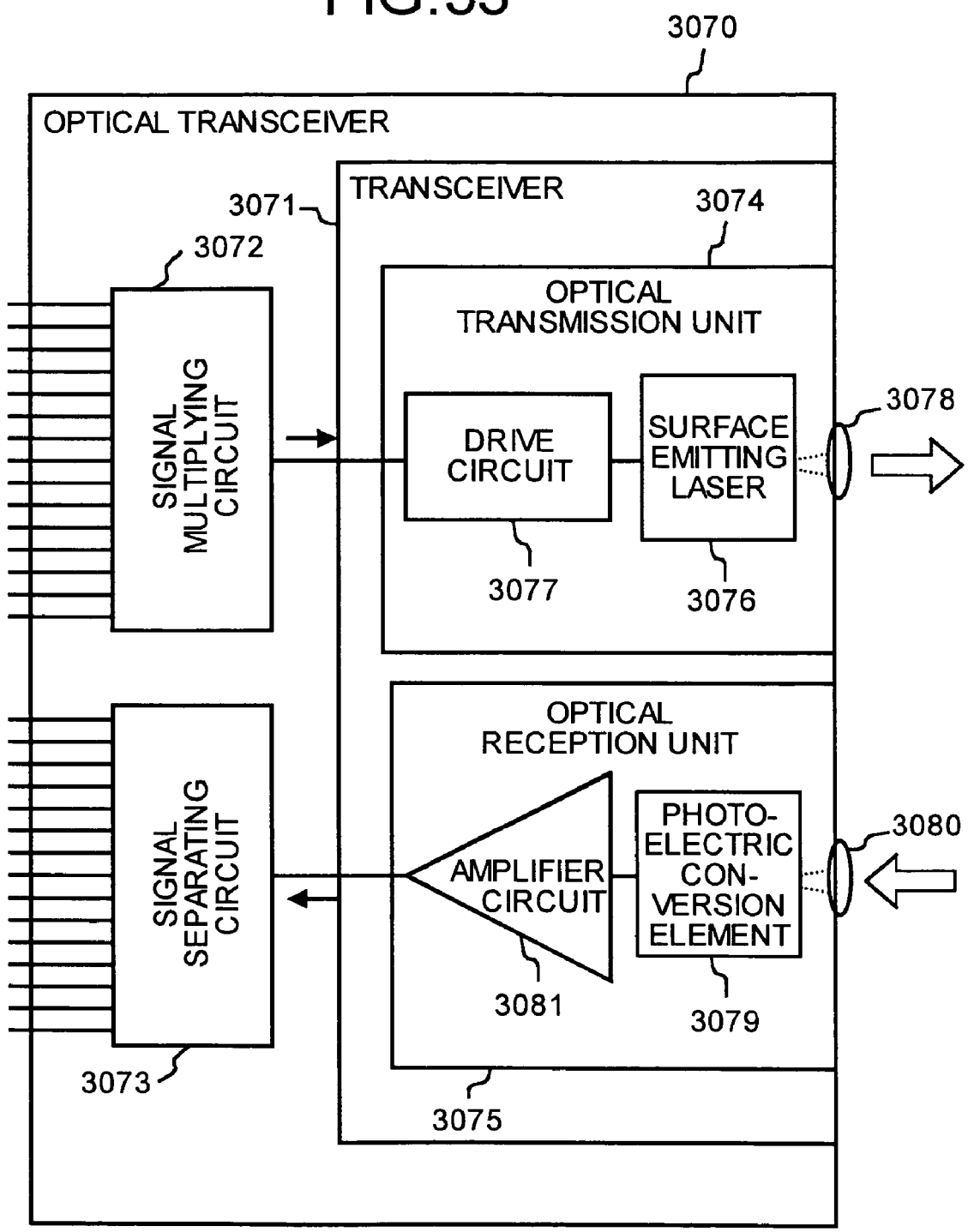
FIG. 33 is a block diagram of a schematic structure of an optical transceiver according to a twelfth embodiment of the invention.

Next, an optical transceiver according to a twelfth embodiment of the invention will be explained. FIG. 33 is a block diagram of a schematic structure of the optical transceiver according to the twelfth embodiment. In FIG. 33, an optical transceiver 3070 according to the twelfth embodiment includes a transceiver 3071 that has an optical transmitting unit 3074 and an optical receiving unit 3075 for transmitting and receiving an optical signal, a signal multiplexing circuit 3072 that inputs an electric signal to the transceiver 3071, and a signal separating circuit 3073 that separates an electric signal obtained from an optical signal received by the transceiver 3071.

The optical transmitting unit 3074 is a unit for converting an electric signal inputted from the signal multiplexing circuit 3072 into an optical signal and transmitting the optical signal. More specifically, the optical transmitting unit 3074 includes a surface emitting laser 3076 that emits an optical signal, a derive circuit 3077 that controls the surface emitting laser 3076 based on the inputted electric signal, and an output optical system 3078 for outputting the optical signal emitted from the surface emitting laser 3076 to the outside.

As the surface emitting laser 3076 included in the optical transmitting unit 3074, the surface emitting laser according to the eleventh embodiment is used. Therefore, the surface emitting laser 3076 has a low threshold current and high reliability and can perform single lateral mode oscillation.

The optical receiving unit 3075 is a unit for converting an optical signal received from the outside into an electric signal and outputting the electric signal to the signal separating circuit 3073. More specifically, the optical receiving unit 3075 includes a photoelectric conversion element 3079 for receiving an optical signal and converting the optical signal into an electric signal, an input optical system 3080 for guiding the optical signal to the photoelectric conversion element 3079, and an amplifier circuit 3081 that amplifies the electric signal outputted from the photoelectric conversion element 3079. The photoelectric conversion element 3079 outputs an electric signal based on intensity of the received optical signal. As the photoelectric conversion element 3079, it is possible to use a photoresistor and the like other than a photodiode.

The signal multiplexing circuit 3072 is a circuit for multiplexing plural electric signals inputted from the outside into one electric signal. The one electric signal obtained by multiplexing the electric signals is outputted to the optical transmitting unit 3074 constituting the transceiver 3071.

The signal separating circuit 3073 is a circuit for separating an electric signal obtained from the optical receiving unit 3075 constituting the transceiver 3071 into plural electric signals. This is because, since an optical signal received by the optical receiving unit 3075 originally includes plural signals, to extract information, it is necessary to separate an electric signal, which is obtained by subjecting the optical signal to photoelectric conversion, into plural electric signals.

Operations of the optical transceiver according to the twelfth embodiment will be explained. The optical transceiver according to the twelfth embodiment is an optical transceiver for transmitting and receiving plural electric signals. A transmission operation will be explained in the first place.

First, plural electric signals inputted from the outside is converted into a single electric signal by the signal multiplexing circuit 3072. Then, this single electric signal is inputted to the drive circuit 3077 from the signal multiplexing circuit 3072, and the control circuit 3077 controls a current to be injected into the surface emitting laser 3076 based on this electric signal. More specifically, an optical signal having a waveform corresponding to an electric signal waveform is emitted from the surface emitting laser 3076 by the drive circuit 3077. Note that, since the surface emitting leaser element 3076 consists of the surface emitting laser according to the eleventh embodiment, direct optical modulation is possible at 10 Gbit/s at the maximum. Therefore, it is possible to add a large amount of information to an optical signal to transmit the optical signal. The optical signal outputted from the surface emitting laser 3076 is outputted to the outside via the output optical system 3078. Here, the transmission operation ends.

Next, a reception operation will be explained. An optical signal transmitted from the outside is made incident in the optical transceiver via the input optical system 3080 and received by the photoelectric conversion element 3079. The photoelectric conversion element 3079 has a function of outputting an electric signal having a waveform corresponding to a change in intensity of the received optical signal. The converted electric signal is inputted to the amplifier circuit 3081. Since intensity of the optical signal inputted from the outside is generally feeble, intensity of the electric signal outputted from the photoelectric conversion element 3079 is also feeble and is amplified by the amplifier circuit 3081. Thereafter, the amplified electric signal is inputted to the signal separating circuit 3073 and separated into plural electric signals. Here, the reception operation ends.

As described above, according to the optical transceiver according to the twelfth embodiment, since the optical transceiver is constituted using the surface emitting laser according to the eleventh embodiment, effects of a low oscillation threshold value, high slope efficiency, and high-frequency direct modulation can be realized for the surface emitting laser 3076. It is possible to output an optical signal having a large amount of information with high reliability. Moreover, when an outputted optical signal is transmitted by an optical fiber, a transmittable distance is increased to 15 kilometers or more, which makes it possible to perform long distance transmission.

Figure 34:
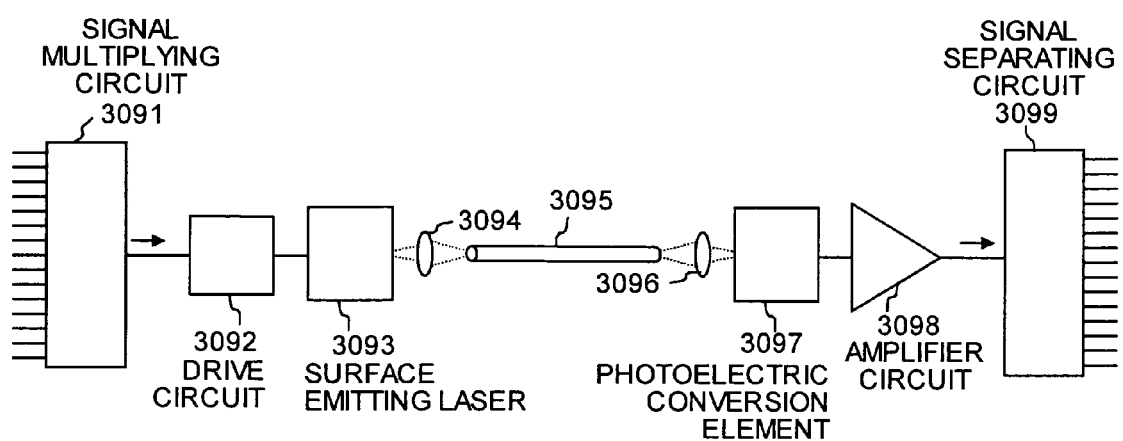
FIG. 34 is a schematic diagram of a schematic structure of an optical communication system according to a thirteenth embodiment.
Figure 35:
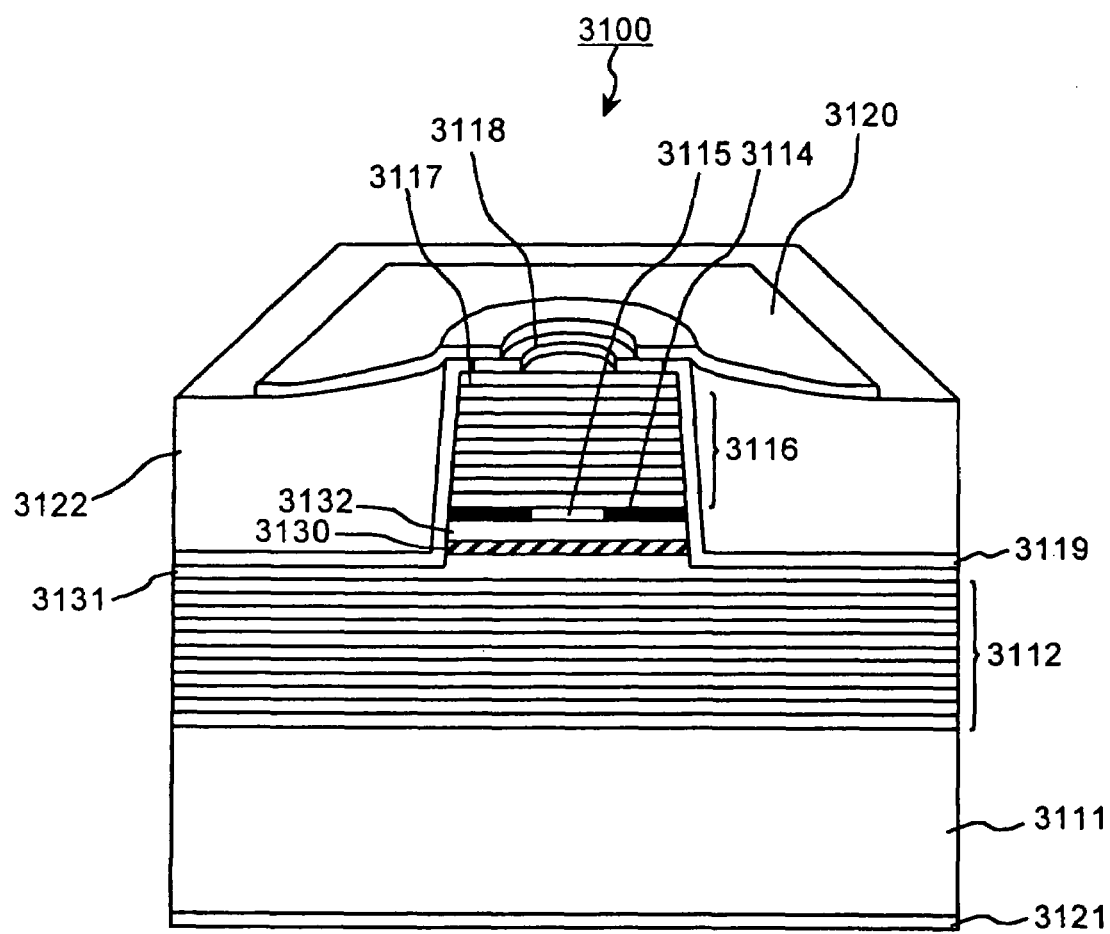
FIG. 35 is a perspective sectional view of a conventional surface emitting laser.
Figure 36:
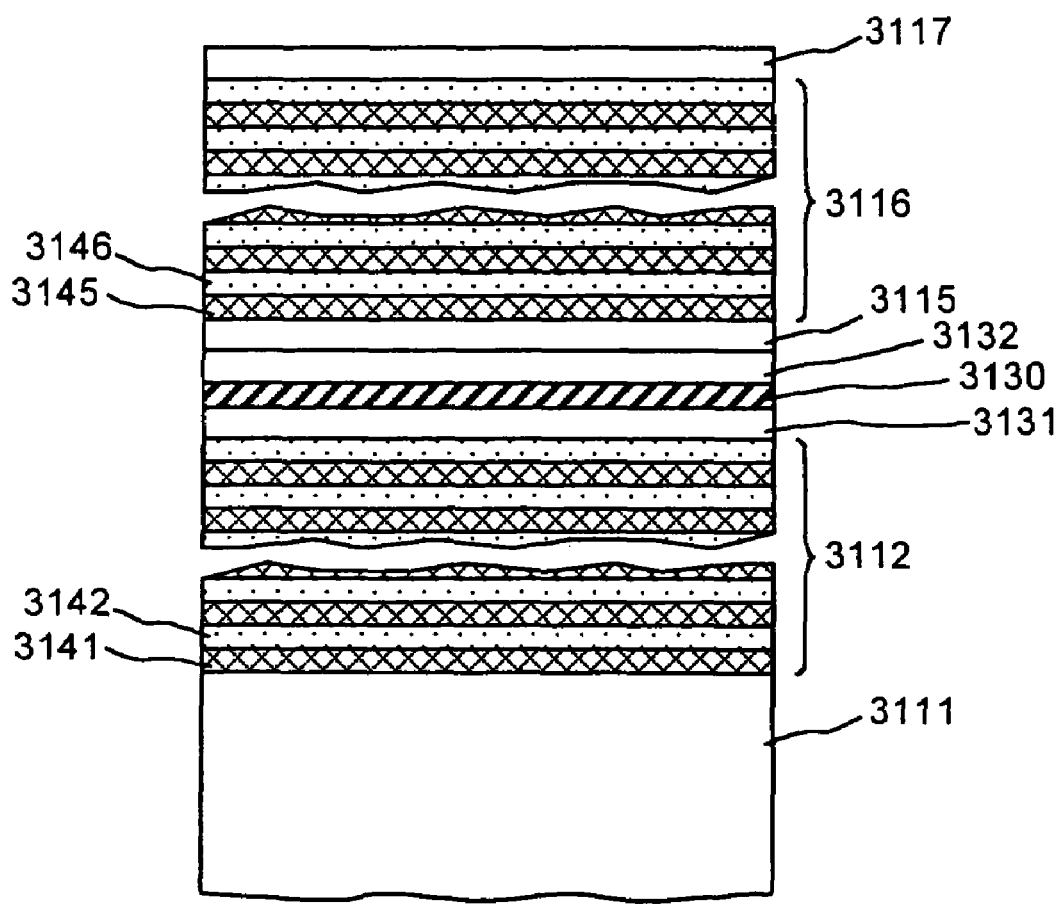
FIG. 36 is an explanatory diagram for explaining structures of a lower semiconductor multilayer mirror and an upper semiconductor multilayer mirror in the conventional surfaced emitting laser element.

Next, an optical communication system according to a thirteenth embodiment of the invention will be explained. FIG. 34 is a schematic diagram of a schematic structure of the optical communication system according to the thirteenth embodiment. The optical communication system according to the thirteenth embodiment uses the surface emitting laser according to the eleventh embodiment as a signal light source. More specifically, the optical communication system according to the thirteenth embodiment includes a signal multiplexing circuit 3091, a drive circuit 3092 connected to the signal multiplexing circuit 3091, a surface emitting laser 3093 connected to the drive circuit 3092, an optical fiber for transmission 3095, and an optical system 3094 for optically combining the surface emitting laser 3093 and an end of the optical fiber for transmission 3095. In addition, the optical communication system further includes an photoelectric conversion element 3097 optically combined with the other end of the optical fiber for transmission 3095 via the optical system 3096, an amplifier circuit 3098 connected to the photoelectric conversion element 3097, and a signal separating circuit 3099 connected to the amplifier circuit 3098.

The single electric signal obtained by the signal multiplexing circuit 3091 is inputted to the drive circuit 3092. The drive circuit 3092 injects a current into the surface emitting laser 3093 and drives the surface emitting laser 3093 based on this electric signal. Consequently, an optical signal outputted from the surface emitting laser 3093 has a waveform corresponding to an electric signal obtained by the signal multiplexing circuit 3091. The optical signal outputted from the surface emitting laser 3093 is made incident in an end of the optical fiber for transmission 3095 via the optical system 3094 and transmitted through the optical fiber for transmission 3095.

Then, the optical signal transmitted through the optical fiber for transmission 3095 is emitted from the other end of the optical fiber for transmission 3095 and is made incident in the photoelectric conversion element 3097 via the optical system 3096. The photoelectric conversion element 3097 outputs an electric signal based on the received optical signal. The electric signal is amplified by the amplifier circuit 3098 and then inputted to the signal separating circuit 3099.

The signal separating circuit 3099 separates the inputted electric signal into individual electric signals before being multiplexed by the signal multiplexing circuit 3091 and restores information. In this way, the optical communication system according to the thirteenth embodiment transmits the information.

As described above, according to the optical communication system according to the thirteenth embodiment, since the surface emitting laser according to the eleventh embodiment is used, effects of a low oscillation threshold value, high slope efficiency, and high-frequency direct modulation can be realized. An optical signal can be transmitted surely with high reliability. More specifically, it is possible to transmit an optical signal directly modulated at 10 Gbit/s even if a fiber length of the optical fiber for transmission 3095 is extended to 15 kilometers or more.

Since the surface emitting laser according to the eleventh embodiment can change an emission wavelength in a range of 980 nanometers to 1650 nanometers, it is possible to select a wavelength at which a loss is low in the optical fiber for transmission 3095. In addition, the surface emitting laser also has an advantage that an existing optical communication system can be used in these wavelength bands. For example, it is also possible that the emission wavelength is set to 980 nanometers and an erbium doped fiber amplifier (EDFA) is arranged in the optical fiber for transmission 3095. In this case, since intensity of an optical signal can be amplified by the EDFA, a transmission distance can be further extended. Similarly, a thulium doped fiber amplifier (TDFA), a Raman amplifier, or the like may be used.

As described above, according to the surface emitting laser according to the invention, since the AlAs layer is included in any one of the lower semiconductor multilayer mirror and the upper semiconductor multilayer mirror or both, characteristics of a low refractive index and high thermal conductivity inherent in the AlAs layer can be adopted in the semiconductor multilayer mirrors. As a result, there is an effect that a reflectivity and temperature characteristics are improved and stable high power laser oscillation is made possible.

According to the surface emitting laser according to the invention, since the inclined composition layer is arranged between the $Al_yGa_{1-y}As$ (x<y<1) layer of the low-refractive-index area and the $Al_xGa_{1-x}As$ (0≦x<1) layer of the high-refractive-index area, there is an effect that an electric resistance of the semiconductor multilayer mirror can be further reduced and higher power laser oscillation is made possible.

According to the invention, since the structure of the selectively oxidized area is optimized, there is an effect that a surface emitting laser, which controls a threshold current to be low, has high reliability, and is capable of performing single lateral mode oscillation, performing direct modulation at 10 Gbit/s, and performing long distance transmission, can be provided.

According to the invention, since the surface emitting laser, in which the structure of the selectively oxidized area is optimized, is used, there is an effect that a transceiver, an optical transceiver, and an optical communication system, which are capable of performing single lateral mode oscillation and performing long distance transmission, can be provided.

According to the invention, since a reflectivity of the emission side reflective surface is set to 99.4 percent or more and 99.8 percent or less and a reflectivity of the reflection side reflective surface is set to 99.9 percent, there is an effect that a threshold current value can be controlled to be 1 milliampere or less and slope efficiency can be increased to 0.2 mW/mA or more. Therefore, there is an effect that, when a current of a value five or more times as large as the threshold current value, for example, 6 milliamperes is injected, intensity of an emitted laser beam is 1 milliwatt or more and the surface emitting laser can be used as a signal light source and the like.

According to the invention, since the above-mentioned surface emitting laser is used, a light source operating at a low threshold value and having high optical output power can be used, and a transceiver, an optical transceiver, and an optical communication system, which are capable of transmitting an optical signal a long distance, can be realized.

According to the surface emitting laser according to the invention, in the low-refractive-index layers and the high-refractive-index layer of the p-type semiconductor multilayer mirror belonging to a range of a predetermined number of pairs from the active layer, predetermined areas from interfaces of the low-refractive-index layers and the high-refractive-index layers are subjected to doping at a high impurity concentration, and the remaining areas of the low-refractive-index layers and the high-refractive-index layers are subjected to doping at a low impurity concentration equal to or lower than a predetermined value to reduce a mirror loss. Thus, there is an effect that stable oscillation in a long wavelength band such as the 1.3-μm-band, which realizes a low oscillation threshold value, a low resistance, a low working voltage, high slope efficiency, and high-frequency direct modulation, is made possible.

According to the transceiver, the optical transceiver, and the optical communication system according to the invention, since the above-mentioned surface emitting laser is mounted, there is an effect that the effects realized by the surface emitting laser can be enjoyed and stable long distance transmission is made possible.

INDUSTRIAL APPLICABILITY

As described above, the invention is suitable for the surface emitting laser that is capable of performing single lateral mode oscillation even in a long wavelength, makes long distance transmission possible, and realizes a low oscillation threshold value, high slope efficiency, and high-frequency direct modulation, and the transceiver, the optical transceiver, and the optical communication system using the surface emitting laser.

The invention claimed is:

1. A surface emitting laser, comprising:
   a lower reflective layer, a lower cladding layer, an active layer, an upper cladding layer, and an upper reflective layer sequentially stacked on a GaAs substrate;
   a plurality of mirror layers being stacked and for forming the upper reflective layer and the lower reflective layer, each mirror layer in the plurality of the mirror layers including a pair of a low-refractive-index layer having an optical length that is a quarter of an emission wavelength, and a high-refractive-index layer having an optical length that is a quarter of an emission wavelength, the low-refractive-index layer including $Al_xGa_{1-x}As$, where $0.5 \leq x \leq 1$, and the high-refractive-index layer including $Al_xGa_{1-x}As$, wherein $0 \leq x \leq 0.2$,
   a selectively oxidized area being formed of selectively oxidizing $Al_xGa_{1-x}As$, where $0.97 \leq x \leq 1$ and arranged inside of either of the lower reflective layer and the upper reflective layer, the selectively oxidized area further being arranged in an area that is distant from a center of the active layer in a stacking direction by equal to or more than 370 nanometers and equal to or less than 780 nanometers and that is in a vicinity of a position where electric field intensity in the lower reflective layer in either one of the plurality of mirror layers is minimized; and
   a current injection area that is sandwiched by the selectively oxidized area, wherein
   the active layer emits a laser beam having a wavelength of equal to or more than 1260 nanometers and equal to or less than 1360 nanometers in a single lateral mode oscillation, in a direction perpendicular to the GaAs substrate, and
   a difference between a first effective refractive index of a first area in the stacking direction including the current injection area and a second effective refractive index of a second area in the stacking direction including the selectively oxidized area is equal to or less than 0.038.

2. The surface emitting laser according to claim 1, wherein the selectively oxidized area is arranged near a position where an electric-field intensity distribution is minimized in the low-refractive-index layer in any one of the mirror layers.

3. The surface emitting laser according to claim 1, wherein an optical cavity that is formed of the lower cladding layer, the active layer, and the upper cladding layer has an optical length of two times of a wavelength of the laser beam, and
   the selectively oxidized area is arranged in a mirror layer that is stacked at a first period from the active layer in either of the upper reflective layer and the lower reflective layer.

4. The surface emitting laser according to claim 3, wherein a thickness of the selectively oxidized area before oxidation is equal to or more than 6 nanometers and equal to or less than 32 nanometers.

5. The surface emitting laser according to claim 3, wherein a thickness of the selectively oxidized area before oxidation is equal to or more than 10 nanometers and equal to or less than 13 nanometers.

6. The surface emitting laser according to claim 1, wherein
an optical cavity that is formed of the lower cladding layer, the active layer, and the upper cladding layer has an optical length of a wavelength of the laser beam, and
the selectively oxidized area is arranged in a mirror layer that is stacked at a second period from the active layer in either of the upper reflective layer and the lower reflective layer.

7. The surface emitting laser according to claim 6, wherein a thickness of the selectively oxidized area before oxidation is equal to or more than 6 nanometers and equal to or less than 32 nanometers.

8. The surface emitting laser according to claim 6, wherein a thickness of the selectively oxidized area before oxidation is equal to or more than 10 nanometers and equal to or less than 13 nanometers.

9. The surface emitting laser according to claim 1, wherein
an optical cavity that is formed of the lower cladding layer, the active layer, and the upper cladding layer has an optical length of two times of a wavelength of the laser beam, and
the selectively oxidized area is arranged in a mirror layer that is stacked at a second period from the active layer in either of the upper reflective layer and the lower reflective layer.

10. The surface emitting laser according to claim 9, wherein a thickness of the selectively oxidized area before oxidation is equal to or more than 6 nanometers and equal to or less than 46 nanometers.

11. The surface emitting laser according to claim 9, wherein a thickness of the selectively oxidized area before oxidation is equal to or more than 10 nanometers and equal to or less than 20 nanometers.

12. The surface emitting laser according to claim 1, wherein
an optical cavity that is formed of the lower cladding layer, the active layer, and the upper cladding layer has an optical length of a wavelength of the laser beam, and
the selectively oxidized area is arranged in a mirror layer that is stacked at a third period from the active layer in either of the upper reflective layer and the lower reflective layer.

13. The surface emitting laser according to claim 12, wherein a thickness of the selectively oxidized area before oxidation is equal to or more than 6 nanometers and equal to or less than 46 nanometers.

14. The surface emitting laser according to claim 12, wherein a thickness of the selectively oxidized area before oxidation is equal to or more than 10 nanometers and equal to or less than 20 nanometers.

* * * * *